(12) United States Patent
Nakata

(10) Patent No.: US 11,742,835 B2
(45) Date of Patent: Aug. 29, 2023

(54) SEMICONDUCTOR INTEGRATED CIRCUIT AND SEMICONDUCTOR STORAGE DEVICE

(71) Applicant: Kioxia Corporation, Tokyo (JP)

(72) Inventor: Masashi Nakata, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/693,864

(22) Filed: Mar. 14, 2022

(65) Prior Publication Data

US 2023/0079802 A1 Mar. 16, 2023

(30) Foreign Application Priority Data

Sep. 10, 2021 (JP) .................................. 2021-147559

(51) Int. Cl.
| | |
|---|---|
| *H03K 3/017* | (2006.01) |
| *H03K 3/86* | (2006.01) |
| *G11C 8/18* | (2006.01) |
| *G11C 7/22* | (2006.01) |
| *H03K 3/0233* | (2006.01) |

(52) U.S. Cl.
CPC ............. *H03K 3/017* (2013.01); *G11C 7/222* (2013.01); *G11C 8/18* (2013.01); *H03K 3/0233* (2013.01); *H03K 3/86* (2013.01)

(58) Field of Classification Search
CPC ........ H03K 3/017; H03K 3/0233; H03K 3/86; G11C 7/222; G11C 8/18
USPC ......................................................... 327/175
See application file for complete search history.

(56) References Cited

U.S. PATENT DOCUMENTS

| 5,699,003 A * | 12/1997 | Saeki ..................... H03K 5/133 |
| | | 327/261 |
| 7,423,465 B2 * | 9/2008 | Gomm .................. H03L 7/0816 |
| | | 327/175 |
| 8,207,772 B2 | 6/2012 | Shin |
| 8,421,512 B2 | 4/2013 | Murata et al. |
| 10,236,767 B2 | 3/2019 | Park et al. |
| 10,305,457 B2 | 5/2019 | Kwon et al. |
| 10,530,350 B2 * | 1/2020 | Hirashima ............... H03K 5/06 |
| 11,218,141 B2 * | 1/2022 | Hirashima ............... H03K 5/06 |
| 11,380,409 B2 * | 7/2022 | Nakata .................. H03K 3/017 |

(Continued)

FOREIGN PATENT DOCUMENTS

| JP | H10-293147 A | 11/1998 |
| JP | 5241776 B2 | 7/2013 |

(Continued)

*Primary Examiner* — Ryan Jager
(74) *Attorney, Agent, or Firm* — Foley & Lardner LLP

(57) ABSTRACT

A semiconductor integrated circuit of an embodiment includes: a delay element array circuit in which a plurality of delay elements having a delay amount Tw are connected in series; a flip-flop group including a plurality of flip-flops each of which an input is connected to an output of a corresponding delay element; a delay element group configured to generate, from an input clock signal, a plurality of output clock signals each having a delay difference of a second delay amount smaller than the delay amount Tw; and a delay unit configured to set a third delay amount smaller than the second delay amount, and the delay element group and the delay unit are connected in series between an output terminal of an input signal CLK_DET and an input terminal of the flip-flop group.

20 Claims, 33 Drawing Sheets

(56) References Cited

U.S. PATENT DOCUMENTS

| | | | |
|---|---|---|---|
| 11,611,334 B2* | 3/2023 | Liu | G06F 1/08 |
| 2002/0036524 A1* | 3/2002 | Isobe | H03K 5/133 |
| | | | 327/141 |
| 2002/0196062 A1* | 12/2002 | Iwashita | H03L 7/0814 |
| | | | 327/158 |
| 2014/0010029 A1* | 1/2014 | Jung | G11C 7/222 |
| | | | 365/194 |
| 2019/0081631 A1* | 3/2019 | Nakata | G11C 7/222 |
| 2020/0304116 A1* | 9/2020 | Muraguchi | H03K 5/05 |
| 2022/0068405 A1* | 3/2022 | Nakata | H03K 3/017 |
| 2023/0079802 A1* | 3/2023 | Nakata | G11C 8/18 |

FOREIGN PATENT DOCUMENTS

| | | |
|---|---|---|
| JP | 2015-167190 A | 9/2015 |
| JP | 2019-169826 A | 10/2019 |
| JP | 6677617 B2 | 4/2020 |
| JP | 2022-038403 A | 3/2022 |

\* cited by examiner

FIG. 16

| DN_F | INSTRUCTION CONTENT |
|---|---|
| 0000 | DELAY OF MINIMUM DELAY TIME PERIOD (= 0 Tw) |
| 0001 | DELAY OF 1/8 UNIT TIME (= 0.125 Tw) |
| 0010 | DELAY OF 2/8 UNIT TIME (= 0.250 Tw) |
| 0011 | DELAY OF 3/8 UNIT TIME (= 0.375 Tw) |
| 0100 | DELAY OF 4/8 UNIT TIME (= 0.500 Tw) |
| 0101 | DELAY OF 5/8 UNIT TIME (= 0.625 Tw) |
| 0110 | DELAY OF 6/8 UNIT TIME (= 0.750 Tw) |
| 0111 | DELAY OF 7/8 UNIT TIME (= 0.875 Tw) |
| 1000 | DELAY OF 8/8 UNIT TIME (= 1.000 Tw) |

FIG. 17

| DN_C | INSTRUCTION CONTENT |
|---|---|
| 000 | DELAY OF 0 UNIT TIME (= 0 Tw) |
| 001 | DELAY OF 1 UNIT TIME (= 1 Tw) |
| 010 | DELAY OF 2 UNIT TIME (= 2 Tw) |
| 011 | DELAY OF 3 UNIT TIME (= 3 Tw) |
| 100 | DELAY OF 4 UNIT TIME (= 4 Tw) |
| 101 | DELAY OF 5 UNIT TIME (= 5 Tw) |
| 110 | DELAY OF 6 UNIT TIME (= 6 Tw) |
| 111 | DELAY OF 7 UNIT TIME (= 7 Tw) |

FIG. 18

| DN_F | DN_FD (DN_C:EVEN NUMBER) | DN_FD (DN_C:ODD NUMBER) | INSTRUCTION CONTENT |
|---|---|---|---|
| 0000 | 00000000 | 11111111 | DELAY OF 0 UNIT TIME (= 0 Tw) |
| 0001 | 00000001 | 01111111 | DELAY OF 1/8 UNIT TIME (= 0.125 Tw) |
| 0010 | 00000011 | 00111111 | DELAY OF 2/8 UNIT TIME (= 0.250 Tw) |
| 0011 | 00000111 | 00011111 | DELAY OF 3/8 UNIT TIME (= 0.375 Tw) |
| 0100 | 00001111 | 00001111 | DELAY OF 4/8 UNIT TIME (= 0.500 Tw) |
| 0101 | 00011111 | 00000111 | DELAY OF 5/8 UNIT TIME (= 0.625 Tw) |
| 0110 | 00111111 | 00000011 | DELAY OF 6/8 UNIT TIME (= 0.750 Tw) |
| 0111 | 01111111 | 00000001 | DELAY OF 7/8 UNIT TIME (= 0.875 Tw) |
| 1000 | 11111111 | 00000000 | DELAY OF 8/8 UNIT TIME (= 1.000 Tw) |

FIG. 19

| DN_C | DN_CD | INSTRUCTION CONTENT |
|---|---|---|
| 000 | 0000000 | DELAY OF 0 UNIT TIME (= 0 Tw) |
| 001 | 0000001 | DELAY OF 1 UNIT TIME (= 1 Tw) |
| 010 | 0000011 | DELAY OF 2 UNIT TIME (= 2 Tw) |
| 011 | 0000111 | DELAY OF 3 UNIT TIME (= 3 Tw) |
| 100 | 0001111 | DELAY OF 4 UNIT TIME (= 4 Tw) |
| 101 | 0011111 | DELAY OF 5 UNIT TIME (= 5 Tw) |
| 110 | 0111111 | DELAY OF 6 UNIT TIME (= 6 Tw) |
| 111 | 1111111 | DELAY OF 7 UNIT TIME (= 7 Tw) |

FIG. 21

| DN_FD | DN_FDB | IN→FOUTB_EVN FALLING DELAY TIME PERIOD | IN→FOUTB_ODD FALLING DELAY TIME PERIOD |
|---|---|---|---|
| 00000000 | 11111111 | Tf | Tf+1.000Tw |
| 00000001 | 11111110 | Tf+0.125Tw | Tf+0.875Tw |
| 00000011 | 11111100 | Tf+0.250Tw | Tf+0.750Tw |
| 00000111 | 11100000 | Tf+0.375Tw | Tf+0.625Tw |
| 00001111 | 11110000 | Tf+0.500Tw | Tf+0.500Tw |
| 00011111 | 11100000 | Tf+0.625Tw | Tf+0.375Tw |
| 00111111 | 11000000 | Tf+0.750Tw | Tf+0.250Tw |
| 01111111 | 10000000 | Tf+0.875Tw | Tf+0.125Tw |
| 11111111 | 00000000 | Tf+1.000Tw | Tf |

SEMICONDUCTOR INTEGRATED CIRCUIT AND SEMICONDUCTOR STORAGE DEVICE

CROSS-REFERENCE TO RELATED APPLICATIONS

This application is based upon and claims the benefit of priority from the prior Japanese Patent Application No. 2021-147559 filed on Sep. 10, 2021; the entire contents of which are incorporated herein by reference.

FIELD

Embodiments described herein relate generally to a semiconductor integrated circuit and a semiconductor storage device.

BACKGROUND

A semiconductor integrated circuit configured to measure a period of a pulse signal such as a clock and a semiconductor storage device including the semiconductor integrated circuit have been known.

BRIEF DESCRIPTION OF THE DRAWINGS

FIG. 16 illustrates an example of a value of a code signal DN_F;

FIG. 17 illustrates an example of a value of a code signal DN_C;

FIG. 18 illustrates an example of a value of a code signal DN_FD;

FIG. 19 illustrates an example of a value of a code signal DN_CD;

FIG. 21 is a diagram illustrating a relation among the code signal DN_FD, a code signal DN_FDB, and delay times of a clock FOUTB_EVN and a clock FOUTB_ODD;

DETAILED DESCRIPTION

A semiconductor integrated circuit of the present embodiment includes: a delay element group in which a plurality of first delay elements having a first delay amount are connected in series; at least one flip-flop group including a plurality of flip-flops each of which an input is connected to an output of a corresponding first delay element among the plurality of first delay elements in the delay element group; a second delay circuit configured to generate, from a first clock signal, a plurality of second clock signals each having a delay difference of a second delay amount smaller than the first delay amount; and a variable delay circuit configured to set a third delay amount smaller than the second delay amount. The second delay circuit and the variable delay circuit are connected in series between a third clock output terminal and an input terminal of the flip-flop group.

Embodiments will be described below with reference to the accompanying drawings.

First Embodiment (1. Configuration)

(1-1. Configuration of Memory System)

Figure 1:
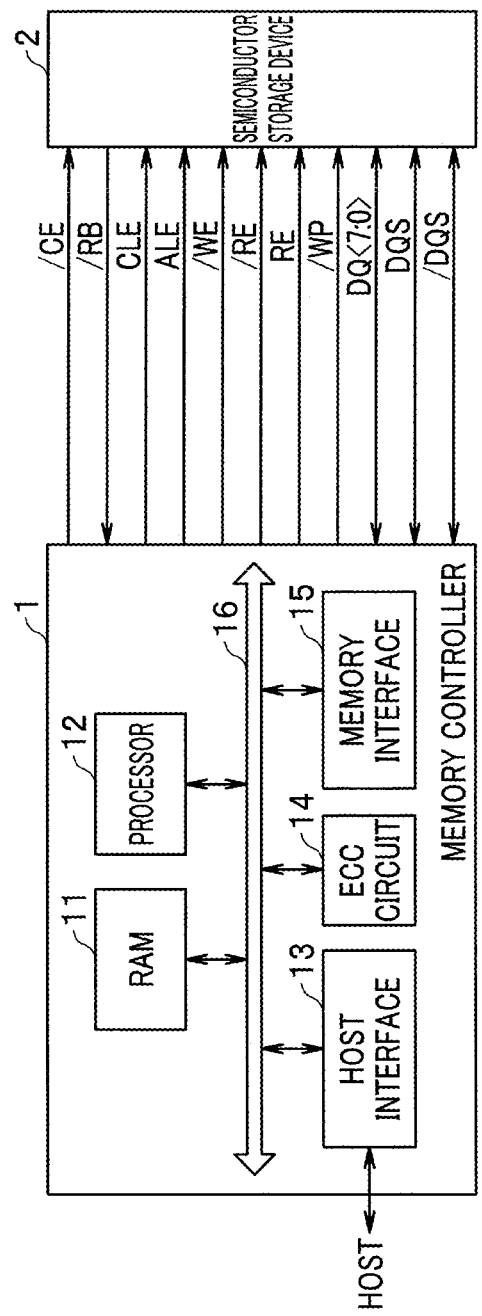
FIG. 1 is a block diagram illustrating an exemplary configuration of a memory system according to an embodiment of the present invention.

FIG. 1 is a block diagram illustrating an exemplary configuration of a memory system according to an embodiment of the present invention. The memory system of the present embodiment includes a memory controller 1 and a semiconductor storage device 2. The memory system is connectable to a host. The host is an electronic device such as a personal computer or a portable terminal.

The semiconductor storage device 2 includes a memory (hereinafter referred to as a non-volatile memory) configured to store data in a non-volatile manner. The non-volatile memory is, for example, a NAND memory (NAND flash memory) including a memory cell capable of storing three bits per memory cell, that is, a 3 bit/Cell (triple level cell (TLC)) NAND memory. Note that the non-volatile memory may be a 1 bit/Cell, 2 bit/Cell, or 4 bit/Cell NAND memory.

The memory controller 1 controls data writing to the semiconductor storage device 2 in accordance with a write request from the host. The memory controller 1 also controls data reading from the semiconductor storage device 2 in accordance with a read request from the host. A chip enable signal /CE, a ready/busy signal /RB, a command latch enable signal CLE, an address latch enable signal ALE, a write enable signal /WE, read enable signals RE and /RE, a write protect signal /WP, signals DQ <7:0> as data, and data strobe signals DQS and /DQS are transmitted and received between the memory controller 1 and the semiconductor storage device 2. Note that, in the present specification, a symbol "/" in front of a signal name indicates an inverted logic of a signal named with no symbol "/".

For example, the semiconductor storage device 2 and the memory controller 1 are each formed as a semiconductor chip (hereinafter also simply referred to as a "chip").

The chip enable signal /CE is a signal for enabling the semiconductor storage device 2. The ready/busy signal /RB is a signal for indicating whether the semiconductor storage device 2 is in a ready state (state in which a command from outside is received) or a busy state (state in which a command from outside is not received). The command latch enable signal CLE is a signal for indicating that the signals DQ <7:0> are commands. The address latch enable signal ALE is a signal for indicating that the signals DQ <7:0> are addresses. The write enable signal /WE is a signal for acquiring a received signal at the semiconductor storage device 2 and is asserted each time a command, an address or data is received by the memory controller 1. The semiconductor storage device 2 is instructed to acquire the signals DQ <7:0> when the write enable signal /WE is at "L (Low)" level.

The read enable signals RE and /RE are signals for the memory controller 1 to read data from the semiconductor storage device 2. For example, the read enable signals RE and /RE are used to control an operation timing of the semiconductor storage device 2 when the signals DQ <7:0> are output. The write protect signal /WP is a signal for instructing the semiconductor storage device 2 to inhibit data writing and erasure. The signals DQ <7:0> are main bodies of data transmitted and received between the semiconductor storage device 2 and the memory controller 1 and include commands, addresses, and data. The data strobe signals DQS and /DQS are signals for controlling input-output timings of the signals DQ <7:0>.

The memory controller 1 includes a random access memory (RAM) 11, a processor 12, a host interface circuit 13, an error check and correct (ECC) circuit 14, and a memory interface circuit 15. The RAM 11, the processor 12, the host interface circuit 13, the ECC circuit 14, and the memory interface circuit 15 are connected to one another through an internal bus 16.

The host interface circuit 13 outputs, to the internal bus 16, for example, a request and user data (write data) received from the host. In addition, the host interface circuit 13 transmits, to the host, for example, user data read from the semiconductor storage device 2 and a response from the processor 12.

The memory interface circuit 15 controls, based on an instruction from the processor 12, processing of writing user data or the like to the semiconductor storage device 2 and processing of reading user data or the like from the semiconductor storage device 2.

The processor 12 collectively controls the memory controller 1. The processor 12 is, for example, a central processing unit (CPU) or a micro processing unit (MPU). When having received a request from the host through the host interface circuit 13, the processor 12 instructs, in accordance with the request, the memory interface circuit 15 to write user data and parity to the semiconductor storage device 2. In addition, in accordance with a request from the host, the processor 12 instructs the memory interface circuit 15 to read user data and parity from the semiconductor storage device 2.

The processor 12 determines, for user data accumulated in the RAM 11, a storage region (memory region) in the semiconductor storage device 2. The user data is stored into the RAM 11 through the internal bus 16. The processor 12 performs the memory region determination for data (page data) per page as a unit of writing. In the present specification, unit data is defined to be user data stored in a page of the semiconductor storage device 2. The unit data is typically encoded by the ECC circuit 14 and stored as a code word into the semiconductor storage device 2. In the present embodiment, encoding is not essential. The memory controller 1 may store the unit data into the semiconductor storage device 2 without encoding, but FIG. 1 illustrates an exemplary configuration in which encoding is performed. When the memory controller 1 does not perform encoding, the page data is same as the unit data. One code word may be generated based on one unit data or based on division data into which the unit data is divided. Alternatively, one code word may be generated by using a plurality of pieces of unit data.

The processor 12 determines, for each unit data, a memory region at a writing destination in the semiconductor storage device 2. A physical address is allocated to each memory region in the semiconductor storage device 2. The processor 12 manages a memory region at a writing destination of unit data by using the physical address. The processor 12 designates a determined memory region (physical address) and instructs the memory interface circuit 15 to write user data to the semiconductor storage device 2. The processor 12 manages correspondence between a logical address (logical address managed by the host) and a physical address of user data. When having received a read request including a logical address from the host, the processor 12 specifies a physical address corresponding to the logical address and instructs, with designation of the physical address, the memory interface circuit 15 to read user data.

The ECC circuit 14 generates a code word by encoding user data stored in the RAM 11. In addition, the ECC circuit 14 decodes a code word read from the semiconductor storage device 2.

The RAM 11 temporarily stores user data received from the host until the user data is stored in the semiconductor storage device 2, and temporarily stores data read from the semiconductor storage device 2 until the data is transmitted to the host. The RAM 11 is a general-purpose memory such as a static random access memory (SRAM) or a dynamic random access memory (DRAM).

In the exemplary configuration illustrated in FIG. 1, the memory controller 1 includes the ECC circuit 14 and the memory interface circuit 15, but the ECC circuit 14 may be built in the memory interface circuit 15. Alternatively, the ECC circuit 14 may be built in the semiconductor storage device 2.

When having received a write request from the host, the memory system operates as follows. The processor 12 temporarily stores writing target data into the RAM 11. The processor 12 reads the data stored in the RAM 11 and inputs the data to the ECC circuit 14. The ECC circuit 14 encodes the input data and inputs a resulting code word to the memory interface circuit 15. The memory interface circuit 15 writes the input code word to the semiconductor storage device 2.

When having received a read request from the host, the memory system operates as follows. The memory interface circuit 15 inputs a code word read from the semiconductor storage device 2 to the ECC circuit 14. The ECC circuit 14 decodes the input code word and stores resulting decoded data into the RAM 11. The processor 12 transmits the data stored in the RAM 11 to the host through the host interface circuit 13.

(1-2. Configuration of Semiconductor Storage Device)

Figure 2:
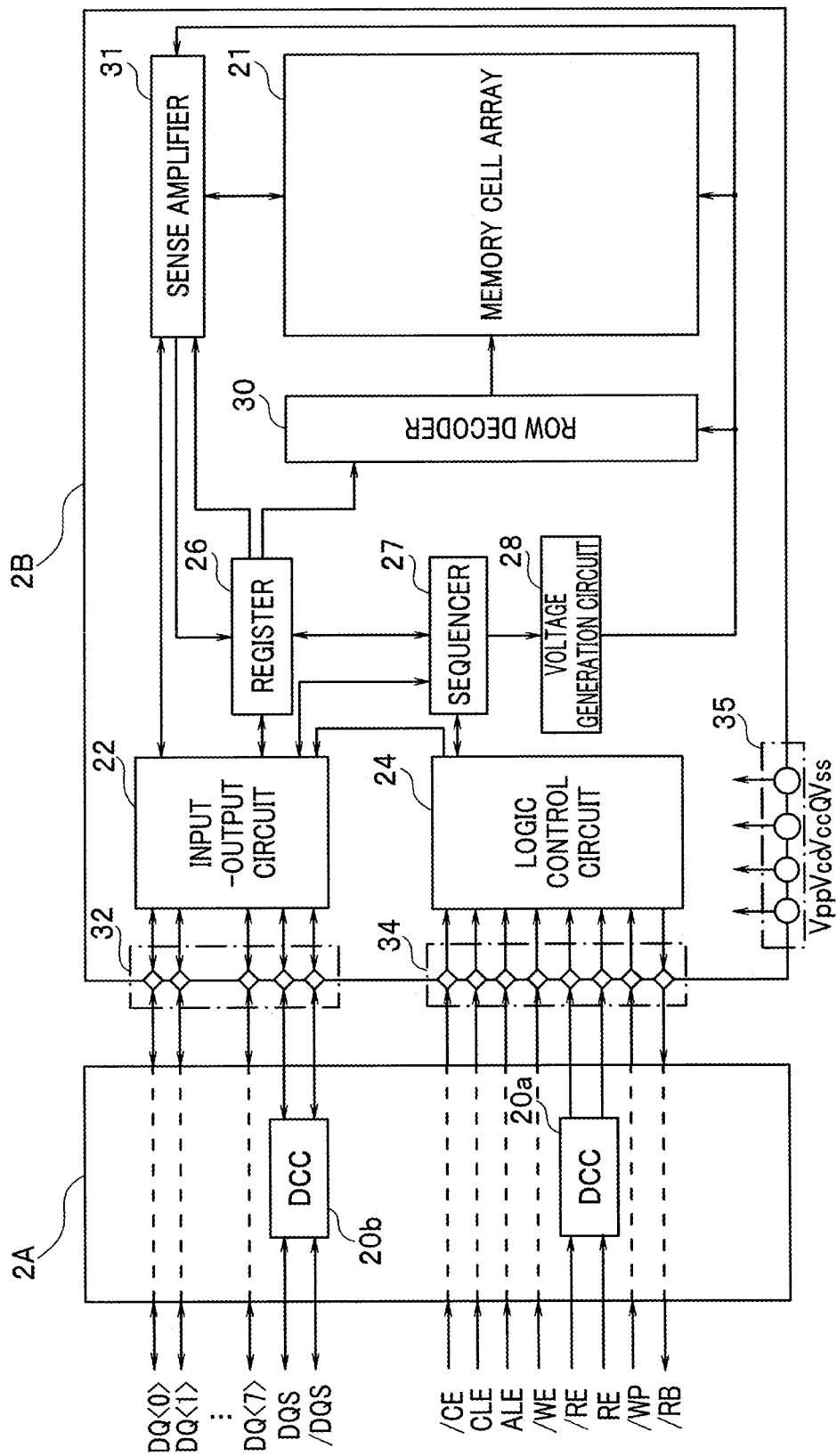
FIG. 2 is a block diagram illustrating an exemplary configuration of a semiconductor storage device of the present embodiment.

FIG. 2 is a block diagram illustrating an exemplary configuration of the semiconductor storage device of the present embodiment. The semiconductor storage device 2 of the present embodiment includes an interface chip 2A and a non-volatile memory 2B.

The interface chip 2A has a function to interface the chip enable signal /CE, the ready/busy signal /RB, the command latch enable signal CLE, the address latch enable signal ALE, the write enable signal /WE, the read enable signals RE and /RE, the write protect signal /WP, the signals DQ <7:0> as data, and the data strobe signals DQS and /DQS between the memory controller 1 and the non-volatile memory 2B. The interface chip 2A forwards, for example, a command CMD and an address ADD in the signals DQ <7:0> together with the data strobe signals DQS and /DQS to the non-volatile memory 2B. In addition, the interface chip 2A transmits and receives, for example, write data and read data in the signals DQ <7:0> together with the data strobe signals DQS and /DQS to and from the non-volatile memory 2B.

The interface chip 2A also has a frequency boost function for improving I/O speed of the non-volatile memory 2B. For example, the interface chip 2A has a function to forward a signal input from the memory controller 1 to the non-volatile memory 2B by a double date rate (DDR) scheme. When such a high-speed forwarding scheme is used, it is needed to highly accurately adjust a duty cycle of signals (specifically, the read enable signals RE and /RE and the data strobe signals DQS and /DQS) that instruct timings when the signals DQ <7:0> are transmitted and received between the memory controller 1 and the non-volatile memory 2B. The interface chip 2A includes a duty cycle correction (DCC) circuit 20 to adjust the duty cycle of the read enable signals RE and /RE and the duty cycle of the data strobe signals DQS and /DQS.

More specifically, the interface chip 2A includes a DCC circuit 20a configured to adjust the duty cycle of the read enable signals RE and /RE output from the memory controller 1 and input to the non-volatile memory 2B, and a DCC circuit 20b configured to adjust the duty cycle of the data strobe signals DQS and /DQS output from the memory controller 1 and input to the non-volatile memory 2B. Note that the DCC circuit 20b may adjust the duty cycle of the data strobe signals DQS and /DQS output from the non-volatile memory 2B and input to the memory controller 1. A detailed configuration of each DCC circuit 20 will be described later in detail.

The non-volatile memory 2B includes a memory cell array 21, an input-output circuit 22, a logic control circuit 24, a register 26, a sequencer 27, a voltage generation circuit 28, a row decoder 30, a sense amplifier unit 31, an input-output pad group 32, a logic control pad group 34, and a power source inputting terminal group 35.

The memory cell array 21 includes a plurality of non-volatile memory cell transistors (not illustrated) each associated with a word line and a bit line.

The input-output circuit 22 transmits and receives the signals DQ <7:0> and the data strobe signals DQS and /DQS to and from the memory controller 1 through the interface chip 2A. The input-output circuit 22 forwards commands and addresses in the signals DQ <7:0> to the register 26. The input-output circuit 22 also transmits and receives write data and read data to and from the sense amplifier unit 31.

The logic control circuit 24 receives the chip enable signal /CE, the command latch enable signal CLE, the address latch enable signal ALE, the write enable signal /WE, the read enable signals RE and /RE, and the write protect signal /WP from the memory controller 1 through the interface chip 2A. The logic control circuit 24 forwards the ready/busy signal /RB to the memory controller 1 through the interface chip 2A and notifies a state of the non-volatile memory 2B to outside.

The voltage generation circuit 28 generates voltage necessary for operation such as data writing, reading, and erasure based on an instruction from the sequencer 27.

The row decoder 30 receives a block address and a row address in an address from the register 26 and selects a corresponding block based on the block address and a corresponding word line based on the row address.

At data reading, the sense amplifier unit 31 senses read data that is read from a memory cell transistor onto the corresponding bit line and forwards the sensed read data to the input-output circuit 22. At data writing, the sense amplifier unit 31 forwards, to a memory cell transistor, write data that is written through the corresponding bit line. The sense amplifier unit 31 includes a plurality of sense amplifiers SA.

The input-output pad group 32 includes a plurality of terminals (pads) corresponding to the signals DQ <7:0> and the data strobe signals DQS and /DQS to transmit and receive signals including data to and from the interface chip 2A.

The logic control pad group 34 includes a plurality of terminals (pads) corresponding to the chip enable signal /CE, the command latch enable signal CLE, the address latch enable signal ALE, the write enable signal /WE, the read enable signals RE and /RE, and the write protect signal /WP to transmit and receive signals to and from the interface chip 2A.

The power source inputting terminal group 35 includes a plurality of terminals through which power voltage Vcc, VccQ, and Vpp and ground voltage Vss are input to supply various kinds of operation power sources to the non-volatile memory 2B from outside. The power voltage Vcc is circuit power voltage provided typically from outside as operation power source and input as voltage of, for example, 3.3 V approximately. The power voltage VccQ is input as voltage of, for example, 1.2 V. The power voltage VccQ is used as power source for driving an input-output system for transmitting and receiving signals between the memory controller 1 and the non-volatile memory 2B.

The power voltage Vpp is power voltage higher than the power voltage Vcc and input as voltage of, for example, 12 V. For example, no power voltage Vpp may be supplied when the non-volatile memory 2B is used in a case where high voltage cannot be supplied. The non-volatile memory 2B can execute various kinds of operation as long as the power voltage Vcc is supplied even when no power voltage Vpp is supplied. In other words, the power voltage Vcc is a power source normally supplied to the non-volatile memory 2B, and the power voltage Vpp is a power source additionally and optionally supplied in accordance with, for example, a use environment.

At data reading, a sense unit 24 senses data read from a NAND memory cell array 23. At data writing, the sense unit 24 temporarily stores write data input from the memory controller 1 through the interface chip 2A and forwards the write data to the NAND memory cell array 23.

(1-3. Configuration of DCC Circuit)

Figure 3:
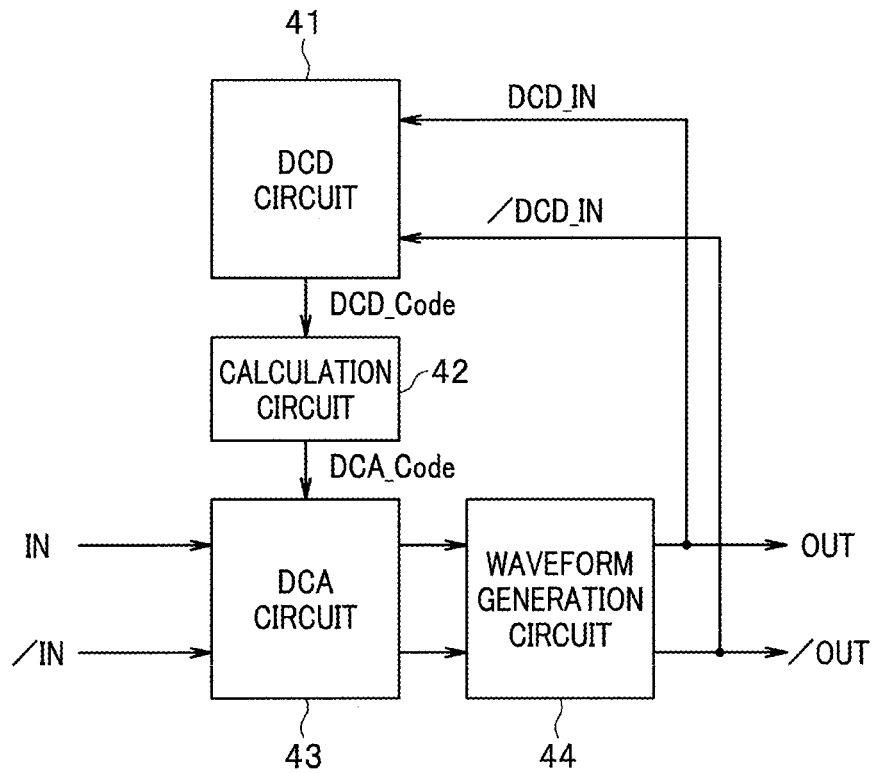
FIG. 3 is a block diagram illustrating an exemplary configuration of a DCC circuit.

FIG. 3 is a block diagram illustrating an exemplary configuration of each DCC circuit. Each DCC circuit 20 of the embodiment includes a duty cycle detector (DCD) circuit 41, a calculation circuit 42, a duty cycle adjustor (DCA) circuit 43, and a waveform generation circuit 44.

The DCD circuit 41 is a circuit configured to measure duty cycle error of a clock signal as a duty cycle correction target and convert the duty cycle error into the number of delay elements. The DCD circuit 41 detects (measures) a pulse width (high-level duration) of an input clock DCD_IN and a pulse width of an input clock /DCD_IN and outputs a signal DCD_CODE indicating the pulse width of the input clock DCD_IN and the pulse width of the input clock /DCD_IN. The signal DCD_CODE includes a plurality of bits (for example, 32 bits).

The calculation circuit 42 is a circuit configured to calculate a delay set value of a clock signal as a duty cycle correction target based on an output signal from the DCD circuit 41. The calculation circuit 42 receives the signal DCD_CODE output from the DCD circuit 41 and compares the pulse width of the input clock DCD_IN and the pulse width of the input clock /DCD_IN. Then, the calculation circuit 42 generates a signal DCA_CODE based on a result of the comparison.

The DCA circuit 43 generates a delay clock CDLY_T of an input clock IN and a delay clock CDLY_B of an input clock /IN as duty cycle correction targets based on the signal DCA_CODE.

The waveform generation circuit 44 receives the delay clocks CDLY_T and CDLY_B output from the DCA circuit 43 and generates output clocks OUT and /OUT. In other words, the output clocks OUT and /OUT are output signals after duty cycle adjustment of the input clocks IN and /IN. Note that the output clocks OUT and /OUT generated at the waveform generation circuit 44 are output from the DCC circuit 20 and input to the DCD circuit 41.

(1-3-1. Configuration of DCD Circuit)

Figure 4:
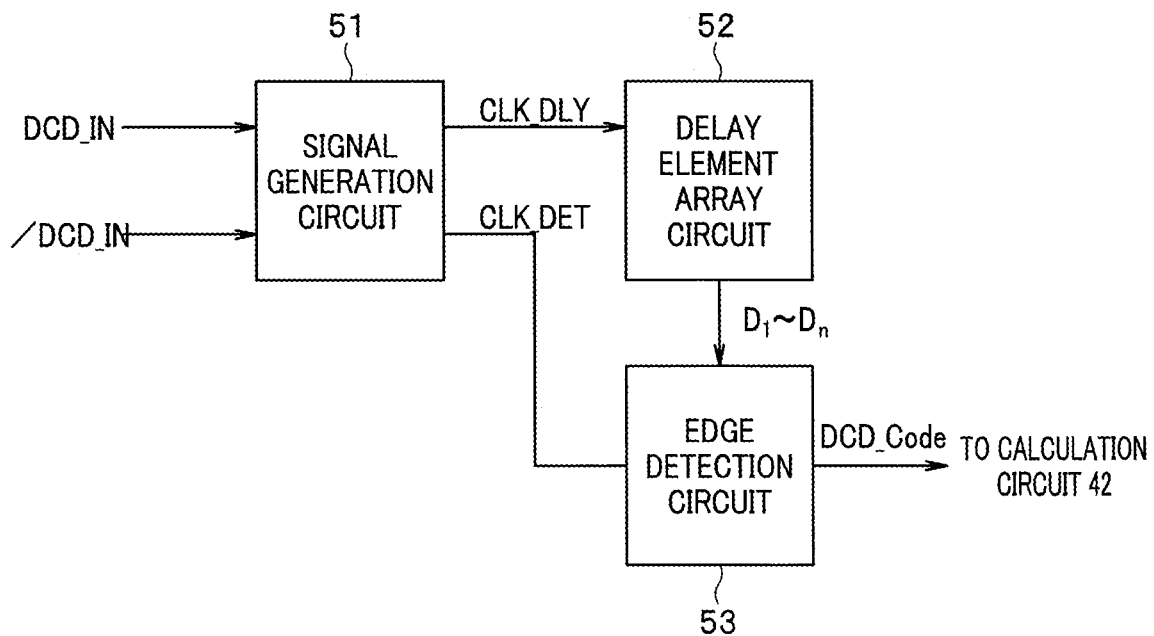
FIG. 4 is a block diagram illustrating an exemplary configuration of a DCD circuit.

FIG. 4 is a block diagram illustrating an exemplary configuration of each DCD circuit. Each DCD circuit 41 of the embodiment includes a signal generation circuit 51, a delay element array circuit 52, and an edge detection circuit 53. Note that the semiconductor integrated circuit of the embodiment includes at least the delay element array circuit 52 and the edge detection circuit 53.

The input clocks DCD_IN and /DCD_IN are input to the signal generation circuit 51. The signal generation circuit 51 generates a signal CLK_DLY and a signal CLK_DET from the input clocks DCD_IN and /DCD_IN.

A duration in which the signal CLK_DLY is at high level and a duration in which the signal CLK_DET is at high level are set to a length equal to one period of the input clock DCD_IN (=length equal to one period of the input clock /DCD_IN).

Rising of the signal CLK_DLY in each even-numbered period is set to a timing same as a timing of rising of the input clock DCD_IN. Rising of the signal CLK_DLY in each odd-numbered period is set to a timing same as a timing of rising of the input clock /DCD_IN.

Rising of the signal CLK_DET in each even-numbered period is set to a timing same as a timing of falling of the input clock DCD_IN. Rising of the signal CLK_DET in each odd-numbered period is set to a timing same as a timing of falling of the input clock /DCD_IN.

In other words, the signal CLK_DLY and the signal CLK_DET are generated so that a duration from rising of the signal CLK_DLY in each even-numbered period to rising of the signal CLK_DET has a length equal to a duration in which the input clock DCD_IN is at high level and a duration from rising of the signal CLK_DLY in each odd-numbered period to rising of the signal CLK_DET has a length equal to a duration in which the input clock /DCD_IN is at high level. Therefore, the duration in which the input clock DCD_IN is at high level and the duration in which the input clock /DCD_IN is at high level can be alternately observed by continuously measuring each duration from rising of the input clock DCD_IN to rising of the input clock /DCD_IN.

Note that a duration from rising in an n-th period to rising in a (n+1)-th period in the signal CLK_DLY and the signal CLK_DET is set to be a duration sufficient for measurement of the duration in which the input clock DCD_IN or /DCD_IN is at high level and generation of DCD_CODE.

The delay element array circuit 52 as a delay element group generates signals Dn (D1 to Dn) of n (n is a natural number equal to or larger than two) bits by using the signal CLK_DLY input from the signal generation circuit 51. The set of signals Dn is latched at the edge detection circuit 53 to be described later and indicates the pulse width or period of an input clock.

Figure 5:
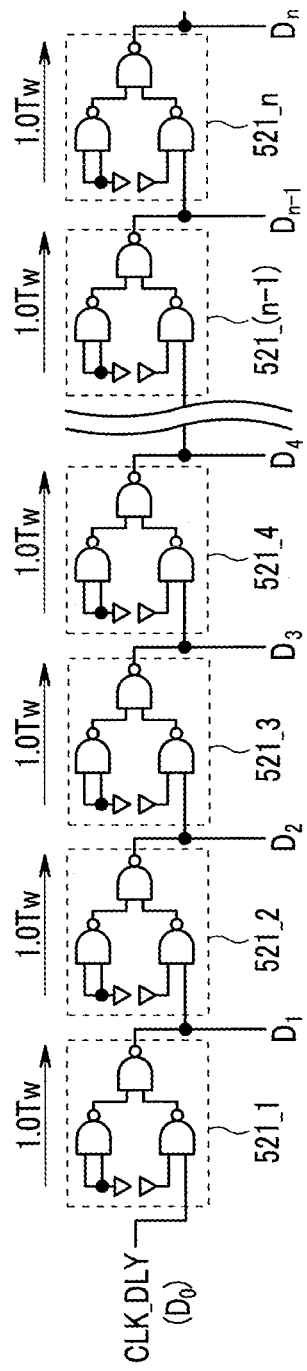
FIG. 5 is a circuit diagram illustrating an example of a delay element array circuit.

FIG. 5 is a circuit diagram illustrating an example of the delay element array circuit. The delay element array circuit 52 as the delay element group includes n delay elements 521_1 to 521_$n$ (first delay elements). In each case in which a is a natural number equal to or larger than one and equal to or smaller than n, a delay element 521_$\alpha$ receives a signal D($\alpha$−1) and outputs a signal D$\alpha$. Note that a signal D0 is same as the signal CLK_DLY. Hereinafter, a notation including "$\alpha$" collectively indicates all cases in which $\alpha$ has a value equal to or larger than one and equal to or smaller than n. Specifically, a notation including "a" collectively indicates a case in which $\alpha$ is one, a case in which $\alpha$ is two, . . . , and a case in which $\alpha$ is n. The signal D$\alpha$ is a signal obtained by delaying the signal D($\alpha$−1) by a certain time period. The delay element 521_$\alpha$ receives the signal CLK_DLY, stores a logic level of the signal D$\alpha$ when the signal CLK_DLY is transitioned to high level, and continues to output the signal D$\alpha$ at a logic level same as the stored logic level of the signal D$\alpha$.

Delay amounts of the delay elements 521_1 to 521_$n$ may vary due to unexpected variance in performance of the delay elements 521_1 to 521_$n$ but are intended to be a time period Tw. The following description assumes that the delay amounts of the delay elements 521_1 to 521_$n$ are equal to one another and are the time period Tw. The delay element 521_$\alpha$ includes, for example, three NAND gates. The first NAND gate receives the signal D($\alpha\ominus$1) at one input. The first NAND gate is grounded, that is, connected to a node of ground voltage Vss at the other input. The second NAND gate is grounded, that is, connected to the node of the ground voltage Vss at two inputs. The third NAND gate receives an output from the first NAND gate and an output from the second NAND gate and outputs the signal D$\alpha$. The delay element 521_$\alpha$ generates a delay by the time period Tw.

Figure 6:
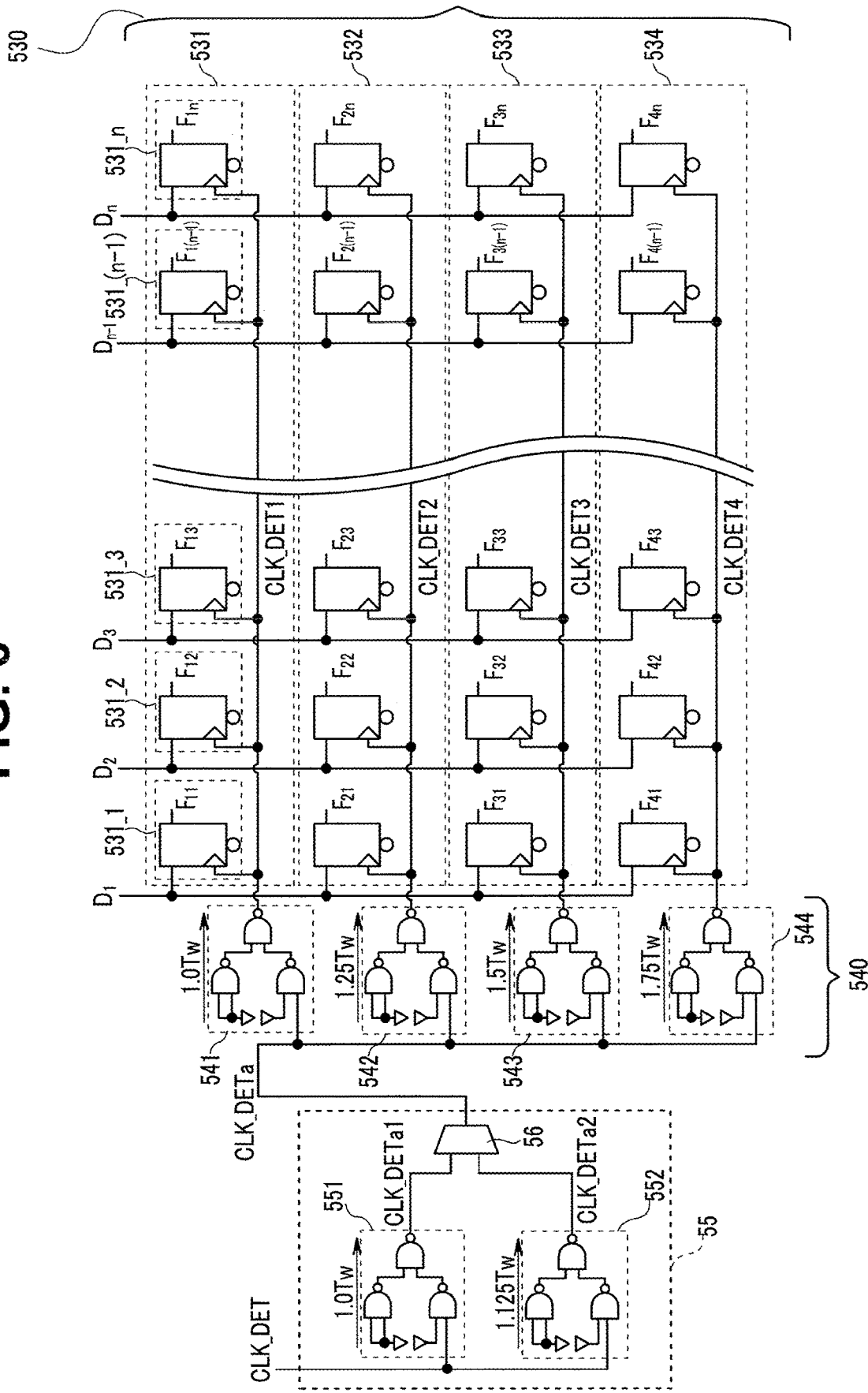
FIG. 6 is a circuit diagram illustrating an example of an edge detection circuit of a first embodiment.

The edge detection circuit 53 receives the signals D1 to Dn output from the delay element array circuit 52 and the signal CLK_DET output from the signal generation circuit 51, and outputs the signal DCD_CODE. FIG. 6 is a circuit diagram illustrating an example of the edge detection circuit of a first embodiment. The edge detection circuit 53 includes a delay line group 530 as a flip-flop group. The delay line group 530 includes m (m is a natural number equal to or larger than two) delay lines 531 to 53*m*. Each delay line 53$\beta$ ($\beta$ is a natural number equal to or larger than one and equal to or smaller than m) includes n D-type flip-flops (hereinafter simply referred to as flip-flops) 53$\beta$_1 to **53$\beta$_*n*. Hereinafter, a notation including "$\beta$" collectively indicates all cases in which $\beta$ has a value equal to or larger than one and equal to or smaller than m. Specifically, a notation including "$\beta$" collectively indicates a case in which $\beta$ is one, a case in which $\beta$ is two, . . . , and a case in which $\beta$ is m. The edge detection circuit 53 also includes a delay element group 540 as a second delay circuit. The delay element group 540 includes m delay elements 54$\beta$ (third delay elements). A delay amount of each delay element 54$\beta$** is set to a time period $\{1.0+(\beta-1)/m\}\times$Tw.

The edge detection circuit 53 also includes a delay unit 55 configured to generate an input signal CLK_DETa to the delay elements 54$\beta$. The delay unit 55 as a variable delay circuit includes s delay elements 55$\delta$ ($\delta$ is a natural number equal to or larger than one and equal to or smaller than s) and a selector 56. Hereinafter, a notation including "$\delta$" collectively indicates a case in which $\delta$ is one, a case in which $\delta$ is two, . . . , and a case in which $\delta$ is s. A delay amount of each delay element 55$\delta$ is set to a time period $\{1.0+(\delta-1)/(m\times s)\}\times$Tw.

Each delay element 55$\delta$ (second delay element) receives the signal CLK_DET output from the signal generation circuit 51, delays the received signal by a set time period, and outputs the delayed signal to the selector 56. The delay element 55$\delta$ includes, for example, three NAND gates. The first NAND gate receives the signal CLK_DET at one input. The first NAND gate is grounded, that is, connected to the node of the ground voltage Vss at the other input. The second NAND gate is grounded, that is, connected to the node of the ground voltage Vss at two inputs. The third NAND gate receives an output from the first NAND gate and an output from the second NAND gate, and outputs a signal CLK_DETa$\delta$. The delay element 55$\delta$ generates a delay by a time period $\{1.0+(\delta-1)/(m\times s)\}\times$Tw. The selector 56 selects and outputs one of the signals CLK_DETa$\delta$ input from the s delay elements 55$\delta$.

Each delay element 54$\beta$ receives the signal CLK_DETa output from the selector 56, delays the received signal by a set time period, and outputs the delayed signal to the delay line 53$\beta$. The delay element 54$\beta$ includes, for example, three NAND gates. The first NAND gate receives the signal CLK_DETa at one input. The first NAND gate is grounded, that is, connected to the node of the ground voltage Vss at the other input. The second NAND gate is grounded, that is, connected to the node of the ground voltage Vss at two inputs. The third NAND gate receives an output from the first NAND gate and an output from the second NAND gate, and outputs a signal CLK_DETm. The delay element 54$\beta$ generates a delay by a time period $\{1.0+(\beta-1)/m\}\times$Tw.

FIG. 6 illustrates, as an example, the edge detection circuit 53 in a case of s=2 and m=4. The delay amount of the delay element 551 is a time period $\{1.0+(1-1)/(4\times2)\}$Tw=1.0 Tw. The delay element 551 receives the signal CLK_DET, delays the received signal by a time period 1.0 Tw, and outputs the signal CLK_DETa1. The delay amount of the delay element 552 is a time period $\{1.0+(2-1)/(4\times2)\}$Tw=1.125 Tw. The delay element 552 receives the signal CLK_DET, delays the received signal by a time period 1.125 Tw, and outputs the signal CLK_DETa2. The selector 56 receives the signal CLK_DETa1 and the signal CLK_DETa2 and outputs one of the signals (the signal CLK_DETa).

The delay amount of the delay element 541 is a time period $\{1.0+(1-1)/4\}$Tw=1.0 Tw. The delay element 541 receives the signal CLK-DETa, delays the received signal by a time period 1.0 Tw, and outputs the signal CLK_DET1. The delay amount of the delay element 542 is a time period $\{1.0+(2-1)/4\}$Tw=1.25 Tw. The delay element 542 receives the signal CLK_DETa, delays the received signal by a time period 1.25 Tw, and outputs the signal CLK_DET2. The delay amount of the delay element 543 is a time period $\{1.0+(3-1)/4\}$Tw=1.5 Tw. The delay element 543 receives the signal CLK_DETa, delays the received signal by a time period 1.5 Tw, and outputs the signal CLK_DET3. The delay amount of the delay element 544 is a time period $\{1.0+(4-1)/4\}$Tw=1.75 Tw. The delay element 544 receives the signal CLK_DETa, delays the received signal by a time period 1.75 Tw, and outputs the signal CLK_DET4.

When the signal CLK_DETa1 is selected by the selector 56, the signal CLK_DETa is a signal obtained by delaying the signal CLK_DET by a time period 1.0 Tw. In this case, the signal CLK_DET1 is a signal obtained by delaying the signal CLK_DET by a time period (1.0+1.0)Tw=2.0 Tw. The signal CLK_DET2 is a signal obtained by delaying the signal CLK_DET by a time period (1.0+1.25)Tw=2.25 Tw. The signal CLK_DET3 is a signal obtained by delaying the signal CLK_DET by a time period (1.0+1.5)Tw=2.5 Tw. The signal CLK_DET4 is a signal obtained by delaying the signal CLK_DET by a time period (1.0+1.75)Tw=2.75 Tw.

When the signal CLK_DETa2 is selected by the selector 56, the signal CLK_DETa is a signal obtained by delaying the signal CLK_DET by a time period 1.125 Tw. In this case, the signal CLK_DET1 is a signal obtained by delaying the signal CLK_DET by a time period (1.125+1.0)Tw=2.125 Tw. The signal CLK_DET2 is a signal obtained by delaying the signal CLK_DET by a time period (1.125+1.25) Tw=2.375 Tw. The signal CLK_DET3 is a signal obtained by delaying the signal CLK_DET by a time period (1.125+1.5)Tw=2.625 Tw. The signal CLK_DET4 is a signal obtained by delaying the signal CLK_DET by a time period (1.125+1.75)Tw=2.875 Tw.

Each flip-flop 53$\beta$_$\alpha$ of the delay line 53$\beta$ receives the signal D$\alpha$ output from the delay element 521_$\alpha$ of the delay element array circuit 52, at data inputting, receives the signal CLK_DET$\beta$ at clock inputting, and outputs a signal F$\beta\alpha$. For example, the flip-flop 531_1 of the delay line 531 receives the signal D1 at data inputting, receives the signal CLK_DET1 at clock inputting, and outputs the signal F11. The flip-flop **534_*n* of the delay line 534** receives the signal Dn at data inputting, receives the signal CLK_DET4 at clock inputting, and outputs the signal F4*n*. In other words, the edge detection circuit 53 generates a signal Fmn of m×n bits and outputs the generated signal as the signal DCD_CODE.

(1-3-2. Configuration of Calculation Circuit)

The calculation circuit 42 is a circuit configured to calculate the delay set value of a clock signal as a duty cycle correction target based on an output signal from the DCD circuit 41. The calculation circuit 42 receives the signal DCD_CODE output from the DCD circuit 41 and compares the pulse width (high-level duration) of the input clock DCD_IN and the pulse width (high-level duration) of the input clock /DCD_IN. Then, the calculation circuit 42 generates the signal DCA_CODE based on a result of the comparison. The code signal DCA_CODE is constituted by code signals DN_F and DN_C for correcting a timing of rising of the input clock IN, and code signals UP_F and UP_C for correcting a timing of rising of the input clock /IN. In the code signal DCA_CODE, for example, the code signal DN_F of (m×s+1) bits, the code signal DN_C of 1 bit, the code signal UP_F of (m×s+1) bits, and the code signal UP_C of 1 bit are arranged in the stated order and output. Note that the generation of the signal DCA_CODE at the calculation circuit 42 will be described below in detail.

(1-3-3. Configuration of DCA Circuit)

Figure 7:
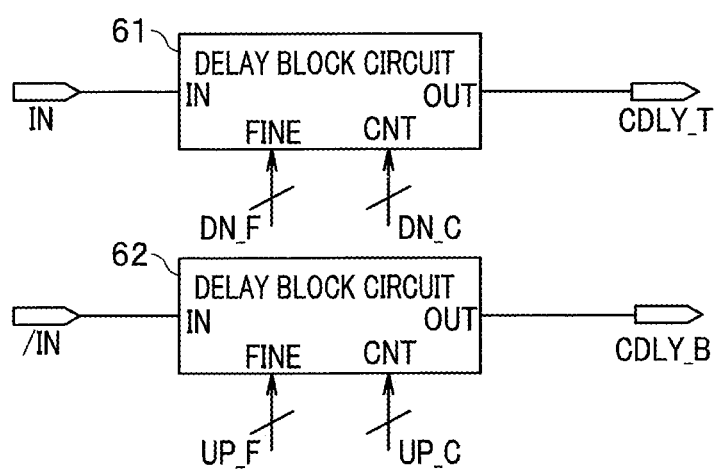
FIG. 7 is a block diagram illustrating an exemplary configuration of a DCA circuit.

FIG. 7 is a block diagram illustrating an exemplary configuration of the DCA circuit. The DCA circuit 43 of the embodiment includes two delay block circuits 61 and 62. The delay block circuit 61 is a delay circuit configured to correct the timing of rising of the input clock IN. The delay block circuit 61 receives the input clock IN and the code signals DN_F and DN_C included in the signal DCA_CODE and generates the delay clock CDLY_T. The delay block circuit 62 is a delay circuit configured to correct the timing of rising of the input clock /IN. The delay block circuit 62 receives the input clock /IN and the code signals UP_F and UP_C included in the signal DCA_CODE and generates the delay clock CDLY_B.

Figure 8:
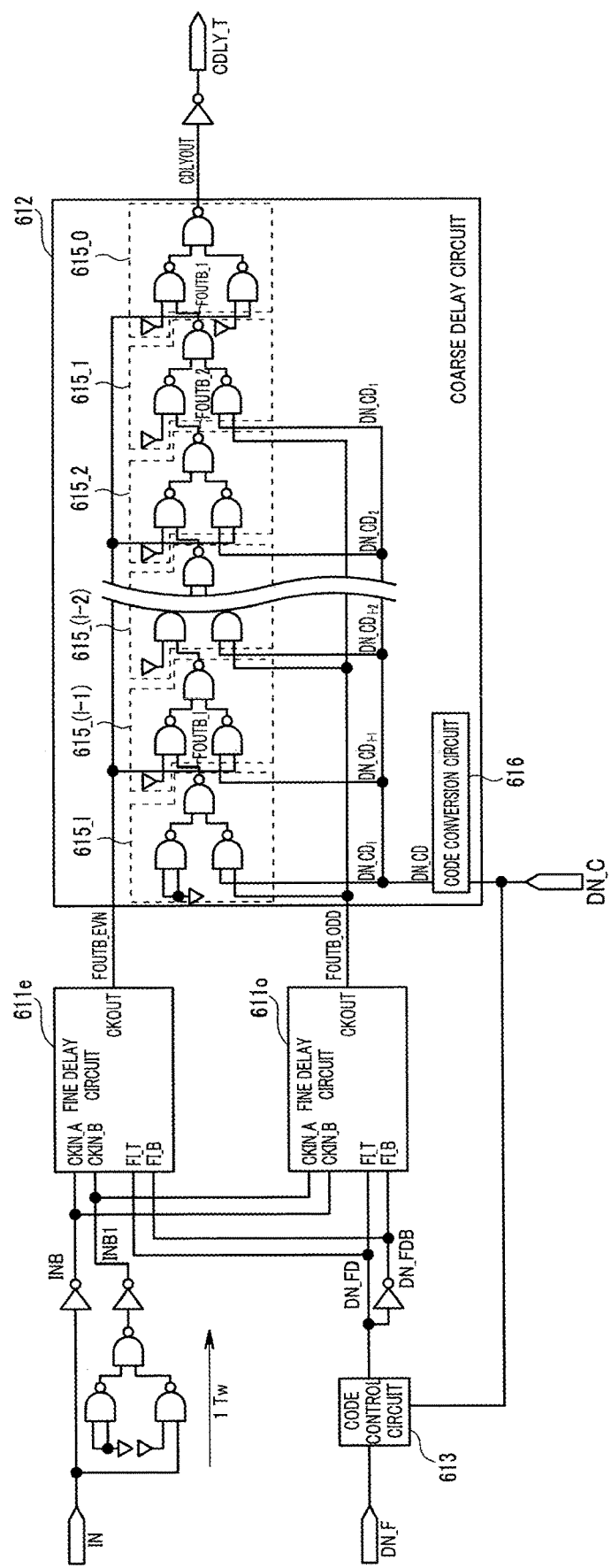
FIG. 8 is a circuit diagram illustrating an exemplary configuration of a delay block circuit.

First, the delay block circuit 61 will be described below. FIG. 8 is a circuit diagram illustrating an exemplary configuration of the delay block circuit. The delay block circuit 61 includes a pair of FINE delay circuits 611e and 611o, a COARSE delay circuit 612, and a code control circuit 613.

The FINE delay circuits 611e and 611o are delay circuits configured to correct the timing of rising of the input clock IN at a resolution equal to or shorter than a time period 1.0 Tw (specifically, (1.0/(m×s))Tw time unit). The FINE delay circuits 611e and 611o are each a delay circuit including four input terminals CKIN_A, CKIN_B, FI_T, and FI_B and one output terminal CKOUT.

Figure 9:
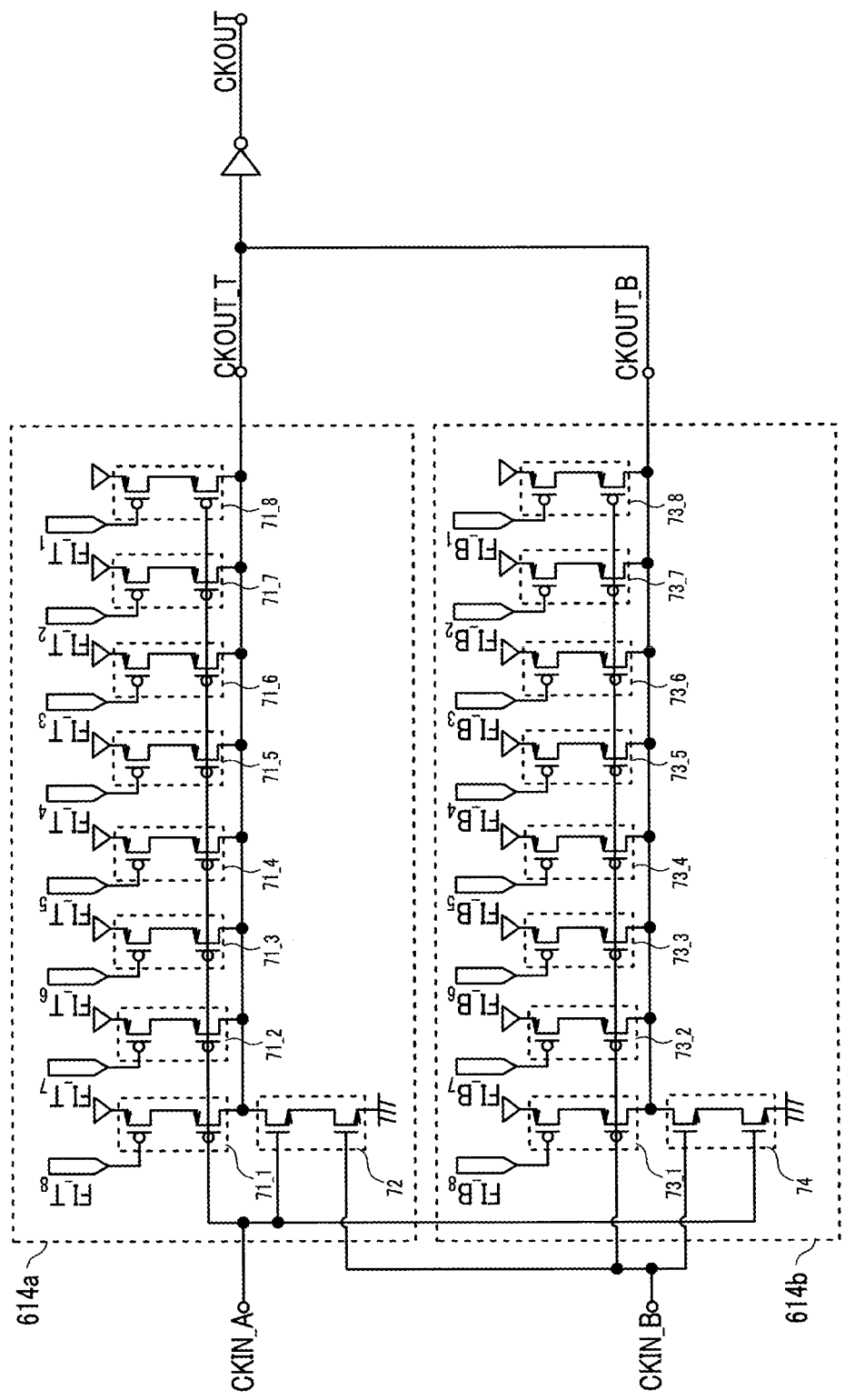
FIG. 9 is a circuit diagram illustrating an exemplary configuration of a FINE delay circuit.

FIG. 9 is a circuit diagram illustrating an exemplary configuration of each FINE delay circuit. The FINE delay circuit 611e includes a pair of inverter circuits 614a and 614b. The inverter circuit 614a includes (m×s) P-side switches 71_1, 71_2, . . . , 71_(m×s) and one N-side switch 72. FIG. 9 illustrates a case of s=2 and m=4. Each P-side switch 71_ε is constituted by connecting two PMOS transistors in series. Hereinafter, a notation including "ε" collectively indicates all cases in which ε has a value equal to or larger than one and equal to or smaller than (m×s). Specifically, a notation including "ε" collectively indicates a case in which ε is one, a case in which ε is two, . . . , and a case in which ε is (m×s). The (m×s) P-side switches 71_ε are connected in parallel between an output terminal CKOUT_T of the inverter circuit 614a and the node of the power voltage Vcc. The N-side switch 72 is constituted by connecting two NMOS transistors in series. The N-side switch 72 is connected between the output terminal CKOUT_T of the inverter circuit 614a and the node of the ground voltage Vss.

Among the two PMOS transistors constituting each P-side switch 71_ε, a gate of a PMOS transistor (hereinafter referred to as a first PMOS transistor) having a drain connected to the output terminal CKOUT_T of the inverter circuit 614a is connected to the input terminal CKIN_A. Data of one set bit in a code signal of (m×s) bits input from the input terminal FI_T is input to a gate of the other PMOS transistor (hereinafter referred to as a second PMOS transistor) included in the P-side switch 71_ε. In other words, data of the first bit, data of the second bit, . . . , and data of the (m×s)-th bit in the code signal input from the input terminal FI_T are input sequentially from a P-side switch 71 closest to the output terminal CKOUT_T.

In the case of the configuration illustrated in FIG. 9, data of the first bit of the code signal input from the input terminal FI_T is input to the P-side switch 71_8, data of the second bit of the signal is input to the P-side switch 71_7, data of the third bit of the signal is input to the P-side switch 71_6, and data of the fourth bit of the signal is input to the P-side switch 71_5. In addition, data of the fifth bit of the signal is input to the P-side switch 71_4, data of the sixth bit of the signal is input to the P-side switch 71_3, data of the seventh bit of the signal is input to the P-side switch 71_2, and data of the eighth bit of the signal is input to the P-side switch 71_1. Specifically, when the code signal of eight bits input from the input terminal FI_T is "11100000", "1 (="H")" is input to the gate of the second PMOS transistor of each of the P-side switches 71_1, 71_2, and 71_3, and "0(="L")" is input to the gate of the second PMOS transistor of each of the P-side switches 71_4, 71_5, 71_6, 71_7, and 71_8.

Among the two NMOS transistors constituting the N-side switch 72, a gate of an NMOS transistor (hereinafter referred to as a first NMOS transistor) having a drain connected to the output terminal CKOUT_T of the inverter circuit 614a is connected to the input terminal CKIN_A. A gate of the other NMOS transistor (hereinafter referred to as a second NMOS transistor) constituting the N-side switch 72 is connected to the input terminal CKIN_B.

The inverter circuit 614b includes (m×s) P-side switches 73_1, 73_2, . . . , and 73_(m×s) and one N-side switch 74. Each P-side switch 73_ε is constituted by connecting two PMOS transistors in series. The (m×s) P-side switches 73_ε are connected in parallel between an output terminal CKOUT_B of the inverter circuit 614a and the node of the power voltage Vcc. Note that, similarly to the P-side switch 71_ε, among the two PMOS transistors constituting the P-side switch 73_ε, a PMOS transistor having a drain connected to the output terminal CKOUT_B of the inverter circuit 614b is referred to as a first PMOS transistor and the other PMOS transistor is referred to as a second PMOS transistor. The N-side switch 74 is constituted by connecting two NMOS transistors in series. The N-side switch 74 is connected between the output terminal CKOUT_B of the inverter circuit 614b and the node of the ground voltage Vss. Note that, similarly to the N-side switch 72, among the two NMOS transistors constituting the N-side switch 74, an NMOS transistor having a drain connected to the output terminal CKOUT_B of the inverter circuit 614b is referred to as a first NMOS transistor, and the other NMOS transistor is referred to as a second NMOS transistor.

A gate of the first PMOS transistor among the two PMOS transistors constituting the P-side switch 73_ε is connected to the input terminal CKIN_B. Data of one set bit in a code signal of (m×s) bits input from the input terminal FI_B is input to a gate of the second PMOS transistor of the P-side switch 73_ε. In other words, data of the first bit, data of the second bit, . . . , and data of the (m×s)-th bit in the code signal input from the input terminal FI_B are input sequentially from a P-side switch 73 closest to the output terminal CKOUT_B.

In the case of the configuration illustrated in FIG. 9, data of the first bit of the code signal input from the input terminal FI_B is input to the P-side switch 73_8, data of the second bit of the signal is input to the P-side switch 73_7, data of the third bit of the signal is input to the P-side switch 73_6, and data of the fourth bit of the signal is input to the P-side switch 73_5. In addition, data of the fifth bit of the signal is input to the P-side switch 73_4, data of the sixth bit of the signal is input to the P-side switch 73_3, data of the seventh bit of the signal is input to the P-side switch 73_2, and data of the eighth bit of the signal is input to the P-side switch 73_1. Specifically, when the code signal of eight bits input from the input terminal FI_B is "00011111", "1(="H")" is input to the gate of the second PMOS transistor of each of the P-side switches 73_4, 73_5, 73_6, 73_7, and 73_8, and "0 (="L")" is input to the gate of the second PMOS transistor of each of the P-side switches 73_1, 73_2, and 73_3.

Among the two NMOS transistors constituting the N-side switch 74, a gate of the first NMOS transistor is connected to the input terminal CKIN_B. A gate of the second NMOS transistor of the N-side switch 72 is connected to the input terminal CKIN_A.

The output terminal CKOUT_T of the inverter circuit 614a and the output terminal CKOUT_B of the inverter circuit 614b are electrically connected to each other. In other words, the output terminal CKOUT_T and the output terminal CKOUT_B are short-circuited. A signal PI_CLKB into which an output signal from the inverter circuit 614a and an output signal from the inverter circuit 614b are merged is logically inverted by an inverter and output from the output terminal CKOUT.

In the FINE delay circuit 611e, a signal (clock INB) obtained by logically inverting the input clock IN is input to the input terminal CKIN_A, and a signal (clock INB1) obtained by delaying the clock INB by a time period 1.0 Tw is input to the input terminal CKIN_B. In addition, in the FINE delay circuit 611e, a code signal DN_FD is input to the input terminal FI_T. Moreover, a code signal DN_FDB as a signal obtained by logically inverting the code signal DN_FD is input to the input terminal FI_B.

The FINE delay circuit 611e receives the clock INB, the clock INB1, the code signal DN_FD, and the code signal DN_FDB and generates a clock FOUTB_EVN. The clock FOUTB_EVN is a signal obtained by delaying rising of the input clock IN in a range of 0 to 1.0 Tw based on the code signals DN_FD and DN_FDB and logically inverting the delayed signal.

In the FINE delay circuit 611o, the signal (clock INB) obtained by logically inverting the input clock IN is input to the input terminal CKIN_B, and the signal (clock INB1) obtained by delaying the clock INB by a time period 1.0 Tw is input to the input terminal CKIN_A. In addition, in the FINE delay circuit 611e, the code signal DN_FD is input to the input terminal FI_T. Moreover, the code signal DN_FDB as the signal obtained by logically inverting the code signal DN_FD is input to the input terminal FI_B.

The FINE delay circuit 611o receives the clock INB, the clock INB1, the code signal DN_FD, and the code signal DN_FDB and generates a clock FOUTB_ODD. The clock FOUTB_ODD is a signal obtained by delaying rising of the input clock IN in a range of 0 to 1.0 Tw based on the code signals DN_FD and DN_FDB and logically inverting the delayed signal. Note that the generation of the clocks FOUTB_EVN and FOUTB_ODD at the FINE delay circuits 611e and 611o will be described below in detail.

The code control circuit 613 receives the code signals DN_C and DN_F and generates the code signal DN_FD to be input to the input terminal FI_T of the FINE delay circuit 611e and the input terminal FI_T of the FINE delay circuit 611o. The code signal DN_FD is a thermometer code of (m×s) bits. The generation of the code signal DN_FD at the code control circuit 613 will be described below in detail.

The COARSE delay circuit 612 is a delay circuit configured to correct the timing of rising of the input clock IN in the time unit of 1.0 Tw. The COARSE delay circuit 612 receives a signal FOUTE_EVN, a signal FOUTE_ODD, and the code signal DN_C, selects any one of the clock FOUTB_EVN and the clock FOUTB_ODD based on the code signal DN_C, delays the selected signal by an amount based on the code signal DN_C, and outputs the delayed signal as an output clock CDLYOUT.

The COARSE delay circuit 612 includes (1+1) delay elements 615_0 to 615_1. The delay elements 615_0 to 615_1 are disposed in order of the delay elements 615_0, 615_1, 615_2, ..., and 615_1 from a side closer to an output end. In each case in which γ is zero and a natural number equal to or larger than one and equal to or smaller than 1, a delay element 615_γ includes, for example, three NAND gates. Hereinafter, a notation including "γ" collectively indicates all cases in which γ has a value equal to or larger than zero and equal to or smaller than 1. Specifically, a notation including "⊖" collectively indicates a case in which γ is zero, a case in which γ is one, ..., and a case in which γ is 1. The delay element 615_γ generates a delay by a time period 1.0 Tw.

The COARSE delay circuit 612 also includes a code conversion circuit 616. The code conversion circuit 616 receives and decodes the code signal DN_C included in the signal DCA_CODE output from the calculation circuit 42, converts a binary code into a thermometer code, and generates a code signal DN_CD. The code signal DN_CD is a code signal of 1 bit. For example, when having received, as the code signal DN_C, a binary code "100" representing decimal "4", the code conversion circuit 616 generates "0 . . . 01111" as the code signal DN_CD. Specifically, the code conversion circuit 616 generates the code signal DN_CD in which "1" is set to the first bit to a bit of a number indicated by the code signal DN_C and "0" is set to the other bits. The code conversion circuit 616 outputs the generated code signal DN_CD to each delay element 615.

The first NAND gate of a delay element 615_γ receives any one of the clock FOUTB_EVN and the clock FOUTB_ODD at one input. Specifically, the clock FOUTB_EVN is received when γ is an even number, and the clock FOUTB_ODD is received when γ is an odd number. In addition, the first NAND gate receives a code signal DN_CDγ (value of the γ-th bit of the code signal DN_CD) at the other input. However, in the delay element 615_0, the first NAND gate is connected to the node of the power voltage Vcc at the other input.

The second NAND gate of the delay element 615_γ receives, at one input, a signal FOUTB_(γ+1) output from a delay element 615_(γ+1). The second NAND gate is connected to the node of the power voltage Vcc at the other input. However, the second NAND gate of the delay element 615_γ is grounded, that is, connected to the node of the ground voltage Vss at two inputs.

The third NAND gate of the delay element 615_γ receives an output from the first NAND gate and an output from the second NAND gate, and outputs a signal FOUTB_γ.

When the value of the code signal DN_CDγ input to the first NAND gate is "0(="L")", the delay element 615_γ outputs "0(="L")" as the signal FOUTB_γ. When the value of the code signal DN_CDγ input to the first NAND gate is "1(="H")" and the value of the code signal DN_CD(γ+1) is "0(="L")", the delay element 615_γ outputs, as the signal FOUTB_γ, a signal obtained by delaying the signal FOUTB_ODD or FOUTB_EVN input to the first NAND gate by a time period 1.0 Tw. When the value of the code signal DN_CDγ is "1(="H")" and the value of the code signal DN_CD(γ+1) is "1(="H")", the delay element 615_γ outputs, as the signal FOUTB_γ, a signal obtained by delaying the signal FOUTB (γ+1) input to the second NAND gate by a time period 1.0 Tw. A signal FOUTB_0 output from the delay element 615_0 is output as the output clock CDLY-OUT from the COARSE delay circuit 612.

The output clock CDLYOUT is logically inverted by an inverter and output as the delay clock CDLY_T from the delay block circuit 61.

The delay block circuit 62 has a configuration same as the above-described configuration of the delay block circuit 61. However, input and output signals are different from input and output signals of the delay block circuit 61. Specifically, although the delay block circuit 61 receives the input clock IN and the code signals DN_F and DN_C constituting the signal DCA_CODE and generates the delay clock CDLY_T, the delay block circuit 62 receives the input clock /IN and the code signals UP_F and UP_C constituting the signal DCA_CODE and generates the delay clock CDLY_B.

The waveform generation circuit 44 is a circuit configured to generate the output clock OUT that maintains high level for a duration from rising (rising edge) of the delay clock CDLY_T to rising (rising edge) of the delay clock CDLY_B. The waveform generation circuit 44 is configured as, for example, a 2-input-1-output multiplexer to which two signals of the delay clock CDLY_T and the delay clock CDLY_B are input and from which the output clock OUT is output (multiplexer configured to output a logical product of the delay clock CDLY_T and an inverted signal of the delay clock CDLY_B).

(1-3-4. Configuration of Waveform Generation Circuit)

Figure 10:
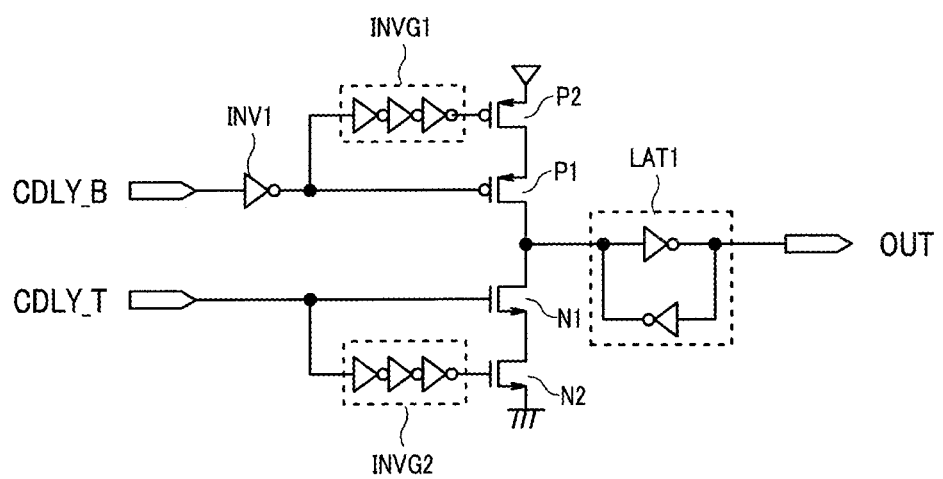
FIG. 10 is a circuit diagram illustrating an exemplary configuration of a waveform generation circuit.

FIG. 10 is a block diagram illustrating an exemplary configuration of the waveform generation circuit. The waveform generation circuit 44 of the embodiment includes an inverter INV1, inverter groups INVG1 and INVG2 in each of which a plurality of inverters are connected in series, PMOS transistors P1 and P2, NMOS transistors N1 and N2, and a latch circuit LAT1.

The PMOS transistors P2 and P1 and the NMOS transistors N1 and N2 are connected in series. A source of the PMOS transistor P2 is connected to the power voltage Vcc, and a source of the NMOS transistor N2 is connected to the ground voltage Vss. The delay clock CDLY_B is logically inverted through an inverter INV1 and input to a gate of the PMOS transistor P1 and the inverter group INVG1. An output from the inverter group INVG1 is input to a gate of the PMOS transistor P2. The delay clock CDLY_T is input to a gate of the NMOS transistor N1 and the inverter group INVG2. An output from the inverter group INVG2 is input to a gate of the NMOS transistor N2.

A connection point between a drain of the PMOS transistor P1 and a drain of the NMOS transistor N2 is connected to an input of the latch circuit LAT1. The latch circuit LAT1 has a positive-feedback configuration of two inverters.

When the delay clock CDLY_B input to the waveform generation circuit 44 switches from low level to high level, the PMOS transistors P1 and P2 are turned on and the power voltage Vcc is input to the latch circuit LAT1. When the delay clock CDLY_T input to the waveform generation circuit 44 switches from low level to high level, the NMOS transistors N1 and N2 are turned on and the ground voltage Vss is input to the latch circuit LAT1. Accordingly, a signal (=the output clock OUT) output from the latch circuit LAT1 is a clock signal that switches from low level to high level at the rising edge of the delay clock CDLY_T and switches from high level to low level at the rising edge of the delay clock CDLY_B.

The waveform generation circuit 44 outputs, as the output clock OUT, the signal output from the latch circuit LAT1. The waveform generation circuit 44 also generates and outputs a signal (output clock /OUT) obtained by logically inverting the output clock OUT. Note that the output clocks OUT and /OUT are output from the DCC circuit 20 and input to the DCD circuit 41. The output clock OUT is input as the input clock DCD_IN to the DCD circuit 41, and the output clock /OUT is input as the input clock /DCD_IN to the DCD circuit 41.

(2. Operation)

(2-1. Operation of DCC Circuit)

Figure 11:
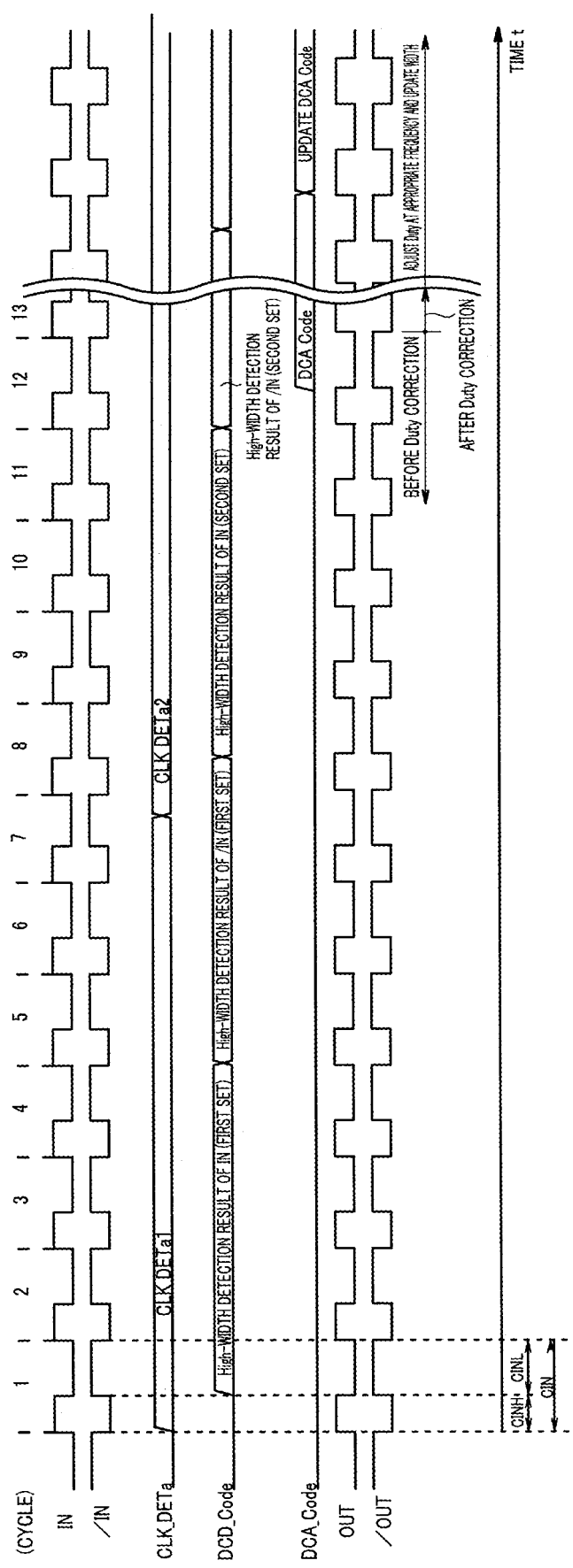
FIG. 11 is a timing chart for description of an example of operation of the DCC circuit.

FIG. 11 is a timing chart for description of an example of operation of each DCC circuit. As illustrated in FIG. 11, the input clock IN input to the DCC circuit 20 has a certain duty cycle. For example, the duty cycle is not 50%, but a high-level duration (duration CINH) is shorter than a low-level duration (duration CINL). The input clock IN has a period CIN and is at high level for the duration CINH and at low level for the duration CINL. In other words, the input clock IN has a relation of CIN=CINH+CINL and CINH<CINL.

Duty of the input clock IN input to the DCC circuit 20 is detected at the DCD circuit 41 through initial several cycles (for example, 12 cycles). A specific detection method will be described below. First, in the first cycle of the input clock DCD_IN, the selector 56 of the edge detection circuit 53 is set to select the signal CLK_DETa1 output from the delay element 551 and to output the selected signal CLK_DETa1 as the signal CLK_DETa. The DCD circuit 41 measures the pulse width (high-level duration) of the input clock DCD_IN in the first cycle, generates the signal DCD_CODE, and outputs the generated signal DCD_CODE to the calculation circuit 42. In addition, the DCD circuit 41 measures the pulse width of the input clock /DCD_IN in the fourth cycle, generates the signal DCD_CODE, and outputs the generated signal DCD_CODE to the calculation circuit 42.

In the seventh cycle of the input clock /DCD_IN, the selector 56 of the edge detection circuit 53 is switched to select the signal CLK_DETa2 output from the delay element 551 and to output the selected signal CLK_DETa2 as the signal CLK_DETa. The DCD circuit 41 measures the pulse width (high-level duration) of the input clock DCD_IN in the eighth cycle, generates the signal DCD_CODE, and outputs the generated signal DCD_CODE to the calculation circuit 42. In addition, the DCD circuit 41 measures the pulse width of the input clock /DCD_IN in the eleventh cycle, generates the signal DCD_CODE, and outputs the generated signal DCD_CODE to the calculation circuit 42.

In other words, each time the signal CLK_DETa to be output is switched at the selector 56, the duration in which the input clock DCD_IN is at high level and the duration in which the input clock /DCD_IN is at high level are measured, and the signal DCD_CODE is generated and output to the calculation circuit 42. When the measurement of the duration in which the input clock DCD_IN is at high level and the measurement of the duration in which the input clock /DCD_IN is at high level are defined to be one set, s sets of the measurements are executed.

Note that, in cycles before duty cycle correction of the input clocks IN and /IN, duty cycle of the output clocks OUT and /OUT is equal to duty cycle of the input clocks IN and /IN. Accordingly, duty cycle of the input clocks DCD_IN and /DCD_IN is equal to the duty cycle of the input clocks IN and /IN. Specifically, in each set, the signal DCD_CODE output from the DCC circuit 20 has a value generated based on a detection result of the pulse width of the input clock IN in the first cycle in a duration from falling of the input clock IN in the first cycle (=rising of the input clock /IN in the first cycle) to falling of the input clock /IN in the fourth cycle (=rising of the input clock IN in the fifth cycle), and has a value generated based on a detection result of the pulse width of the input clock /IN in the fourth cycle in a duration from falling of the input clock /IN in the fourth cycle (=rising of the input clock IN in the fifth cycle) to falling of the input clock IN in the eighth cycle (=rising of the input clock /IN in the eighth cycle).

Specifically, the signal DCD_CODE is output from the DCC circuit 20 in order of "the duration in which the input clock DCD_IN is at high level (=the duration in which the input clock DCD_IN is at high level in the first set), which is measured by using the signal CLK_DETa1", "the duration in which the input clock /DCD_IN is at high level (=the duration in which the input clock /DCD_IN is at high level in the first set), which is measured by using the signal CLK_DETa1", "the duration in which the input clock DCD_IN is at high level (=the duration in which the input clock DCD_IN is at high level in the second set), which is measured by using the signal CLK_DETa2", and "the duration in which the input clock /DCD_IN is at high level (=the duration in which the input clock /DCD_IN is at high level in the second set), which is measured by using the signal CLK_DETa2".

When having received, through the signal DCD_CODE, a detection result of the pulse width of the input clock IN, which is measured by using the signal CLK_DETa1, and a detection result of the pulse width of the input clock IN, which is measured by using the signal CLK_DETa2, the calculation circuit 42 calculates the pulse width of the input clock IN by using the detection results. When having received, through the signal DCD_CODE, a detection result of the pulse width of the input clock /IN, which is measured by using the signal CLK_DETa1, and a detection result of the pulse width of the input clock /IN, which is measured by using the signal CLK_DETa2, the calculation circuit 42 calculates the pulse width of the input clock /IN by using the detection results. Subsequently, the calculated pulse width of the input clock IN and the calculated pulse width of the input clock /IN are compared with each other. Then, the signal DCA_CODE is generated based on a result of the comparison. For example, as described above, when having received a detection result of the pulse width of the input clock /IN, which is measured by using the signal CLK_DETa2, from rising of the input clock IN in the twelfth cycle, the calculation circuit 42 generates and outputs the signal DCA_CODE in the twelfth cycle of the input clock IN.

Then, the duty cycle of the input clocks IN and /IN is corrected based on the signal DCA_CODE at the DCA circuit 43 and the waveform generation circuit 44 and the corrected signals are output as the output clocks OUT and /OUT from the DCC circuit 20. Note that, in cycles (the first to twelfth cycles) before the signal DCA_CODE is generated, the input clocks IN and /IN are not corrected and output as the output clocks OUT and /OUT. The duty cycle of the input clock IN is corrected based on the signal DCA_CODE received in the twelfth cycle of the input clock IN. Then, in the thirteenth cycle of the output clock OUT or later, a corrected clock signal is output from the DCC circuit 20.

The output clocks OUT and /OUT are fed back to the DCD circuit 41 as the input clocks DCD_IN and /DCD_IN, respectively. The DCD circuit 41 measures the pulse width of the input clock DCD_IN and the pulse width of the input clock /DCD_IN and updates the signal DCD_CODE at a set appropriate interval. When the signal DCD_CODE is updated, the calculation circuit 42 updates the signal DCA_CODE. Then, the duty cycle of the input clocks IN and /IN is corrected based on the updated signal DCA_CODE at the DCA circuit 43 and the waveform generation circuit 44, and the corrected signals are output as the output clocks OUT and /OUT from the DCC circuit 20.

In this manner, according to the present embodiment, even after correction of the duty cycle of the input clocks IN and /IN, the output clocks OUT and /OUT are fed back to the DCD circuit 41 to continue monitoring and continue updating the signal DCD_CODE. Accordingly, when the duty cycle of the input clocks IN and /IN is changed due to variation in temperature and voltage during operation of the semiconductor storage device 2, it is possible to follow the variation in temperature and voltage and appropriately correct the duty cycle. Moreover, when error temporarily occurs due to disturbance such as noise at detection of the signal DCD_CODE, it is possible to increase the number of times of detection of the signal DCD_CODE by continuously detecting the signal DCD_CODE, thereby averaging the error to reduce influence. Furthermore, it is possible to eliminate error due to characteristic difference between the delay element $521\_\alpha$ provided in the DCD circuit 41 and the delay element $615\_\gamma$ provided in the DCA circuit 43.

(2-1-1. Operation of DCD Circuit)

Figure 12:
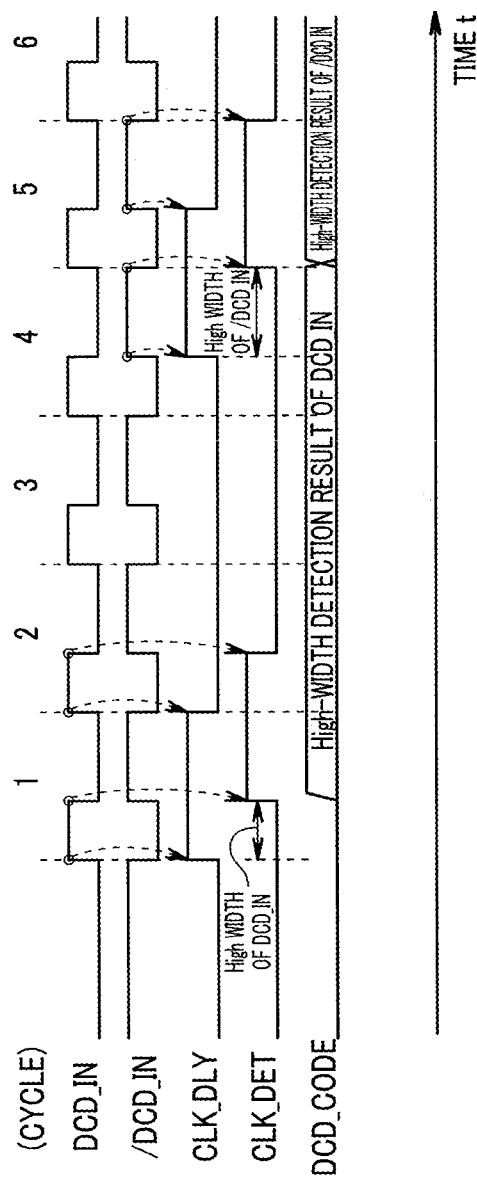
FIG. 12 is a timing chart for description of an example of operation of the DCD circuit.
Figure 13A:
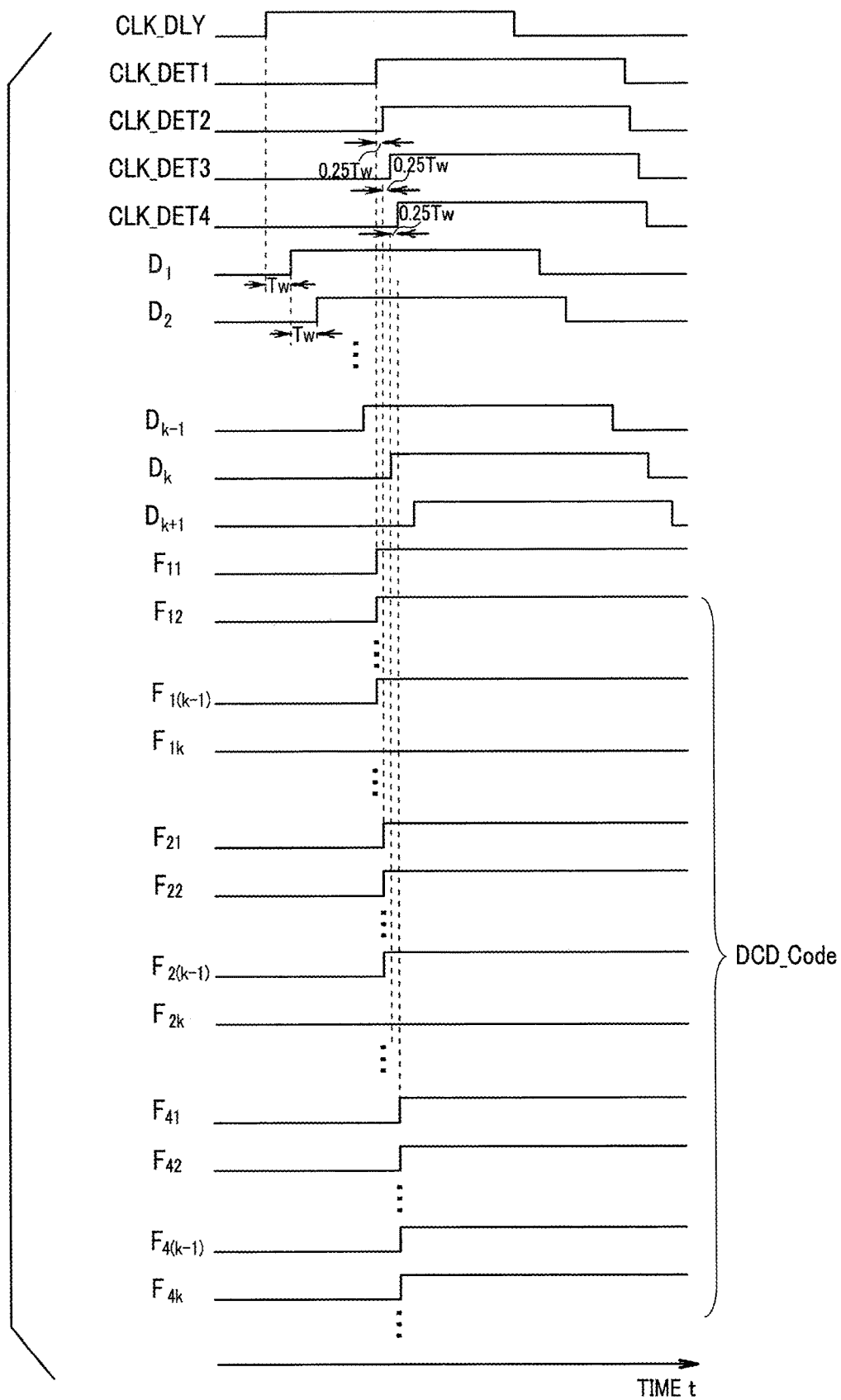
FIG. 13A is a timing chart for description of another example of operation of the DCD circuit.
Figure 13B:
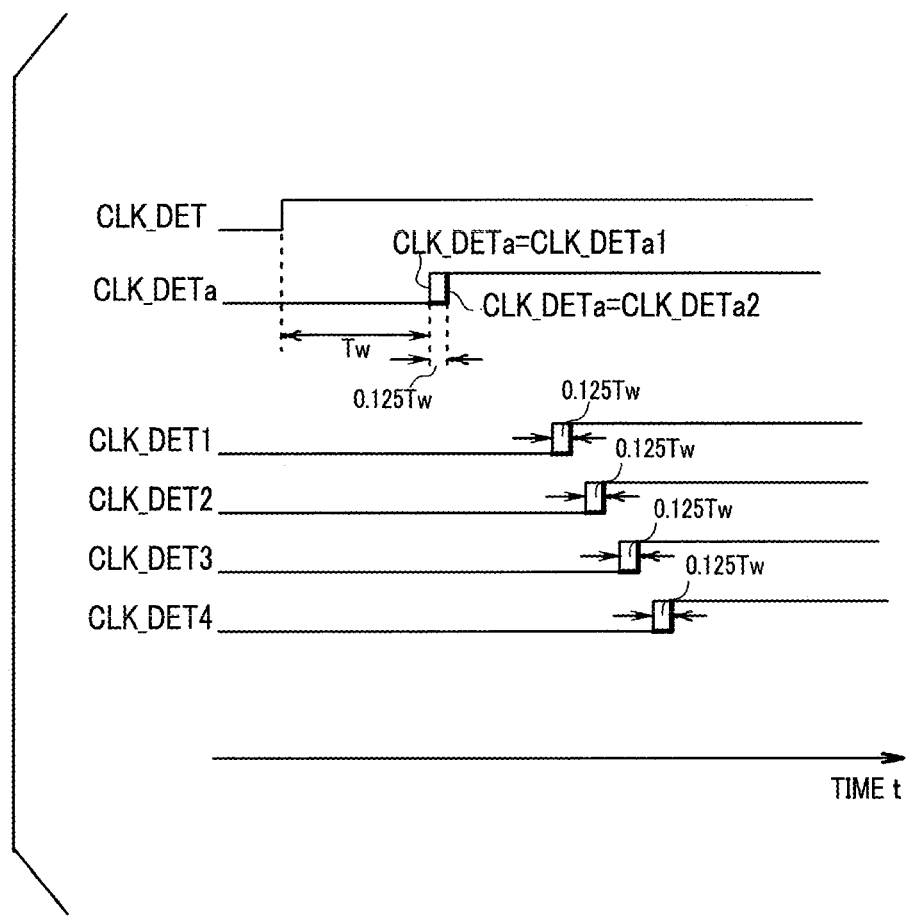
FIG. 13B is a timing chart for description of still another example of operation of the DCD circuit.

FIGS. 12, 13A, and 13B are each a timing chart for description of an example of operation of each DCD circuit. The input clocks DCD_IN and /DCD_IN are input to each DCD circuit 41. In each set, the signal generation circuit 51 detects rising of the input clock DCD_IN in the first cycle and maintains the signal CLK_DLY at high level for a duration equal to a duration from the rising to rising of the input clock DCD_IN in a next cycle. In addition, in each set, the signal generation circuit 51 detects rising of the input clock /DCD_IN in the fourth cycle (=falling of the input clock DCD_IN in the fourth cycle) and maintains the signal CLK_DLY at high level for a duration equal to a duration from the rising to rising of an input clock /DCD_IN in a next cycle.

Specifically, in the first set, the signal generation circuit 51 detects rising of the input clock DCD_IN in the first cycle and maintains the signal CLK_DLY at high level for a duration equal to the duration from the rising to rising of the input clock DCD_IN in the next cycle. In addition, the signal generation circuit 51 detects rising of the input clock /DCD_IN in the fourth cycle (=falling of the input clock DCD_IN in the fourth cycle) and maintains the signal CLK_DLY at high level for a duration equal to the duration from the rising to rising of the input clock /DCD_IN in the next cycle.

Moreover, the signal generation circuit 51 detects rising of the eighth cycle, which is the first cycle after the selector 56 of the edge detection circuit 53 is switched and a signal output as the signal CLK_DETa is changed, that is, after switching to the second set, and maintains the signal CLK_DLY at high level for a duration equal to the duration from the rising to rising of the input clock DCD_IN in the next cycle. In addition, the signal generation circuit 51 detects rising of the input clock /DCD_IN in the fourth cycle in the second set, that is, the input clock /DCD_IN in the eleventh cycle (=falling of the input clock DCD_IN in the eleventh cycle), and maintains the signal CLK_DLY at high level for a duration equal to the duration from the rising to rising of the input clock /DCD_IN in next cycle.

In each set, the signal generation circuit 51 detects falling of the input clock DCD_IN in the first cycle and maintains the signal CLK_DET at high level for a duration equal to a duration from the falling to falling of the input clock DCD_IN in the next cycle. In addition, the signal generation circuit 51 detects falling of the input clock /DCD_IN in the fourth cycle (=rising of the input clock DCD_IN in the fifth cycle) and maintains the signal CLK_DET at high level for a duration equal to a duration from the falling to falling of the input clock /DCD_IN in the next cycle.

Specifically, in the first set, the signal generation circuit 51 detects falling of the input clock DCD_IN in the first cycle and maintains the signal CLK_DET at high level for a duration equal to the duration from the falling to falling of the input clock DCD_IN in the next cycle. In addition, the signal generation circuit 51 detects falling of the input clock /DCD_IN in the fourth cycle (=rising of the input clock DCD_IN in the fifth cycle) and maintains the signal CLK_DET at high level for a duration equal to the duration from the falling to falling of the input clock /DCD_IN in the next cycle.

Moreover, the signal generation circuit 51 detects falling of the input clock DCD_IN in the first cycle (=the eighth cycle), which is the first cycle after the selector 56 of the edge detection circuit 53 is switched and a signal output as the signal CLK_DETa is changed, that is, after switching to the second set, and maintains the signal CLK_DET at high level for a duration equal to the duration from the falling to falling of the input clock DCD_IN in the next cycle. In addition, the signal generation circuit 51 detects falling (=rising of the input clock DCD_IN in the twelfth cycle) of the input clock /DCD_IN in the eleventh cycle, which is the fourth cycle of the input clock /DCD_IN in the second set, and maintains the signal CLK_DET at high level for a duration equal to the duration from the falling to falling of the input clock /DCD_IN in the next cycle.

Note that the signal generation circuit 51 repeats the above-described operation for the signals CLK_DLY and CLK_DET at each determined timing or at each request of duty cycle adjustment. Specifically, the high-level duration of the signal CLK_DLY in each odd-numbered cycle has a length equal to one cycle of an input clock CLK_IN, and the high-level duration of the signal CLK_DLY in each even-numbered cycle has a length equal to one cycle of an input clock /CLK_IN. The high-level duration of the signal CLK_DET in each odd-numbered cycle has a length equal to one cycle of the input clock CLK_IN, and the high-level duration of the signal CLK_DET in each even-numbered cycle has a length equal to one cycle of the input clock /CLK_IN.

For the signals CLK_DLY and CLK_DET generated as described above, a duration from rising of the signal CLK_DLY in each odd-numbered cycle to rising of the signal CLK_DET is equal to the pulse width of the input clock DCD_IN. A duration from rising of the signal CLK_DLY in each even-numbered cycle to rising of the signal CLK_DET is equal to the pulse width of the input clock /DCD_IN.

The delay element array circuit 52 sets the signal D0 to be the signal CLK_DLY received from the signal generation circuit 51, generates the signal Dα at each delay element 521_α based on the signal D0, and outputs the signal Dα. Specifically, the delay element 521_α outputs, as the signal Dα, a signal obtained by delaying the signal D(α−1) by the time period Tw. Accordingly, the signals D1 to Dn each delayed by the time period Tw in ascending order of a value of aα are obtained. FIG. 13A illustrates some of the signals D1 to D(k+1) (k is a natural number equal to or smaller than n⊖1).

A signal obtained by delaying the clock signal CLK_DETa by a time period $\{1.0+(\beta-1)/m\} \times Tw$ is supplied as a clock signal DLK_DETβ to the delay line 53β of the edge detection circuit 53.

For example, when the edge detection circuit 53 is provided with four delay lines (m=4) as illustrated in FIG. 6, a signal (clock signal CLK_DET1) obtained by delaying the clock signal CLK_DETa by a time period 1.0 Tw is supplied to the delay line 531. Similarly, a signal (clock signal CLK_DET2) obtained by delaying the clock signal CLK_DET by a time period 1.25 Tw is supplied to the delay line 532, and a signal (clock signal CLK_DET3) obtained by delaying the clock signal CLK_DET by a time period 1.5 Tw is supplied to the delay line 533. In addition, a signal (clock signal CLK_DET4) obtained by delaying the clock signal CLK_DET by a time period 1.75 Tw is supplied to the delay line 534.

The flip-flop 53β_α provided at the delay line 53 latches the signal Dα in response to transition of the clock signal CLK_DETβ to high level and outputs the latched signal Dα as the signal Fβα.

For example, at the delay line 531, when the signals D1 to D(k−1) are at high level and the signals Dk to Dn are at low level at a timing of switching of the clock signal CLK_DET1 to high level as illustrated in FIG. 13A, high-level signals are output as the signals F11 to F1(k−1) from the flip-flops 531_1 to 531_(k−1) and low-level signals are output as the signals F1k to F1n from the flip-flops 531_k to 531_n.

At the delay line 532, when the signals D1 to D(k−1) are at high level and the signals Dk to Dn are at low level at a timing of switching of the clock signal CLK_DET2 to high level, high-level signals are output as the signals F21 to F2(k−1) from the flip-flops 532_1 to 532_(k−1) and low-level signals are output as the signals F2k to F2n from the flip-flops 532_k to 532_n.

At the delay line 533, when the signals D1 to D(k−1) are at high level and the signals Dk to Dn are at low level at a timing of switching of the clock signal CLK_DET3 to high level, although not illustrated, high-level signals are output as the signals F31 to F3(k−1) from the flip-flops 533_1 to 533 (k−1) and low-level signals are output as the signals F3k to F3n from the flip-flops 533_k to 533_n.

At the delay line 534, when the signals D1 to Dk are at high level and the signals D(k+1) to Dn are at low level at a timing of switching of the clock signal CLK_DET4 to high level, high-level signals are output as the signals F41 to F4k from the flip-flops 5343_1 to 534_k. Low-level signals are output as the signals F4(k+1) to F4n from the flip-flops 534 (k+1) to 534_n, although not illustrated.

Each signal Fβα output from the corresponding delay line 53β is output as the signal DCD_CODE.

As illustrated in FIG. 13B, the clock signal CLK_DETa (=the clock signal CLK_DETa2) in the second set is delayed by $\{1/(m \times s)\} \times Tw$ from the clock signal CLK_DETa (clock signal CLK_DETa1) in the first set. Thus, the clock signal DLK_DETβ in the second set is delayed by $\{1/(m \times s)\} \times Tw$ from the clock signal DLK_DETβ in the first set. For example, in a case of n=8 and k=5, the signals Fβα obtained for the clock signal CLK_DETa (clock signal CLK_DETa1) in the first set in accordance with a timing chart illustrated in FIG. 13A are as follows. Specifically, signals of 8 bits×4=32 bits, namely, "00001111" of the signals F1n to F11, "00001111" of the signals F2n to 21, "00001111" of the signals F3n to F31, and "00011111" of the signals F4n to F41 are obtained. The edge detection circuit 53 generates the signal DCD_CODE of 32 bits (=n×m bits) by sequentially arranging the signals Fβα and outputs the generated signal DCD_CODE. For example, the signal DCD_CODE is "00001111000011110000111100011111" in the above-described case.

The signal Fβα obtained for the clock signal CLK_DETa (clock signal CLK_DETa2) in the second set in accordance with the timing chart illustrated in FIG. 13A is as follows. Specifically, signals of 8 bits×4=32 bits, namely, "00001111" of the signals F1n to F11, "00001111" of the signals F2n to 21, "00011111" of the signals F3n to F31, and "00011111" of the signals F4n to F41 are obtained. Accordingly, the signal F34 is changed from "0" to "1" since the clock signal CLK_DETa in the second set is delayed by {1/(m×s)}×Tw from the clock signal CLK_DETa in the first set. The edge detection circuit 53 generates the signal DCD_CODE of 32 bits (=n×m bits) by sequentially arranging the signal Fβα and outputs the generated signal DCD_CODE. For example, the signal DCD_CODE is "00001111000011110001111100011111" in the above-described case.

(2-1-2. Operation of Calculation Circuit)

The calculation circuit 42 counts the number (iδ) of high-level bits of the signal DCD_CODE received from the DCD circuit 41 in the first cycle of the clock signal CLK_DET in each set. For example, the number of high-level bits is counted as "i1=17" when the signal DCD_CODE in the first set is "00001111000011110000111100011111". The number of high-level bits is counted as "i2=18" when the signal DCD_CODE in the second set is "00001111000011110001111100011111".

The calculation circuit 42 counts the number (jδ) of high-level bits of the signal DCD_CODE received from the DCD circuit 41 in the next cycle of the clock signal CLK_DET in each set. For example, the number of high-level bits is counted as "j1=31" when the signal DCD_CODE in the first set is "01111111111111111111111111111111". The number of high-level bits is counted as "j2=31" when the signal DCD_CODE in the second set is "01111111111111111111111111111111".

A number i expresses the pulse width of the input clock IN (the high-level duration). Specifically, the product of a value obtained by dividing an average value of the number ik in each set by m and the delay time period Tw expresses the high-level width of the input clock IN. For example, in a case of s=2, m=4, i1=17, and i2=18, the high-level width of the input clock IN is {(17+18)/2}/4×Tw=4.375 Tw.

A number j expresses the pulse width (high-level duration) of the input clock /IN. Specifically, the product of a value obtained by dividing an average value of the number jk in each set by m and the delay time period Tw expresses the high-level width of the input clock /IN. The high-level width of the input clock /IN is equal to the low-level width of the input clock IN. Accordingly, the number j expresses the low-level width of the input clock IN. For example, in a case of s=2, m=4, j1=31, and j2=31, the low-level width of the input clock IN is {(31+31)/2}/4×Tw=7.75 Tw.

Figure 14:
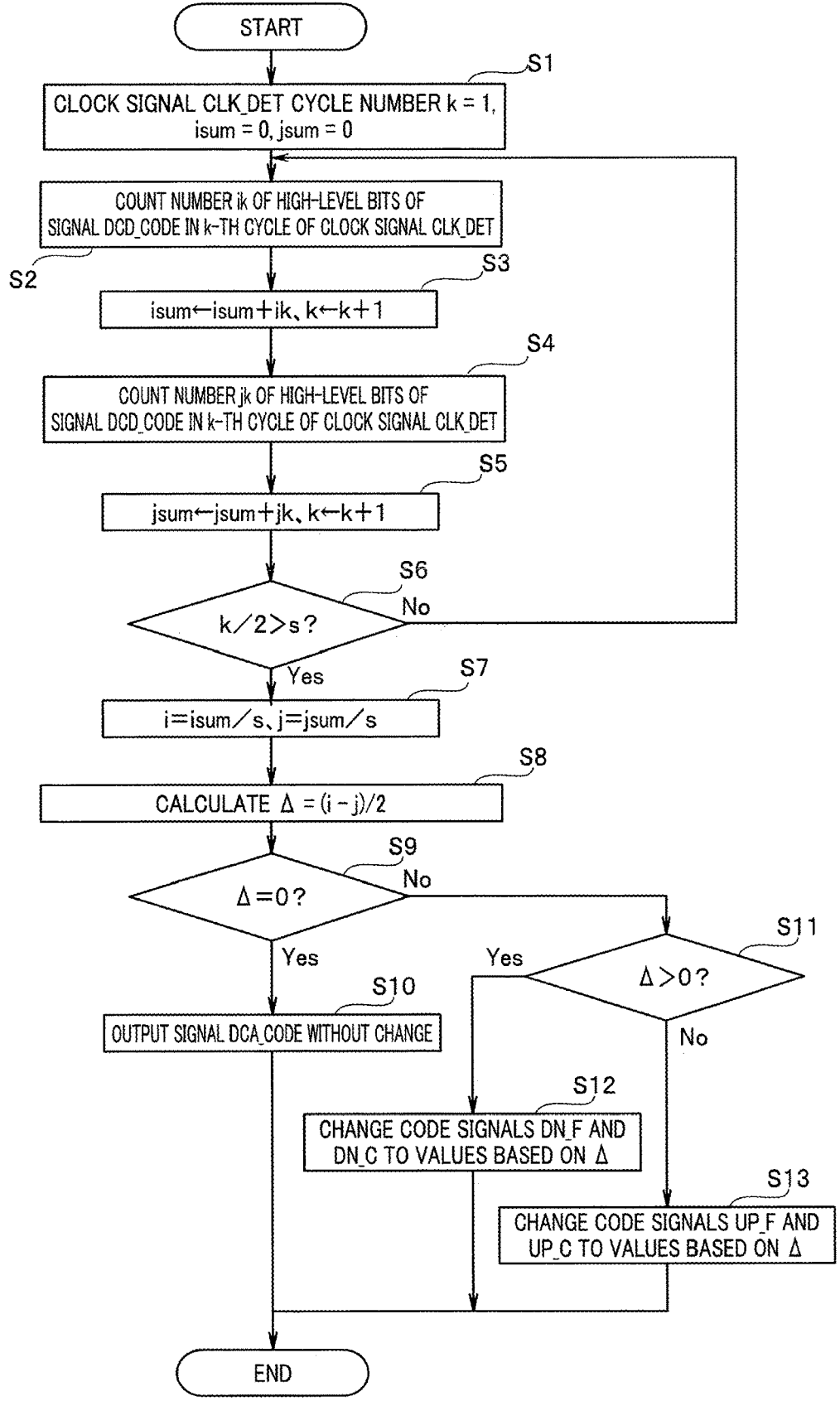
FIG. 14 is a flowchart for description of operation of a calculation circuit.

FIG. 14 is a flowchart for description of operation of the calculation circuit. First, the calculation circuit 42 initializes various variables to be used to calculate the numbers i and j (S1). Specifically, "1" is set to a variable k representing a cycle number of the clock signal CLK_DET, "0" is set to a variable isum that stores a cumulated value of the number ik, and "0" is set to a variable jsum that stores a cumulated value of the number jk. In the first cycle of the clock signal CLK_DET, the calculation circuit 42 counts the number of high-level bits of the signal DCD_CODE and acquires the number ik as a result of the counting (S2). The calculation circuit 42 adds the number ik acquired at S2 to the cumulated value isum of the number ik and increments the cycle number k by one (S3), and then, in the next cycle of the clock signal CLK_DET, counts the number of high-level bits of the signal DCD_CODE and acquires the number jk as a result of the counting (S4). The calculation circuit 42 adds the number jk acquired at S4 to the cumulated value j_sum of the number jk and increments the cycle number k by one (S5), and then determines whether the acquisition is completed in a scheduled number of sets for the pulse width of the input clock DCD_IN and the pulse width of the input clock /DCD_IN (S6). Specifically, it is determined whether a number obtained by dividing the cycle number k of the clock signal CLK_DET to be acquired next by two is larger than a set number (s) of sets.

When the number obtained by dividing the cycle number k by two is equal to or smaller than the set number (s) of sets (No at S6), the calculation circuit 42 returns to S2 and repeats procedures at S2 to S5 and acquires data of two cycles in a next set (the numbers i and j as the number of high-level bits of the signal DCD_CODE).

Figure 15:
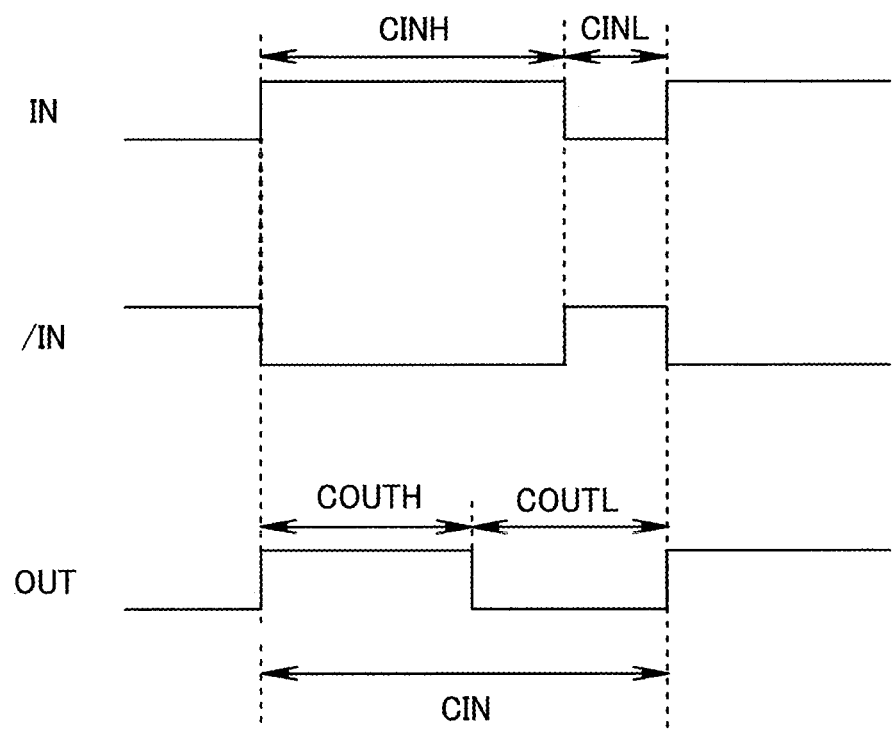
FIG. 15 is a waveform diagram illustrating an example of input and output clocks of the DCC circuit.

When the number obtained by dividing the cycle number k by two is larger than the set number (s) of sets (Yes at S6), the number i as the average value of the number ik and the number j as the average value of the number jk are calculated by dividing the cumulated value isum of the number i and the cumulated value jsum of the number j, respectively, by the number s of sets (S7). The calculation circuit 42 calculates $\Delta=(i-j)/2$ by using the numbers i and j acquired at S7 (S8). FIG. 15 is a waveform diagram illustrating an example of input and output clocks of the DCC circuit. As described above and illustrated in FIG. 15, the number i indicates the duration in which the input clock IN is at high level, and the number j indicates the duration in which the input clock IN is at low level. Accordingly, a difference i−j is a difference between the high-level and low-level durations of the input clock IN. In addition, Δ is equal to a difference between a high-level (or low-level) duration TOUTH of a target output clock OUT having a period CIN equal to the period CIN of the input clock IN and having a duty cycle ratio of 50% and the high-level duration CINH (or the low-level duration CINL) of the input clock IN. Note that FIG. 15 illustrates an example in which i and j are different from each other.

As illustrated in FIG. 14, the calculation circuit 42 determines whether Δ is zero (S9). When Δ is zero (Yes at S9), the calculation circuit 42 outputs the signal DCA_CODE without change (S10). The signal DCA_CODE is constituted by the code signals DN_F and DN_C and the code signals UP_F and UP_C. The code signals DN_F and DN_C are signals that set a delay amount of falling of the input clock IN, and the code signals UP_F and UP_C are signals that set a delay amount of rising of the input clock IN. The code signal DN_F is a signal of (m×s+1) bits and instructs delay of falling of the input clock IN at a resolution equal to or shorter than a time period 1.0 Tw (specifically, time unit of {1.0/(m×s)}Tw). The code signal DN_C is a signal of 1 bit and instructs delay of falling of the input clock IN in the time unit of 1.0 Tw. The code signal UP_F is a signal of (m×s+1) bits and instructs delay of rising of the input clock IN at a resolution equal to or shorter than a time period 1.0 Tw (specifically, time unit of {1.0/(m×s)}Tw). The code signal UP_C is a signal of 1 bit and instructs delay of rising of the input clock IN in the time unit of 1.0 Tw. All bits of the code signals DN_F and DN_C and the code signals UP_F and UP_C are set to "0" (setting that instructs delay of a minimum delay time period Tf at the FINE delay circuits 611) in a default state.

In the present embodiment, delay amount adjustment of the signal DCD_IN (=the output clock OUT) is repeated at the DCC circuit 20. In the second or later delay amount adjustment, when a delay amount is already set to the signal DCA_CODE (when "1" is set to one or more bits in any of the code signals DN_F and DN_C and the code signals UP_F and UP_C), the calculation circuit 42 outputs the signal DCA_CODE without returning the signal DCA_CODE to the default state at S10.

When Δ is not zero (No at S9), the calculation circuit 42 determines whether Δ is a positive number (Δ>0) (S11). When Δ is a positive number (Yes at S11), the calculation circuit 42 changes the code signals DN_F and DN_C to values based on Δ (S12). Specifically, the code signals DN_F and DN_C are set to values that instruct delay of rising of the input clock IN by a duration expressed by Δ. Then, the calculation circuit 42 outputs the signal DCA_CODE constituted by the code signals DN_F and DN_C thus changed and the code signals UP_F and UP_C unchanged.

When Δ is not a positive number (Δ<0) (No at S11), the calculation circuit 42 changes the code signals UP_F and UP_C to values based on Δ (S13). Specifically, the code signals UP_F and UP_C are set to values that instruct delay of falling of the input clock IN by a duration expressed by Δ. Then, the calculation circuit 42 outputs the signal DCA_CODE constituted by the code signals UP_F and UP_C thus changed and the code signals DN_F and DN_C unchanged.

Note that although not illustrated in FIG. 14, adjustment that decreases the values of UP_F and UP_C may be performed in the second or later delay amount adjustment when delay is already set to UP_F and UP_C in a case of Δ>0.

FIG. 16 illustrates an example of the value of the code signal DN_F. FIG. 17 illustrates an example of the value of the code signal DN_C. Note that FIG. 16 corresponds to an example of s=2 and m=4, and FIG. 17 corresponds to an example of l=7. As illustrated in FIG. 16, the code signal DN_F is constituted by four-figure bits. Values of the bits of the code signal DN_F instruct delay of rising of the input clock IN input to the FINE delay circuit 611 of the delay block circuit 61 by a time (u×Tw) as the product of a unit delay time period (0.125 Tw in a case of s=2 and m=4) at the FINE delay circuit 611 and a value u obtained by expressing the value of the code signal in decimal.

For example, the value "0000" of the code signal DN_F is a value that instructs delay of rising of the input clock IN input to the FINE delay circuit 611 of the delay block circuit 61 by 0.000 Tw relative to the minimum delay time period Tf. The value "0001" of the code signal DN_F is a value that instructs delay of rising of the input clock IN by 0.125 Tw relative to the minimum delay time period Tf at the FINE delay circuit 611 of the delay block circuit 61. Similarly, the value "0010", "0011", or "0100" of the code signal DN_F is a value that instructs delay of rising of the input clock IN input to the FINE delay circuit 611 of the delay block circuit 61 by 0.250 Tw, 0.375 Tw, or 0.500 Tw, respectively, relative to the minimum delay time period Tf. In addition, the value "0101", "0110", "0111", or "1000" of the code signal DN_F is a value that instructs delay of rising of the input clock IN input to the FINE delay circuit 611 of the delay block circuit 61 by 0.625 Tw, 0.750 Tw, 0.875 Tw, or 1.000 Tw, respectively, relative to the minimum delay time period Tf.

As illustrated in FIG. 17, the code signal DN_C is constituted by three-figure bits. Values of the bits of the code signal DN_C instruct delay of rising of clock signals (the clocks FOUTB_EVN and FOUTB_ODD) input to the COARSE delay circuit 612 by a time (v×Tw) as the product of a unit delay time period (=1 Tw) at the COARSE delay circuit 612 and a value v obtained by expressing the value of the code signal in decimal.

For example, the value "000" of the code signal DN_C is a value that instructs delay of rising of each clock signal input to the COARSE delay circuit 612 of the delay block circuit 61 by 0 Tw. The value "001" of the code signal DN_C is a value that instructs delay of rising of each clock signal input to the COARSE delay circuit 612 of the delay block circuit 61 by 1 Tw. Similarly, the value "010", "011", "100", "101", "110", or "111" of the code signal DN_C is a value that instructs delay of rising of each clock signal input to the COARSE delay circuit 612 of the delay block circuit 61 by 2 Tw, 3 Tw, 4 Tw, 5 Tw, 6 Tw, or 7 Tw, respectively.

The code signal UP_F is constituted by bits in the same number of figures as the number of bit figures of the code signal DN_F. Values of the bits of the code signal UP_F instruct delay of rising of the input clock /IN input to a FINE delay circuit of the delay block circuit 62 by a time (u×Tw) as the product of a unit delay time period (0.125 Tw in a case of s=2 and m=4) at the FINE delay circuit of the delay block circuit 62 and a value u obtained by expressing the value of the code signal in decimal.

For example, the value "0000" of the code signal UP_F is a value that instructs delay of rising of the input clock /IN input to the FINE delay circuit of the delay block circuit 62 by 0.000 Tw relative to the minimum delay time period Tf. The value "0001" of the code signal UP_F is a value that instructs delay of rising of the input clock /IN by 0.125 Tw relative to the minimum delay time period Tf at the FINE delay circuit of the delay block circuit 62. Similarly, the value "0010", "0011", or "0100" of the code signal UP_F is a value that instructs delay of rising of the input clock /IN input to the FINE delay circuit of the delay block circuit 62 by 0.250 Tw, 0.375 Tw, or 0.500 Tw, respectively, relative to the minimum delay time period Tf. In addition, the value "0101", "0110", "0111", or "1000" of the code signal UP_F is a value that instructs delay of rising of the input clock IN input to the FINE delay circuit of the delay block circuit 62 by 0.625 Tw, 0.750 Tw, 0.875 Tw, or 1.000 Tw, respectively, relative to the minimum delay time period Tf.

The code signal UP_C is constituted by bits in the same number of figures as the number of bit figures of the code signal DN_C. Values of the bits of the code signal UP_C instruct delay of rising of clock signals (the clocks FOUTB_EVN and FOUTB_ODD) input to the COARSE delay circuit by a time (v×Tw) as the product of a unit delay time period (=1 Tw) at the COARSE delay circuit and a value v obtained by expressing the value of the code signal in decimal. Specifically, the value "000", "001", "010", "011", "100", "101", "110", or "111" of the code signal UP_C is a value that instructs delay of rising of each clock signal input to a COARSE delay circuit of the delay block circuit 62 by 0 Tw, 1 Tw, 2 Tw, 3 Tw, 4 Tw, 5 Tw, 6 Tw, or 7 Tw, respectively.

A method of setting the signal DCA_CODE from Δ will be described below. First, an absolute value of a value obtained by multiplying Δ by s is divided by (m×s) to calculate a quotient (q) and a remainder (r). Then, in a case of Δ>0, the code signal UP_C is set from the value q, and the code signal UP_F is set from the value r. In a case of Δ<0, the code signal DN_C is set from the value q, and the code signal DN_F is set from the value r. For example, since Δ×s=15 and 15/(4×2)=1 remainder 7 in a case of s=2, m=4, and Δ=7.5, the code signal UP_C is set to a binary code "001", which represents decimal "1", and the code signal UP_F is set to a binary code "0111", which represents decimal "7". In addition, for example, since |(-9)×2|=18 and 18/(4×2)=2 remainder 2 in a case of s=2, m=4, and Δ=-9, the code signal DN_C is set to a binary code "010", which represents decimal "2", and the code signal DN_F is set to a binary code "0010", which represents decimal "2".

Note that since the values of i and j have a resolution of 0.125 Tw, Δ calculated as Δ=(i-j)/2 can have a resolution of 0.0625 Tw. In this case, the bits of DN_F and UP_F can be increased to produce the FINE delay circuit that achieves 2×(m×s)+1 combinations, thereby allowing adjustment at a resolution of 0.0625 Tw.

(2-1-3. Operation of DCA Circuit)

The DCA circuit 43 receives the signal DCA_CODE output from the calculation circuit 42 and generates the code signals DN_FD and DN_CD and code signals UP_FD and UP_CD. Specifically, the delay block circuit 61 receives the code signals DN_F and DN_C and sets the code signals DN_FD and DN_CD. In addition, the delay block circuit 62 receives the code signals UP_F and UP_C and sets UP_FD and UP_CD. Description below will be first made on code setting at the delay block circuit 61.

Setting of the code signal DN_FD at the code control circuit 613 will be described below with reference to FIG. 18. FIG. 18 illustrates an example of values of the code signal DN_FD. Note that FIG. 18 corresponds to an example of s=2 and m=4. As illustrated in FIG. 18, the code signal DN_FD is constituted by eight-figure bits. The code signal DN_FD is expressed in a thermometer code. When the code signal DN_C is an even number (0, 2, 4, . . . ), the code signal DN_FD is set as follows in accordance with the value of the code signal DN_F. Specifically, when the code signal DN_F is "0000", the code signal DN_FD is set to "00000000". When the code signal DN_F is "0001", the code signal DN_FD is set to "00000001". Similarly, when the code signal DN_F is "0010", "0011", "0100", "0101", "0110", "0111", or "1000", the code signal DN_FD is set to "00000011", "00000111", "00001111", "00011111", "00111111", "01111111", or "11111111", respectively.

When the code signal DN_C is an odd number (1, 3, 5, . . . ), the code signal DN_FD is set as follows in accordance with the value of the code signal DN_F. Specifically, when the code signal DN_F is "0000", the code signal DN_FD is set to "11111111". When the code signal DN_F is "0001", the code signal DN_FD is set to "01111111". Similarly, when the code signal DN_F is "0010", "0011", "0100", "0101", "0110", "0111", or "1000", the code signal DN_FD is set to "00111111", "00011111", "00001111", "00000111", "00000011", "00000001", or "00000000", respectively.

Subsequently, setting of the code signal DN_CD at the code conversion circuit 616 of the COARSE delay circuit 612 will be described below with reference to FIG. 19. FIG. 19 illustrates an example of values of the code signal DN_CD. Note that FIG. 19 corresponds to an example of l=7. As illustrated in FIG. 19, the code signal DN_CD is constituted by seven-figure bits. The code signal DN_CD is set to a value obtained by converting a decimal value expressed by the code signal DN_C as a binary code into a thermometer code. Specifically, when the code signal DN_C is "000", the code signal DN_CD is set to "0000000". When the code signal DN_C is "001", the code signal DN_CD is set to "0000001". Similarly, when the code signal DN_C is "010", "011", "100", "101", "110", or "111", the code signal DN_CD is set to "0000011", "0000111", "0001111", "0011111", "0111111", or "1111111", respectively.

Similarly to the delay block circuit 61, the delay block circuit 62 receives the code signals UP_F and UP_C and sets UP_FD and UP_CD. Specifically, the code signals UP_FD and UP_CD are set at the delay block circuit 62 as described above with the code signals DN_F, DN_C, and DN_FD, DN_CD replaced with the code signals UP_F, UP_C, UP_FD, and UP_CD, respectively.

Figure 20:
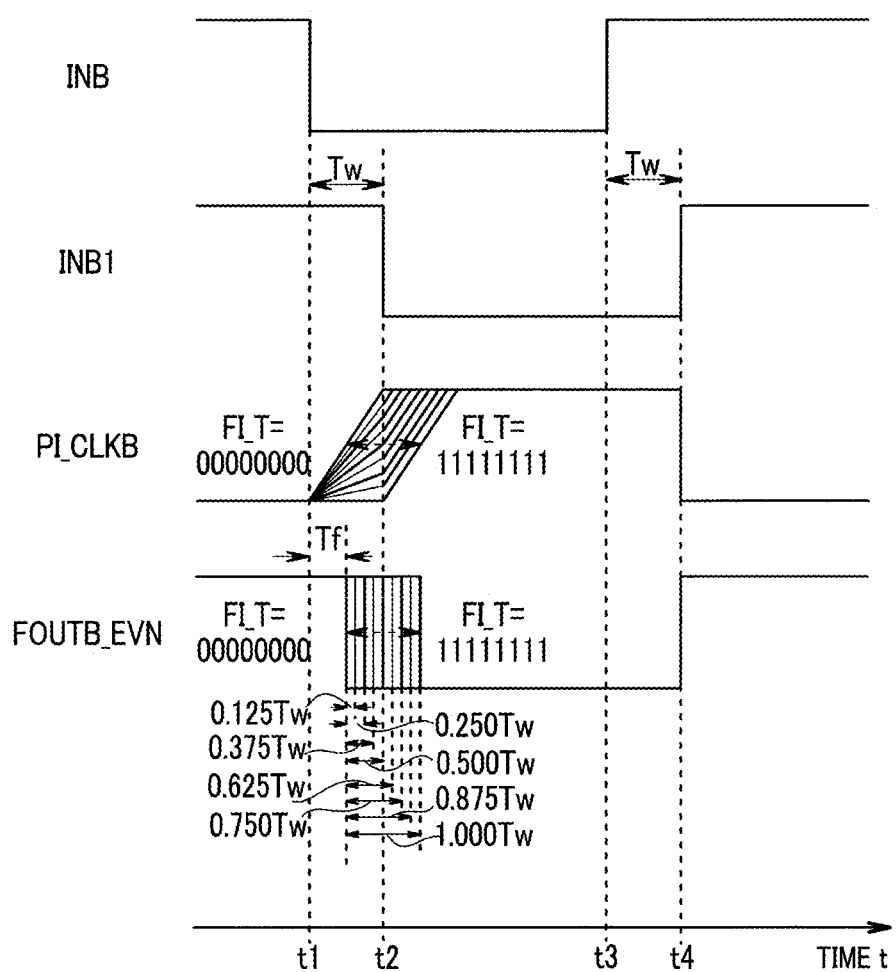
FIG. 20 is a timing chart for description of operation at the FINE delay circuit.

Subsequently, operation at each FINE delay circuit 611 will be described below. The description will be first made on operation at the FINE delay circuit 611*e*. FIG. 20 is a timing chart for description of operation at the FINE delay circuit. Note that FIG. 20 corresponds to a case of s=2 and m=4. In the FINE delay circuit 611*e*, a signal (clock INB) obtained by logically inverting the input clock IN is input to the input terminal CKIN_A, and a signal (clock INB1) obtained by delaying the clock INB by a time period 1.0 Tw is input to the input terminal CKIN_B. Moreover, in the FINE delay circuit 611*e*, the code signal DN_FD is input to the input terminal FI_T. In addition, the code signal DN_FDB as the signal obtained by logically inverting the code signal DN_FD is input to the input terminal FI_B.

A value of the first bit of the code signal DN_FD is input to an input terminal FI_T1. A value of the second bit of the code signal DN_FD is input to an input terminal FI_T2. Similarly, values of the third bit, the fourth bit, the fifth bit, the sixth bit, the seventh bit, and the eighth bit of the code signal DN_FD are input to input terminals FI_T3, FI_T4, FI_T5, FI_T6, FI_T7, and FI_T8, respectively.

A value of the first bit of the code signal DN_FDB is input to an input terminal FI_B1. A value of the second bit of the code signal DN_FDB is input to an input terminal FI_B2. Similarly, values of the third bit, the fourth bit, the fifth bit, the sixth bit, the seventh bit, and the eighth bit of the code signal DN_FDB are input to input terminals FI_B3, FI_B4, FI_B5, FI_B6, FI_B7, and FI_B8, respectively.

For example, when a value of the code signal DN_FD is "00000111", "1", "1", "1", "0", "0", "0", "0", and "0" are input to the input terminals FI_T1, FI_T2, FI_T3, FI_T4, FI_T5, FI_T6, FI_T7, and FI_T8, respectively. When the value of the code signal DN_FD is "00000111", a value of the code signal DN_FDB is "11111000". Thus, "0", "0", "0", "1", "1", "1", "1", and "1" are input to the input terminals FI_B1, FI_B2, FI_B3, FI_B4, FI_B5, FI_B6, FI_B7, and FI_B8, respectively.

In a duration in which the clock INB is at high-level, each first NMOS transistor of the inverter circuit 614*a* and each second NMOS transistor of the inverter circuit 614*b* are turned on. In a duration in which the clock INB1 is at high-level, each second NMOS transistor of the inverter circuit 614*a* and each first NMOS transistor of the inverter circuit 614*b* are turned on. Accordingly, in a duration in which the clocks INB and INB1 are both at high level, the N-side switch 72 of the inverter circuit 614*a* and the N-side switch 72 of the inverter circuit 614*b* are turned on, and the signal PI_CLKB (signal obtained by merging an output signal from the inverter circuit 614*a* and an output signal from the inverter circuit 614*b*) is at low level.

At time point t1, when the clock INB switches to low level, each first NMOS transistor of the inverter circuit 614a and each second NMOS transistor of the inverter circuit 614b are turned off. In other words, the N-side switch 72 of the inverter circuit 614a and the N-side switch 74 of the inverter circuit 614b switches off. In addition, the second PMOS transistor provided at each of the eight P-side switches 71_β of the inverter circuit 614a is turned on.

The first PMOS transistor provided at each of the eight P-side switches 71_β of the inverter circuit 614a is turned on when a low-level signal ("0") is input to the gate. Accordingly, first PMOS transistors in a number equal to the number of bits having values "0" in the code signal DN_FD are turned on. For example, when the value of the code signal DN_FD is "00000111", "1" is input to the input terminals FI_T1, FI_T2, and FI_T3, and accordingly, first PMOS transistors having gates connected to the terminals are turned off. Since "0" is input to the input terminals FI_T4, FI_T5, FI_T6, FI_T7, and FI_T8, first PMOS transistors having gates connected to the terminals are turned on.

Thus, at time point t1, switches in a number equal to the number of bits having values "0" in the code signal DN_FD are turned on among the eight P-side switches 71_β, and a level of a signal output to the output terminal CKOUT_T of the inverter circuit 614a increases in accordance with the number of switches thus turned on. In other words, gradient of rising of the signal output to the output terminal CKOUT_T of the inverter circuit 614a increases as the number of P-side switches 71_β turned on increases.

At time point t2 after elapse of a Tw time period since time point t1, when the clock INB1 switches to low level, each second NMOS transistor of the inverter circuit 614a and each first NMOS transistor of the inverter circuit 614b are turned off. In addition, the second PMOS transistor provided at each of the eight P-side switches 73_β of the inverter circuit 614b is turned on.

The first PMOS transistor provided at each of the eight P-side switches 73_β of the inverter circuit 614b is turned on when a low-level signal ("0") is input to the gate. Accordingly, first PMOS transistors in a number equal to the number of bits having values "0" in the code signal DN_FDB are turned on. For example, when the code signal DN_FDB is "11111000", "0" is input to the input terminals FI_B1, FI_B2, and FI_B3, and thus first PMOS transistors having gates connected to the terminals are turned on. Since "1" is input to the input terminals FI_B4 to FI_B8, first PMOS transistors having gates connected to the terminals are turned off.

Thus, at time point t2, switches in a number equal to the number of bits having values "0" in the code signal DN_FDB are turned on among the eight P-side switches 73_β, and a level of a signal output to the output terminal CKOUT_B of the inverter circuit 614b increases in accordance with the number of switches thus turned on. In other words, gradient of rising of the signal output to the output terminal CKOUT_B of the inverter circuit 614b increases as the number of P-side switches 73_β turned on increases.

Accordingly, a rising time period of the signal PI_CLKB obtained by merging the output signal from the inverter circuit 614a and the output signal from the inverter circuit 614b differs in accordance with values of the code signals DN_FD and DN_FDB.

The clock INB switches to high level at time point t3. A duration from time point t2 to time point t3 is equal to the high-level duration CINH of the input clock IN. Subsequently, at time point t4 after elapse of a Tw time period since time point t3, the clock INB1 switches to high level.

As the clocks INB and INB1 switch to high level, the N-side switch 72 of the inverter circuit 614a and the N-side switch 74 of the inverter circuit 614b are turned on and the signal PI_CLKB switches to low level.

Note that the clock FOUTB_EVN illustrated in FIG. 20 is a signal obtained by logically inverting the signal PI_CLKB through an inverter and is a signal output from the FINE delay circuit 611e.

The following describes a relation among the code signals DN_FD and DN_FDB and a delay time of the clock FOUTB_EVN at the FINE delay circuit 611e. First, when the value of the code signal DN_FD is "00000000" (the value of the code signal DN_FDB is "11111111"), the eight P-side switches 71 of the inverter circuit 614a are turned on and zero P-side switch 73 of the inverter circuit 614b is turned on. Thus, a delay amount of falling of the clock FOUTB_EVN is a value onto which 100% of a delay amount of the clock INB at the inverter circuit 614a is reflected. Thus, a delay time of falling of the clock FOUTB_EVN relative to falling of the clock INB is equal to the minimum delay time period Tf.

When the value of the code signal DN_FD is "00000001" (the value of the code signal DN_FDB is "11111110"), seven P-side switches 71 of the inverter circuit 614a are turned on and one P-side switch 73 of the inverter circuit 614b is turned on. Thus, the delay amount of falling of the clock FOUTB_EVN is a sum of 87.5% of a delay amount of the clock INB when all P-side switches 71 of the inverter circuit 614a are turned on and 12.5% of a delay amount of the clock INB1 when all P-side switches 73 of the inverter circuit 614b are turned on. Thus, the delay time of falling of the clock FOUTB_EVN relative to falling of the clock INB is 0.875 Tf+0.125(Tw+Tf)=Tf+0.125 Tw.

When the value of the code signal DN_FD is "00001111" (the value of the code signal DN_FDB is "11110000"), four P-side switches 71 of the inverter circuit 614a are turned on and four P-side switches 73 of the inverter circuit 614b are turned on. Thus, the delay amount of falling of the clock FOUTB_EVN is a sum of 50% of the delay amount of the clock INB when all P-side switches 71 of the inverter circuit 614a are turned on and 50% of the delay amount of the clock INB1 when all P-side switches 73 of the inverter circuit 614b are turned on. Thus, the delay time of falling of the clock FOUTB_EVN relative to falling of the clock INB is 0.500 Tf+0.500(Tw+Tf)=Tf+0.500 Tw.

When the value of the code signal DN_FD is "00111111" (the value of the code signal DN_FDB is "11000000"), two P-side switches 71 of the inverter circuit 614a are turned on and six P-side switches 73 of the inverter circuit 614b are turned on. Thus, the delay amount of falling of the clock FOUTB_EVN is a sum of 25% of the delay amount of the clock INB when all P-side switches 71 of the inverter circuit 614a are turned on and 75% of the delay amount of the clock INB1 when all P-side switches 73 of the inverter circuit 614b are turned on. Thus, the delay time of falling of the clock FOUTB_EVN relative to falling of the clock INB is 0.250 Tf+0.750(Tw+Tf)=Tf+0.750 Tw.

When the value of the code signal DN_FD is "11111111" (the value of the code signal DN_FDB is "00000000"), zero P-side switch 71 of the inverter circuit 614a is turned on and the eight P-side switches 73 of the inverter circuit 614b are turned on. Thus, the delay amount of falling of the clock FOUTB_EVN is a value onto which 100% of the delay amount of the clock INB1 at the inverter circuit 614b is reflected. Thus, a delay time of rising of the clock FOUTB_EVN relative to falling of the clock INB is Tf+1.000 Tw.

Rising of the clock FOUTB_EVN output from the FINE delay circuit 611e occurs at a timing when the clocks INB and INB1 are both switched to high level irrespective of the values of the code signals DN_FD and DN_FDB. In other words, rising of the clock FOUTB_EVN occurs at a timing same as a timing of rising of the clock INB1, and thus the delay time of rising of the clock FOUTB_EVN relative to rising of the clock INB is Tw.

In this manner, the FINE delay circuit 611e receives the clocks IN and generates and outputs the clock FOUTB_EVN that differs in the delay time of falling in accordance with the value of the code signal DN_FD.

Subsequently, operation at the FINE delay circuit 611o will be described below. In the FINE delay circuit 611o, a signal (clock INB) obtained by logically inverting the input clock IN is input to the input terminal CKIN_B, and a signal (clock INB1) obtained by delaying the clock INB by a time period 1.0 Tw is input to the input terminal CKIN_A. Specifically, a signal (clock INB) input to the input terminal CKIN_A in a case of the FINE delay circuit 611e is input to the input terminal CKIN_B in a case of the FINE delay circuit 611o, and a signal (clock INB1) input to the input terminal CKIN_B in a case of the FINE delay circuit 611e is input to the input terminal CKIN_A in a case of the FINE delay circuit 611o. Thus, a relation among the code signals DN_FD and DN_FDB and a delay time of the clock FOUTB_ODD generated at the FINE delay circuit 611o is as described below.

First, when the value of the code signal DN_FD is "00000000" (the value of the code signal DN_FDB is "11111111"), the eight P-side switches 71 of the inverter circuit 614a are turned on and zero P-side switch 73 of the inverter circuit 614b is turned on. Thus, a delay amount of falling of the clock FOUTB_ODD is a value onto which 100% of a delay amount of the clock INB1 at the inverter circuit 614a is reflected. Thus, a delay time of falling of the clock FOUTB_ODD relative to falling of the clock INB is Tf+1.00 Tw.

When the value of the code signal DN_FD is "00000011" (the value of the code signal DN_FDB is "11111100"), six P-side switches 71 of the inverter circuit 614a are turned on and two P-side switches 73 of the inverter circuit 614b are turned on. Thus, the delay amount of falling of the clock FOUTB_ODD is a sum of 75% of the delay amount of the clock INB1 when all P-side switches 71 of the inverter circuit 614a are turned on and 25% of the delay amount of the clock INB when all P-side switches 73 of the inverter circuit 614b are turned on. Thus, the delay time of falling of the clock FOUTB_ODD relative to falling of the clock INB is 0.75(Tw+Tf)+0.25 Tf=Tf+0.75 Tw.

When the value of the code signal DN_FD is "00001111" (the value of the code signal DN_FDB is "11110000"), four P-side switches 71 of the inverter circuit 614a are turned on and four P-side switches 73 of the inverter circuit 614b are turned on. Thus, the delay amount of falling of the clock FOUTB_ODD is a sum of 50% of the delay amount of the clock INB1 when all P-side switches 71 of the inverter circuit 614a are turned on and 50% of the delay amount of the clock INB when all P-side switches 73 of the inverter circuit 614b are turned on. Thus, a delay time of falling of the clock FOUTB_ODD relative to rising of the clock INB is 0.50(Tw+Tf)+0.50 Tf=Tf+0.50 Tw.

When the value of the code signal DN_FD is "00111111" (the value of the code signal DN_FDB is "11000000"), two P-side switches 71 of the inverter circuit 614a are turned on and six P-side switches 73 of the inverter circuit 614b are turned on. Thus, the delay amount of falling of the clock FOUTB_ODD is a sum of 25% of the delay amount of the clock INB1 when all P-side switches 71 of the inverter circuit 614a are turned on and 75% of the delay amount of the clock INB when all P-side switches 73 of the inverter circuit 614b are turned on. Thus, a delay time of rising of the clock FOUTB_ODD relative to falling of the clock INB is 0.25(Tw+Tf)+0.75 Tf=Tf+0.25 Tw.

When the value of the code signal DN_FD is "11111111" (the value of the code signal DN_FDB is "00000000"), zero P-side switch 71 of the inverter circuit 614a is turned on and the eight P-side switches 73 of the inverter circuit 614b are turned on. Thus, the delay amount of falling of the clock FOUTB_ODD is a value onto which 100% of the delay amount of the clock INB at the inverter circuit 614b is reflected. Thus, the delay time of falling of the clock FOUTB_EVN relative to falling of the clock INB is Tf.

Rising of the clock FOUTB_ODD output from the FINE delay circuit 611o occurs at a timing when the clocks INB and INB1 are both switched to high level irrespective of the values of the code signals DN_FD and DN_FDB. In other words, rising of the clock FOUTB_EVN occurs at a timing same as the timing of rising of the clock INB1, and thus the delay time relative to rising of the clock INB is Tw.

FIG. 21 illustrates a relation among the code signals DN_FD and DN_FDB and the delay times of the clocks FOUTB_EVN and FOUTB_ODD. Specifically, when the value of the code signal DN_FD is "00000000", the delay time of falling of the clock FOUTB_EVN is Tf and the delay time of falling of the clock FOUTB_ODD is Tf+1.00 Tw. When the value of the code signal DN_FD is "00000011", the delay time of falling of the clock FOUTB_EVN is Tf+0.25 Tw and the delay time of falling of the clock FOUTB_ODD is Tf+0.75 Tw. When the value of the code signal DN_FD is "00001111", the delay time of falling of the clock FOUTB_EVN is Tf+0.50 Tw and the delay time of falling of the clock FOUTB_ODD is Tf+0.50 Tw. When the value of the code signal DN_FD is "00111111", the delay time of falling of the clock FOUTB_EVN is Tf+0.74 Tw and the delay time of falling of the clock FOUTB_ODD is Tf+0.25 Tw. When the value of the code signal DN_FD is "11111111", the delay time of falling of the clock FOUTB_EVN is Tf+1.00 Tw and the delay time of falling of the clock FOUTB_ODD is Tf.

In this manner, the clocks FOUTB_EVN and FOUTB_ODD are complementary and generated so that a sum of the delay times is constant (1.00 Tw) irrespective of the value of the input code signal DN_FD. Note that the above-described "sum of delay times" means a sum of delay times except for a longest delay time Tf. Specifically, the delay time of FOUTB_ODD is set to be shorter as the delay time of falling of the clock FOUTB_EVN is set to be longer. The delay time of FOUTB_ODD is set to be longer as the delay time of falling of the clock FOUTB_EVN is set to be shorter.

Figure 22:
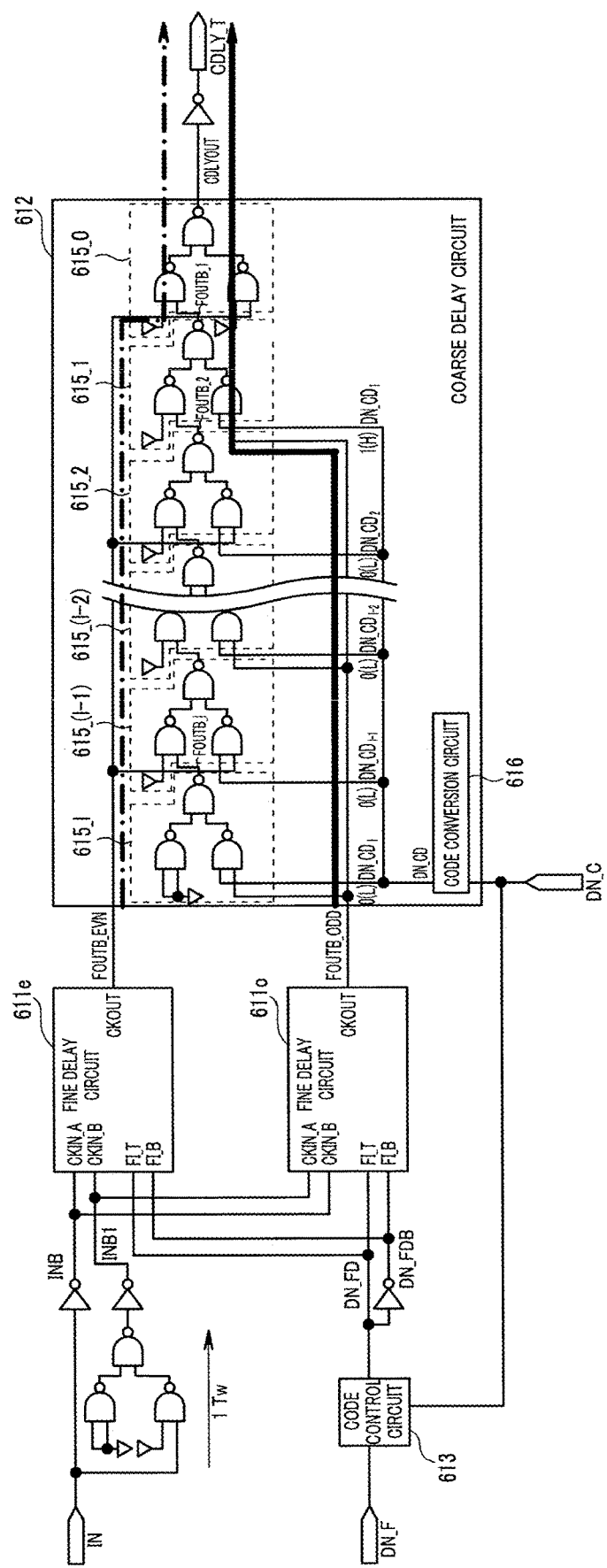
FIG. 22 is a diagram illustrating an example of a state during operation of a COARSE delay circuit.
Figure 23:
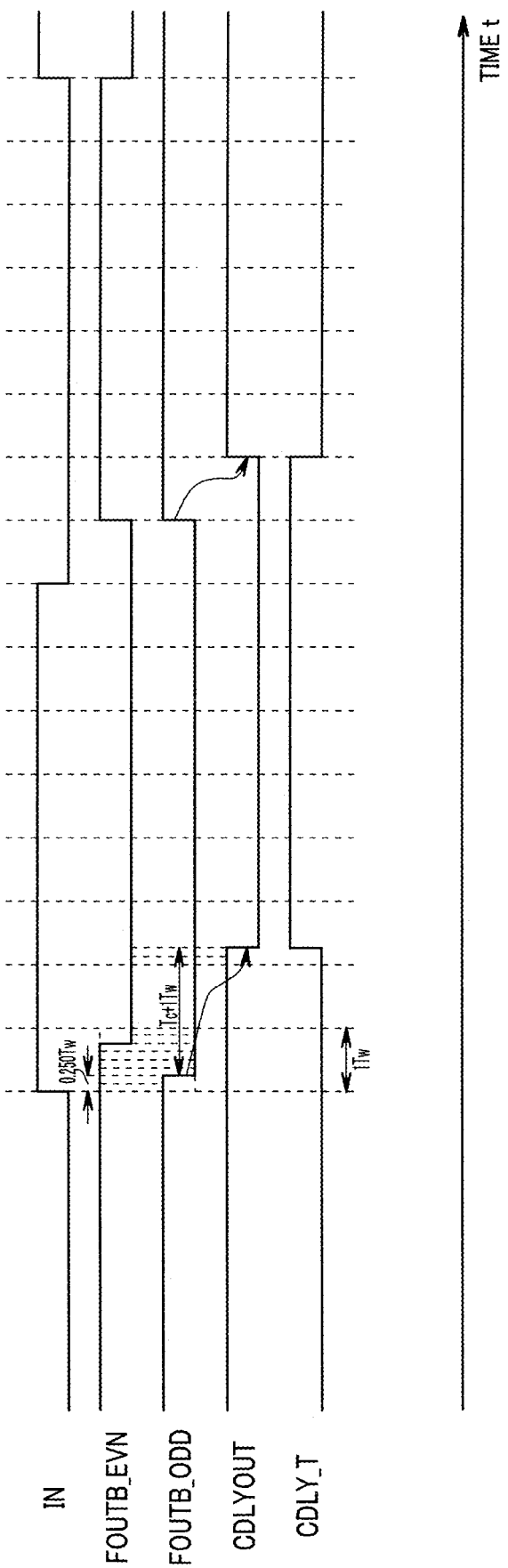
FIG. 23 is a timing chart for description of operation of the COARSE delay circuit in the state illustrated in FIG. 22.

Subsequently, operation at the COARSE delay circuit 612 will be described below. FIG. 22 illustrates an example of a state during operation of the COARSE delay circuit. FIG. 23 is a timing chart for description of operation of the COARSE delay circuit in the state illustrated in FIG. 22. In the example illustrated in FIG. 22, the duration in which the input clock IN is at high level is longer by 2.50 Tw than the duration in which the input clock IN is at low level. In the example illustrated in FIG. 22, A is 1.25 Tw. Thus, the code signal DN_C has a value "001". As a result, the code conversion circuit 616 outputs "0000001" as the code signal DN_CD. Specifically, only the code signal DN_CD1 is a high-level signal and the code signals DN_CD2 to DN_CD1 are low-level signals. As a result, falling of the clock FOUTB_ODD output from the FINE delay circuit 611*o* is delayed by the delay elements 615_1 and 615_0. Thus, falling of the output clock CDLYOUT is delayed from falling of the clock FOUTB_ODD by 1 Tw in addition to a minimum delay time period Tc at the COARSE delay circuit 612 (in other words, a delay time of the delay element 615_0) (refer to a bold line path in FIG. 22).

Rising of the output clock CDLYOUT is delayed by the delay element 615_0 irrespective of the code signal DN_C from rising of the clock FOUTB_EVN output from the FINE delay circuit 611*e*. Thus, rising of the output clock CDLYOUT is delayed from rising of the clock FOUTB_EVN by the minimum delay time period Tc at the COARSE delay circuit 612 (refer to a bold dashed line path in FIG. 22).

When Δ is 1.25 Tw, the code signal DN_F has a value "0010". Since the code signal DN_C is "001", in other words, an odd number, the code control circuit 613 converts the code signal DN_F and outputs "00111111" as the code signal DN_FD. When the value of the code signal DN_FD is "00111111", a signal output from the FINE delay circuit 611*o* is a signal obtained by delaying the clock IN by 0.25 Tw in addition to the minimum delay time period Tf at the FINE delay circuit 611. Note that, when the value of the code signal DN_FD is "00111111", a signal output from the FINE delay circuit 611*e* is a signal obtained by delaying the clock IN by 0.75 Tw in addition to the minimum delay time period Tf at the FINE delay circuit 611.

As described above, falling of the output clock CDLYOUT is a signal obtained by delaying the clock IN by 1.25 Tw in addition to the minimum delay time period (Tf+Tc). Rising of the output clock CDLYOUT is a signal obtained by delaying the input clock by Tw+Tc. Note that FIG. 23 illustrates a waveform of each signal when the minimum delay time period Tf at the FINE delay circuit 611 is 0 Tw and the minimum delay time period Tc at the COARSE delay circuit 612 is 1 Tw.

Figure 24:
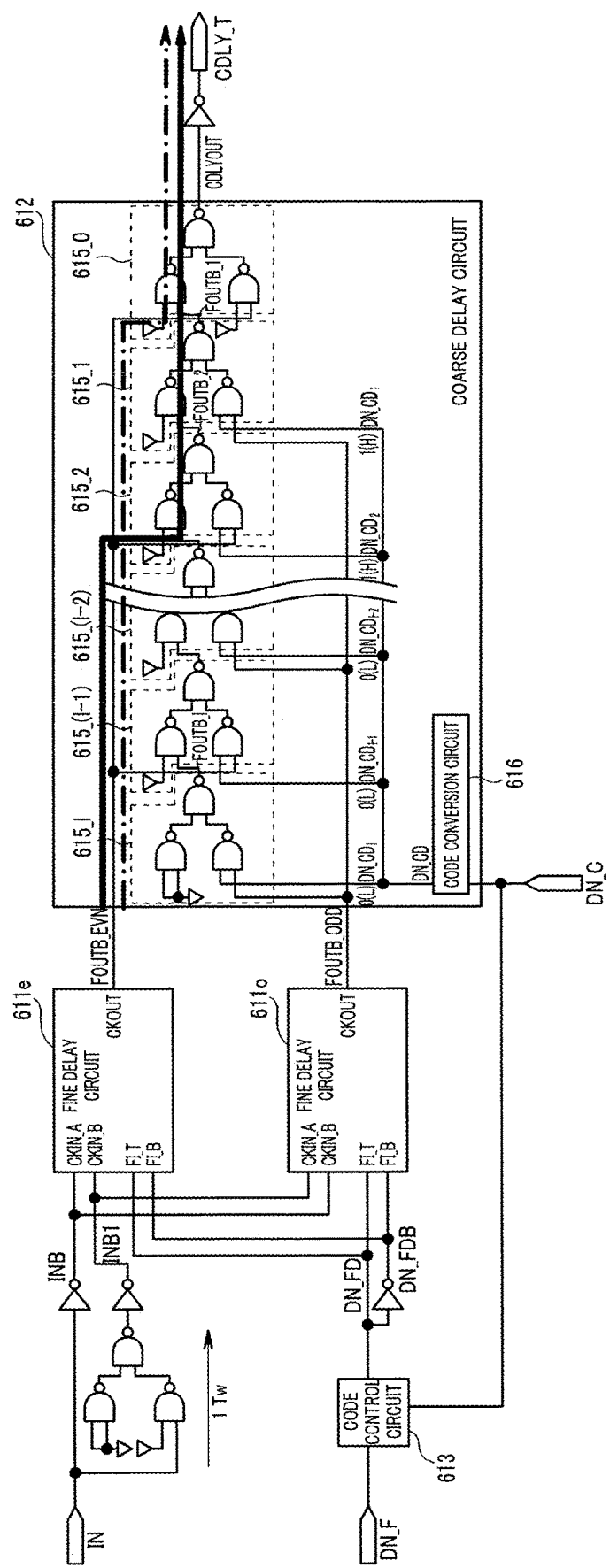
FIG. 24 is a diagram illustrating another example of a state during operation of the COARSE delay circuit.
Figure 25:
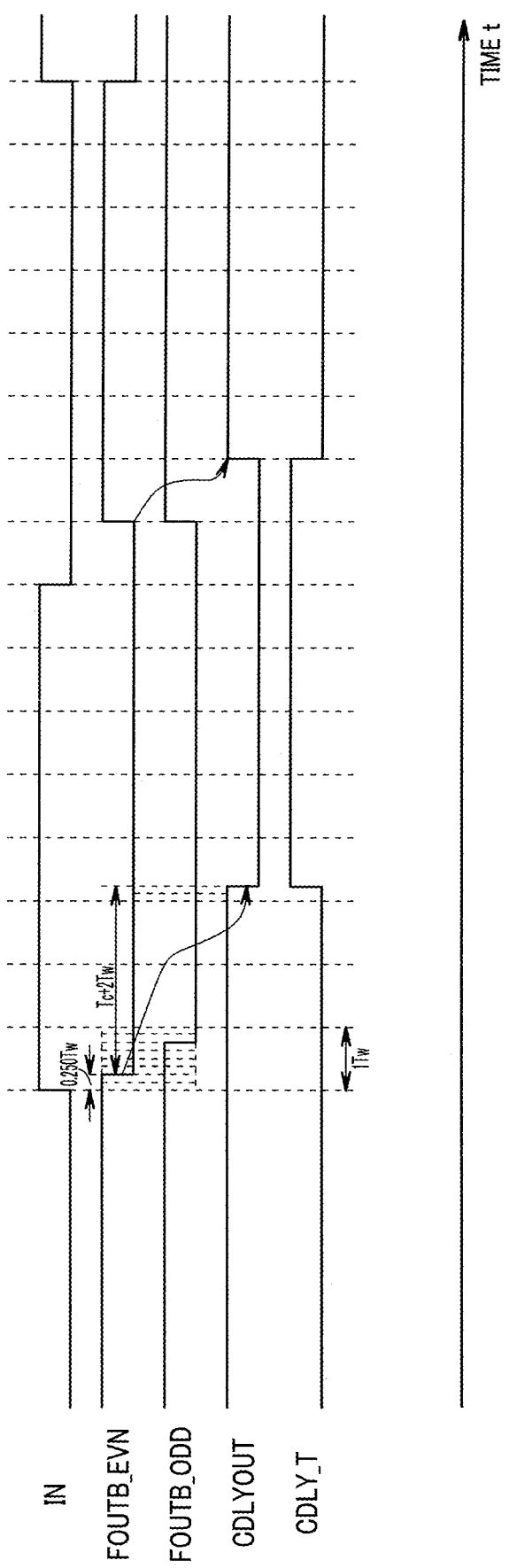
FIG. 25 is a timing chart for description of operation of the COARSE delay circuit in the state illustrated in FIG. 24.

Subsequently, operation at the COARSE delay circuit 612 will be described below with reference to another specific example. FIG. 24 illustrates an example of a state during operation of the COARSE delay circuit. FIG. 25 is a timing chart for description of operation of the COARSE delay circuit in the state illustrated in FIG. 24. In the example illustrated in FIG. 24, the duration in which the input clock IN is at high level is longer by 4.50 Tw than the duration in which the input clock IN is at low level. In the example illustrated in FIG. 24, Δ is 2.25 Tw. Thus, the code signal DN_C has a value "010". As a result, the code conversion circuit 616 outputs "0000011" as the code signal DN_CD. Specifically, the code signals DN_CD1 and DN_CD2 are high-level signals and the code signals DN_CD3 to DN_CD1 are low-level signals. As a result, falling of the clock FOUTB_EVN output from the FINE delay circuit 611*e* is delayed by the delay elements 615_2 to 615_0. Thus, falling of the output clock CDLYOUT is delayed from falling of the clock FOUTB_EVN by 2 Tw in addition to the minimum delay time period Tc at the COARSE delay circuit 612 (refer to a bold line path in FIG. 24).

Rising of the output clock CDLYOUT is delayed by the delay element 615_0 irrespective of the code signal DN_C from rising of the clock FOUTB_EVN output from the FINE delay circuit 611*e*. Thus, rising of the output clock CDLYOUT is delayed from rising of the clock FOUTB_EVN by the minimum delay time period Tc at the COARSE delay circuit 612 (refer to a bold dashed line path in FIG. 24).

When Δ is 2.25 Tw, the code signal DN_F has a value "0010". Since the code signal DN_C is "010", in other words, an even number, the code control circuit 613 converts the code signal DN_F and outputs "00000011" as the code signal DN_FD. When the value of the code signal DN_FD is "00000011", a signal output from the FINE delay circuit 611*e* is a signal obtained by delaying the clock IN by 0.25 Tw in addition to the minimum delay time period Tf at the FINE delay circuit 611. Note that when the value of the code signal DN_FD is "00000011", a signal output from the FINE delay circuit 611*e* is a signal obtained by delaying the clock IN by 0.75 Tw in addition to the minimum delay time period Tf at the FINE delay circuit 611.

As described above, rising of the output clock CDLYOUT is a signal obtained by delaying the clock IN by 2.25 Tw in addition to the minimum delay time period (Tf+Tc). Falling of the output clock CDLYOUT is a signal obtained by delaying the input clock by Tw+Tc. Note that FIG. 25 illustrates a waveform of each signal when the minimum delay time period Tf at the FINE delay circuit 611 is 0 Tw and the minimum delay time period Tc at the COARSE delay circuit 612 is 1 Tw.

The output clock CDLYOUT output from the COARSE delay circuit 612 is logically inverted by an inverter and output as the clock CDLY_T from the delay block circuit 61.

The delay block circuit 62 receives the input clock /IN and the code signals UP_F and UP_C constituting the signal DCA_CODE and generates the delay clock CDLY_B. Operation of each constituent component of the delay block circuit 62 is same as operation of each constituent component of the delay block circuit 61. Specifically, the clock CDLY_B is generated from the input clock /IN at the delay block circuit 62 and output as described above with the code signals DN_F, DN_C, DN_FD, and DN_CD replaced with the code signals UP_F, UP_C, UP_FD, and UP_CD, respectively.

(2-1-4. Operation of Waveform Generation Circuit)

Figure 26:
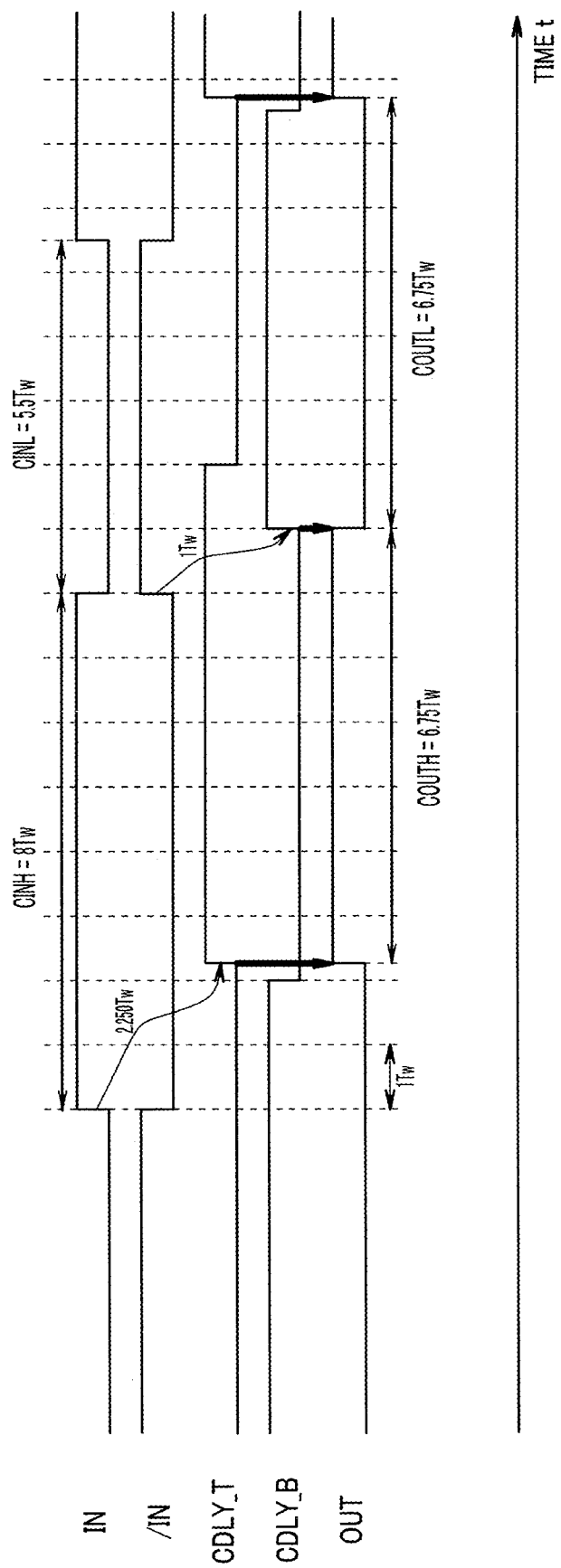
FIG. 26 is a timing chart for description of an example of operation at the waveform generation circuit.

The waveform generation circuit 44 receives the two clocks (clocks CDLY_T and CDLY_B) output from the DCA circuit 43 and generates the output clock OUT. FIG. 26 is a timing chart for description of an example of operation at the waveform generation circuit. Note that the timing chart in FIG. 26 corresponds to a case in which the high-level duration CINH of the clock IN is 8 Tw and the low-level duration CINL of the clock IN is 5.5 Tw. In FIG. 26, the minimum delay time period Tf at the FINE delay circuit 611 is 0 Tw and the minimum delay time period Tc at the COARSE delay circuit 612 is 1 Tw.

In this case, the clock CDLY_T output from the DCA circuit 43 is generated by delaying each of rising and falling of the clock IN by a particular amount at the delay block circuit 61. Specifically, since Δ=(8−5.5)/2=1.25 Tw, rising of the clock CDLY_T is delayed from rising of the clock IN by 2.25 Tw (=Tf+Tc+1.25 Tw) and falling of the clock CDLY_T is delayed from falling of the clock IN by 2 Tw.

The clock CDLY_B is generated by delaying each of rising and falling of the clock /IN by a particular amount at the delay block circuit 62. Specifically, rising of the clock CDLY_B is delayed from rising of the clock /IN by 1 Tw (=Tf+Tc) and falling of the clock CDLY_B is delayed from falling of the clock /IN by 2 Tw.

The waveform generation circuit 44 generates, as the output clock OUT, a signal that rises at a timing when the clock CDLY_T rises and that falls at a timing when the clock CDLY_B rises. Specifically, the output clock OUT is a signal that rises after elapse of 2.25 Tw since rising of the clock IN and falls after elapse of 1 Tw since rising of the clock /IN. A high-level duration COUTH of the clock OUT generated in this manner is 6.75 Tw, and a low-level duration COUTL of the clock OUT is 6.75 Tw. In other words, the output clock OUT has a duty cycle of 50%. Note that the waveform generation circuit 44 generates, as the output clock /OUT, a signal obtained by logically inverting the output clock OUT.

(3. Effects)

According to the present embodiment, when the pulse width (high-level duration) of the input clock DCD_IN and the pulse width of the input clock /DCD_IN are measured at the edge detection circuit 53, it is possible to perform the measurement at high resolution while restricting area increase and current consumption.

Figure 27:
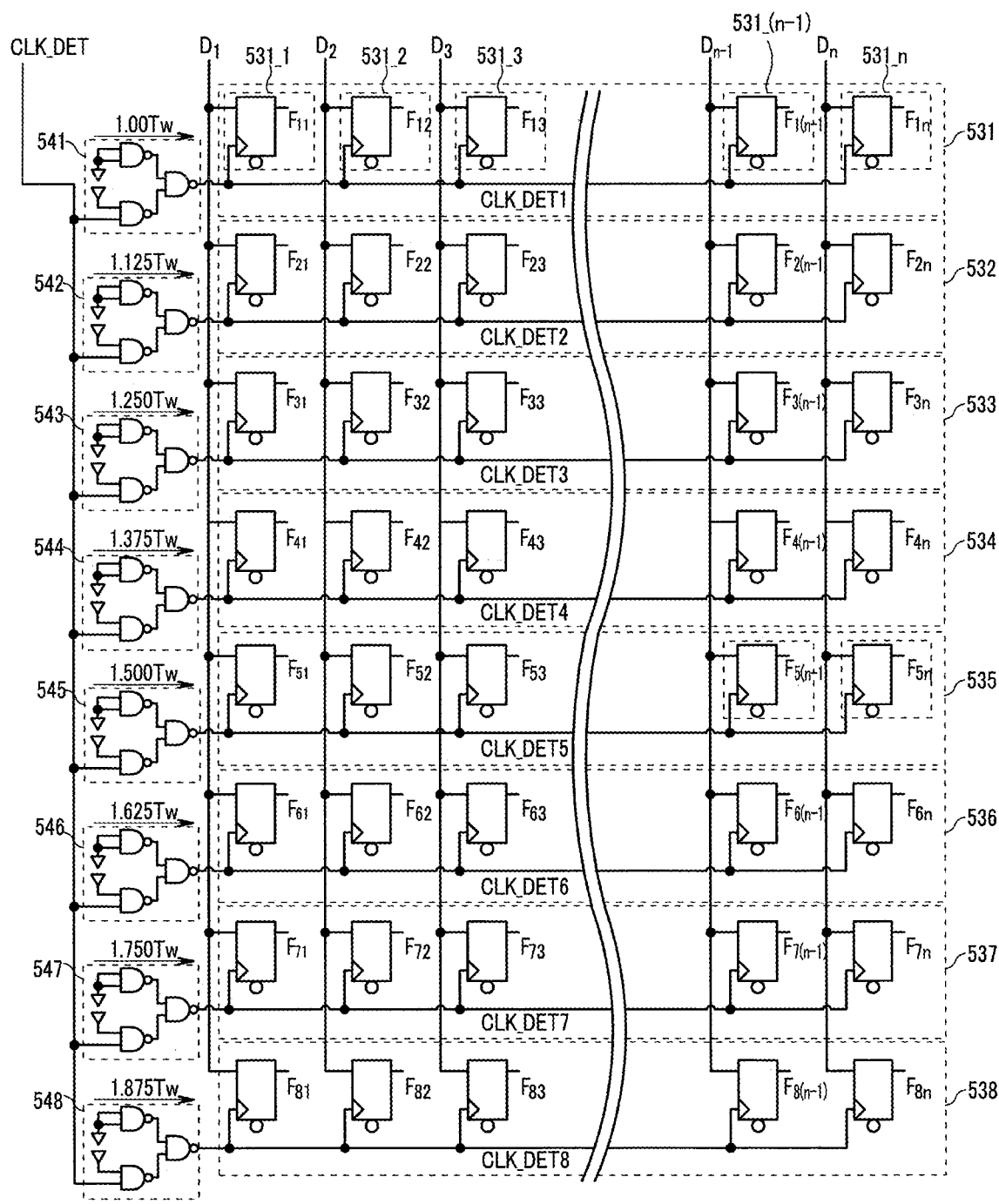
FIG. 27 is a circuit diagram illustrating an example of an edge detection circuit of a comparative example.

FIG. 27 is a circuit diagram illustrating an example of an edge detection circuit of a comparative example. The edge detection circuit illustrated in FIG. 27 has a measurement resolution same as a measurement resolution of the edge detection circuit 53 of the embodiment illustrated in FIG. 6. The edge detection circuit of the comparative example includes (m×s) delay lines 53m. The edge detection circuit of the comparative example also includes (m×s) delay elements 54β. A delay amount of each delay element 54β is set to a time period $\{1.0+(\beta-1)/(m\times s)\}\times Tw$.

For example, in a case of m=4 and s=2, the edge detection circuit of the comparative example includes eight delay lines 531 to 538 as illustrated in FIG. 27. Delay amounts that are different from each other by 0.125 Tw are set to eight delay elements 541 to 548 provided on an input side of the delay lines 531 to 538.

With a configuration of the edge detection circuit of the comparative example, the number of delay lines 53m needs to be doubled to double the measurement resolution. The delay lines 53m include a large number of flip-flops and thus need large occupation area and large current consumption. When the measurement resolution is increased with the configuration of the comparative example, the area increases and the current consumption increases. Furthermore, as the area increases, difference in length of a wire through which the signal CLK_DET is transferred to each delay element 54β increases. For example, difference increases between the length of a wire through which the signal CLK_DET is transferred to the delay element 541 and the length of a wire through which the signal CLK_DET is transferred to the delay element 548. When the wire length difference becomes large, wire delay influence cannot be ignored. Accordingly, the wire delay influence is added to a set delay amount of the signal CLK_DET output from each delay element 54β, and thus it is difficult to equalize difference in delay of the signal CLK_DET input to each delay line 53m.

However, in the edge detection circuit 53 of the present embodiment, the delay unit 55 configured to generate delay difference is provided on the input side of the delay elements 54β. The delay unit 55 generates the two kinds of signals CLK_DETa1 and CLK_DETa2 between which delay difference is 0.125 Tw. Any one of the signals CLK_DETa1 and CLK_DETa2 is input to each delay element 54β. A delay amount of a signal (signal CLK_DET1) output from the delay element 541 in response to inputting of the signal CLK_DETa2 relative to a signal (signal CLK_DET1) output from the delay element 541 in response to inputting of the signal CLK_DETa1 is 0.125 Tw. Similarly, a delay amount of a signal (signal CLK_DET2) output from the delay element 542 in response to inputting of the signal CLK_DETa1 is 0.25 Tw, and a delay amount of a signal (signal CLK_DET2) output from the delay element 542 in response to inputting of the signal CLK_DETa2 is 0.375 Tw. In addition, a delay amount of a signal (signal CLK_DET3) output from the delay element 543 in response to inputting of the signal CLK_DETa1 is 0.500 Tw, and a delay amount of a signal (signal CLK_DET3) output from the delay element 543 in response to inputting of the signal CLK_DETa2 is 0.625 Tw. Moreover, a delay amount of a signal (signal CLK_DET4) output from the delay element 544 in response to inputting of the signal CLK_DETa1 is 0.750 Tw, and a delay amount of a signal (signal CLK_DET4) output from the delay element 544 in response to inputting of the signal CLK_DETa2 is 0.875 Tw.

Specifically, the edge detection circuit 53 of the embodiment generates a delay amount of a signal input to each delay line 53m at the delay element 54β and the delay unit 55 as two circuits. Thus, it is possible to multiply the number of signals having different delay differences in a time divisional manner by adding the delay unit 55 (the delay elements 55δ and the selector 56) without changing the number of delay lines 53m. As a result, it is possible to decrease delay difference between input signals to the delay elements 54β. Therefore, it is possible to increase the measurement resolution while restricting area increase and current consumption increase due to increase of the number of flip-flops.

As described above, the present embodiment can provide a semiconductor integrated circuit, a semiconductor storage device, and a memory system that can increase the measurement resolution of a pulse signal while restricting area increase and current consumption.

Note that each DCC circuit 20 may be provided not only to the interface chip 2A but also to the non-volatile memory 2B. A correction target signal is not limited to the duty cycle of the read enable signals RE and /RE and the data strobe signals DQS and /DQS. The DCC circuit 20 may be provided to a site for correcting a signal having a duty cycle that needs to be highly accurately adjusted with a high-speed clock.

Second Eembodiment

Figure 28:
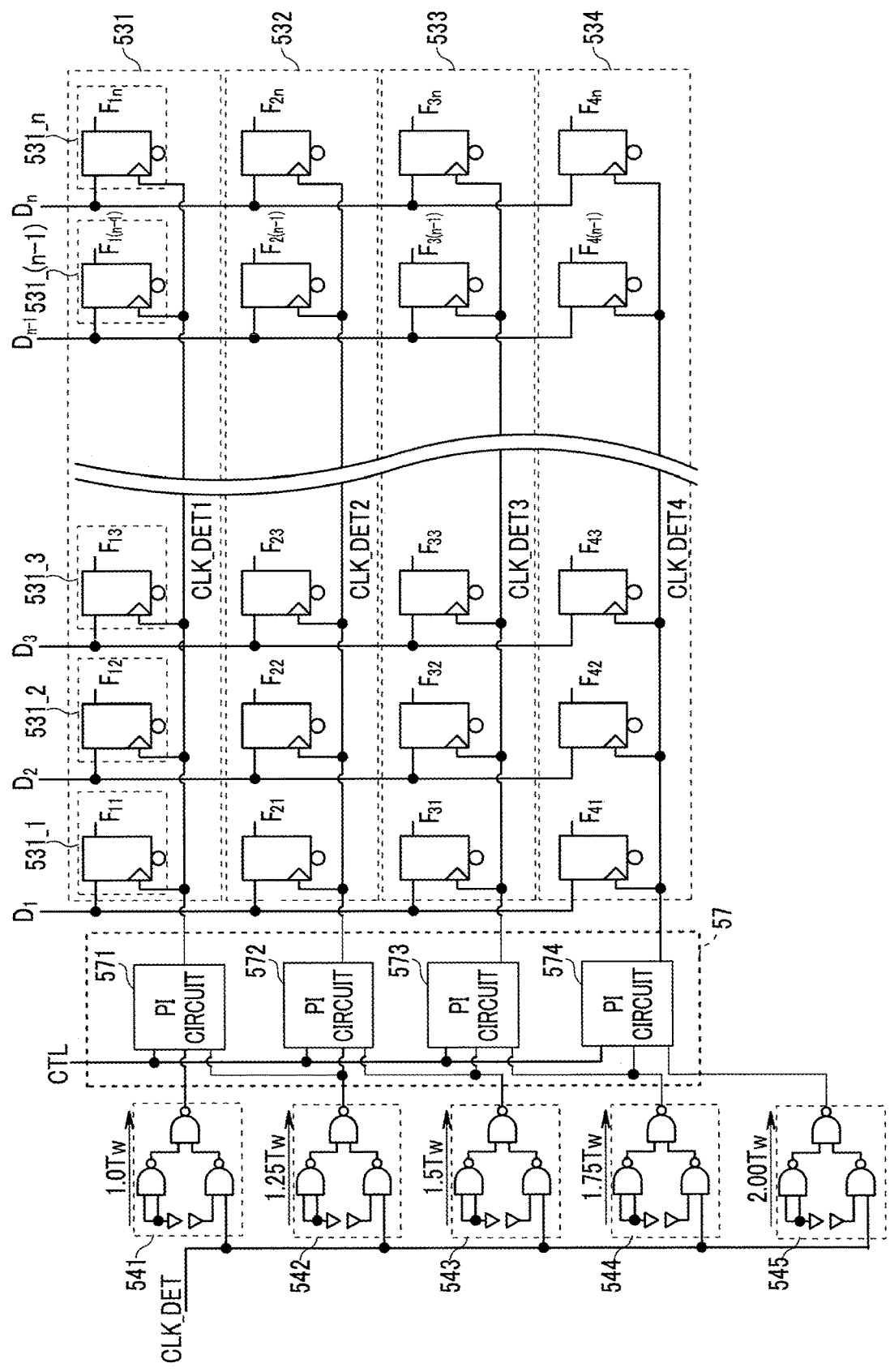
FIG. 28 is a circuit diagram illustrating an example of an edge detection circuit of a second embodiment.

Subsequently, a second embodiment will be described below. FIG. 28 is a circuit diagram illustrating an example of an edge detection circuit of the second embodiment. The second embodiment illustrated in FIG. 28 is different from the first embodiment illustrated in FIG. 6 in a configuration of a delay unit 57 configured to adjust a delay amount of a signal input to each delay line 53β. A constituent component identical to a constituent component in the edge detection circuit of the first embodiment illustrated in FIG. 6 is denoted by the same reference sign and will not be described below.

In the edge detection circuit illustrated in FIG. 28, the delay unit 57 is provided between an output side of the delay elements 54β and an input side of the delay lines 53β. One delay element 54(m+1) is provided in addition to the delay elements 54β. The delay unit 57 includes m phase interpolator (PI) circuits 57β. Output signals from the delay elements 54β and an output signal from the delay element 54(β+1) are input to the PI circuits 57β. In addition, a control signal CTL that adjusts a delay amount is input to the PI circuits 57β. The signal CLK_DETβ having an adjusted delay amount is output from the PI circuits 57β in accordance with the control signal CTL.

Figure 29:
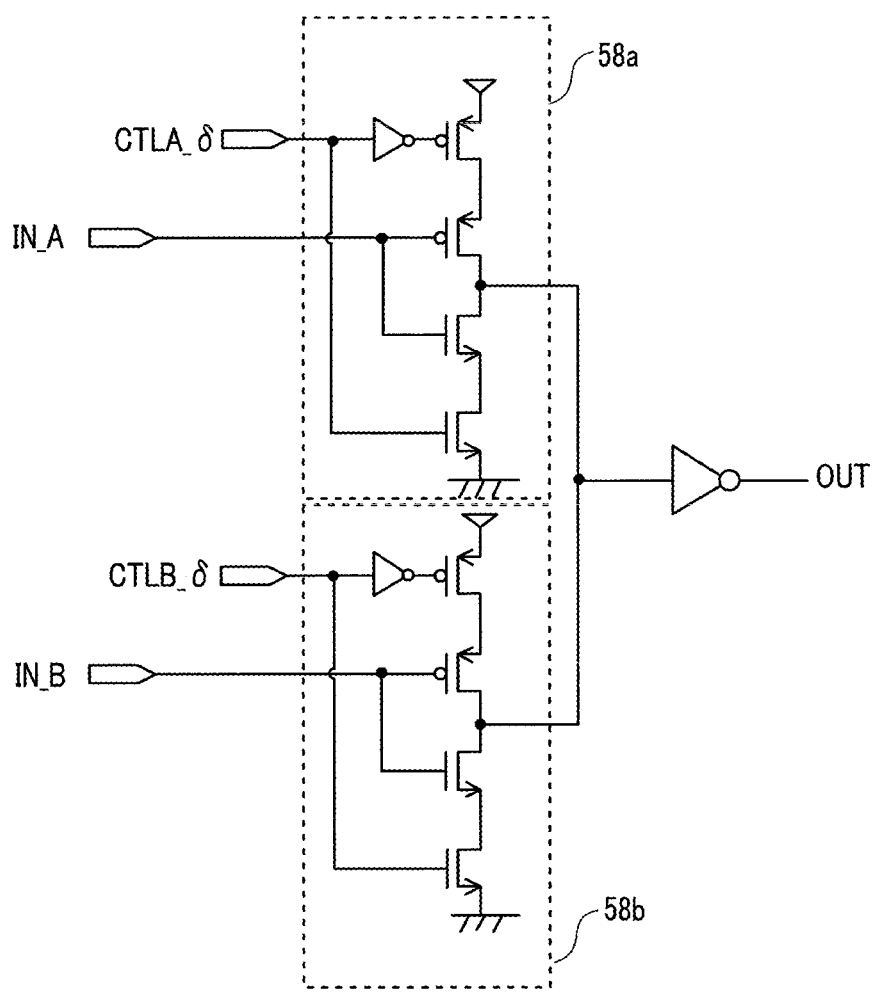
FIG. 29 is a circuit diagram illustrating an example of a PI circuit.

FIG. 29 is a circuit diagram illustrating an example of each PI circuit. Each PI circuit 57β includes a pair of inverter circuit groups 58a and 58b. The inverter circuit group 58a consists of s inverter circuits 58a_δ. Each inverter circuit 58a_δ has a configuration in which two PMOS transistors and two NMOS transistors are connected in series. The s inverter circuits 58a_δ are connected in parallel between the node of the power voltage Vcc and the node of the ground voltage Vss.

One set bit in a code signal (=the control signal CTL) of s bits input through an input terminal CTLA is input through an inverter to a gate of one PMOS transistor (hereinafter referred to as a third PMOS transistor) having a source connected to the power voltage Vcc among the two PMOS transistors constituting each inverter circuit 58a_δ. A signal input from a corresponding delay element 54β through an input terminal IN_A (signal obtained by delaying the signal CLK_DET through the delay element 54β) is input to a gate of the other PMOS transistor (hereinafter referred to as a fourth PMOS transistor). One set bit in a code signal (=the control signal CTL) of s bits input through the input terminal CTLA is input to a gate of one NMOS transistor (hereinafter referred to as a third NMOS transistor) having a drain connected to the ground voltage Vss among the two NMOS transistors constituting each inverter circuit 58a_δ. The signal input from the delay element 54β through the input terminal IN_A (the signal obtained by delaying the signal CLK_DET through the delay element 54β) is input to a gate of the other NMOS transistor (hereinafter referred to as a fourth NMOS transistor). In other words, the one set bit in the code signal (=the control signal CTL) of s bits input through the input terminal CTLA is input to the gate of the third PMOS transistor and the gate of the third NMOS transistor. In addition, the signal input from the delay element 54β through the input terminal IN_A (the signal obtained by delaying the signal CLK_DET through the delay element 54β) is input to the gate of the fourth PMOS transistor and the gate of the fourth NMOS transistor.

One set bit in a code signal (=the control signal CTL) of s bits input through an input terminal CTLB is input through an inverter to a gate of one PMOS transistor (hereinafter referred to as a fifth PMOS transistor) having a source connected to the power voltage Vcc among the two PMOS transistors constituting each inverter circuit 58b_δ. A signal input from the delay element 54(β+1) through an input terminal IN_B (signal obtained by delaying the signal CLK_DET through the delay element 54(β+1)) is input to a gate of the other PMOS transistor (hereinafter referred to as a sixth PMOS transistor). One set bit in a code signal (=the control signal CTL) of s bits input through the input terminal CTLB is input to a gate of one NMOS transistor (hereinafter referred to as a fifth NMOS transistor) having a drain connected to the ground voltage Vss among the two NMOS transistors constituting each inverter circuit 58a_δ. The signal input from the delay element 54(β+1) through the input terminal IN_B (the signal obtained by delaying the signal CLK_DET through the delay element 54(β+1)) is input to a gate of the other NMOS transistor (hereinafter referred to as a sixth NMOS transistor). In other words, the one set bit in the code signal (=the signal obtained by logically inverting the control signal CTL) of s bits input through the input terminal CTLB is input to the gate of the fifth PMOS transistor and the gate of the fifth NMOS transistor. In addition, the signal input from the delay element 54(β+1) through the input terminal IN_B (the signal obtained by delaying the signal CLK_DET through the delay element 54(β+1)) is input to the gate of the sixth PMOS transistor and the gate of the sixth NMOS transistor.

An inverted signal of a signal obtained by merging an output from the inverter circuit group 58a and an output from the inverter circuit group 58b is output from an output terminal OUT. In other words, an inverted signal of a signal obtained by merging an output from the inverter circuits 58a_δ and an output from the inverter circuits 58b_δ is output as the clock signal CLK_DETβ from the output terminal OUT.

Figure 30A:
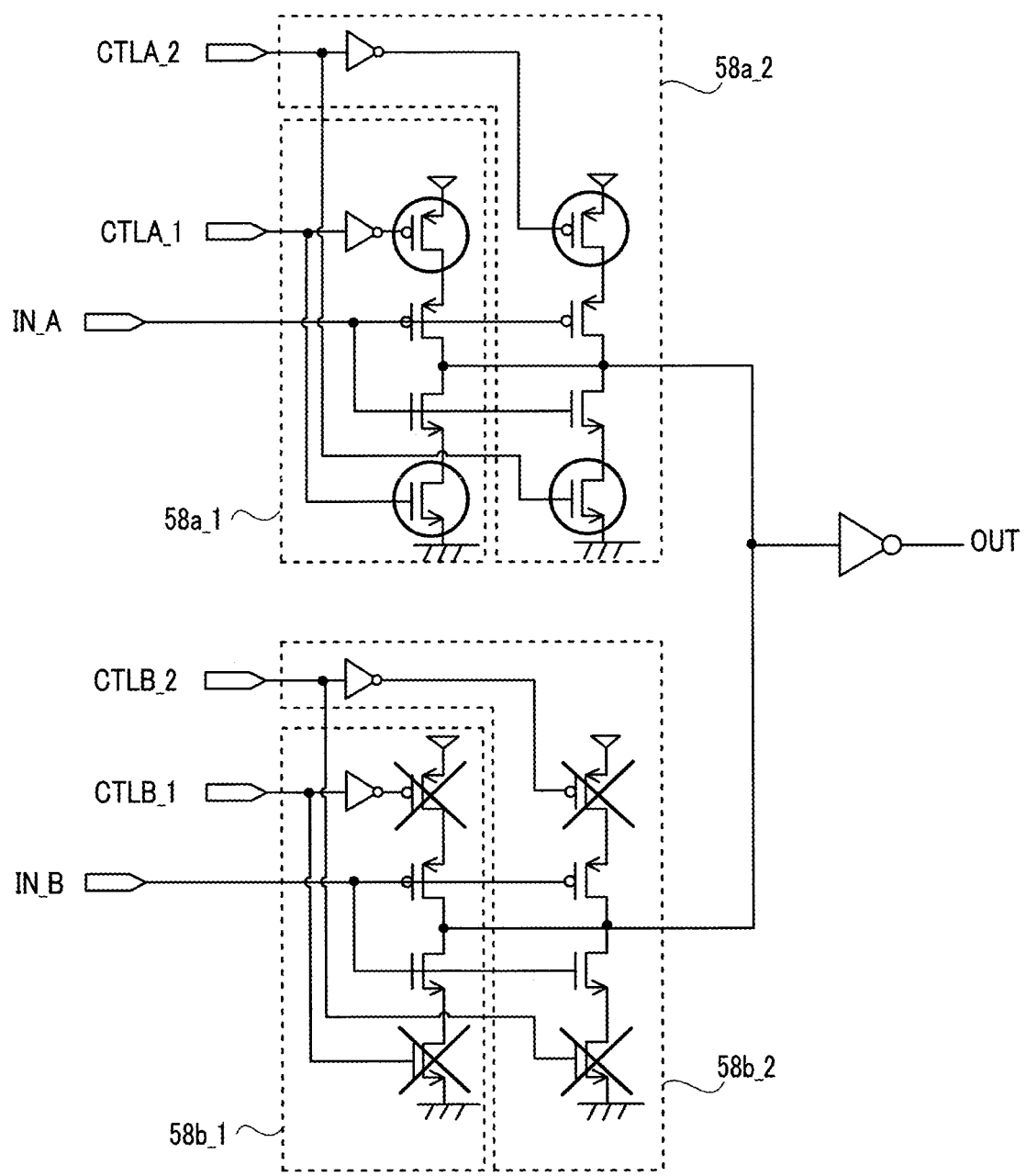
FIG. 30A is a circuit diagram for description of an example of operation of the PI circuit.
Figure 30B:
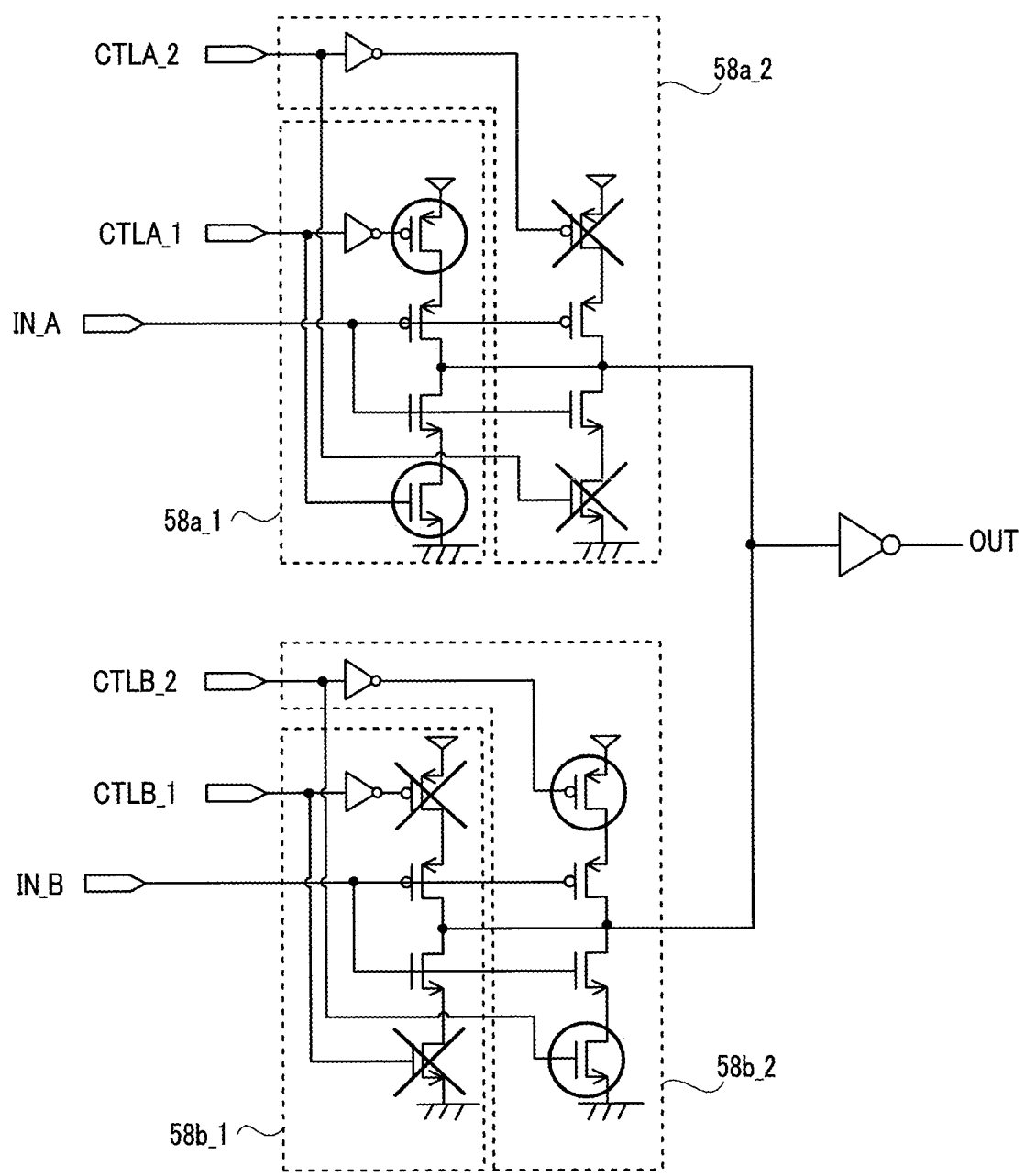
FIG. 30B is a circuit diagram for description of another example of operation of the PI circuit.
Figure 31:
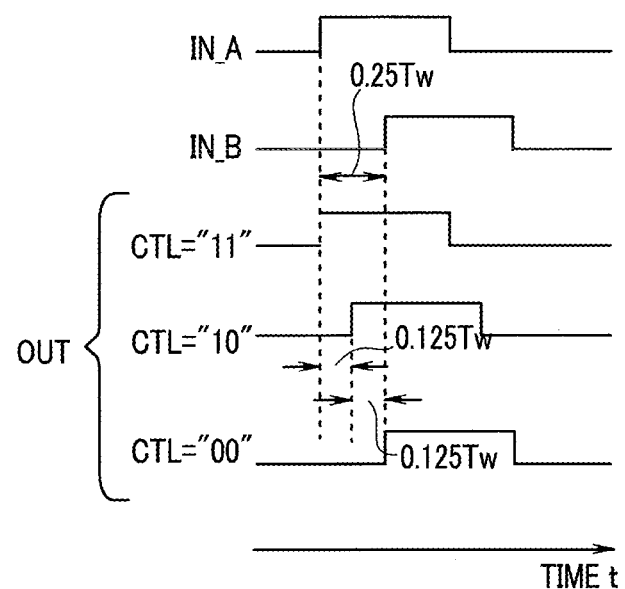
FIG. 31 is a timing chart for description of an example of operation of the PI circuit.

Operation of each above-described PI circuit 57β will be described below with reference to FIGS. 30A, 30B, and 31. FIGS. 30A and 30B are circuit diagrams for description of an example of operation of the PI circuit. Note that FIGS. 30A and 30B illustrate an example of the PI circuit in a case of s=2. FIG. 31 is a timing chart for description of an example of operation of the PI circuit.

In a case of s=2, the PI circuit 57β includes the inverter circuit group 58a consisting of two inverter circuits 58a_1 and 58a_2, and the inverter circuit group 58b consisting of two inverter circuits 58b_1 and 58b_2. The control signal CTL is a code signal of two bits. Data of the first bit of the control signal CTL is input to the two inverter circuits 58a_1 and 58b_1, and data of the second bit is input to the two inverter circuits 58a_2 and 58b_2.

FIG. 30A illustrates a case in which the control signal CTL of two bits is "11". When the control signal CTL has a value "11", "11" is input as a code signal of two bits through the input terminals CTLA. Specifically, "1" is input through an input terminal CTLA_1, and "1" is input through the input terminal CTLA_2. In addition, "00" is input as a code signal of two bits through the input terminals CTLB. Specifically, "0" is input through an input terminal CTLB_1, and "0" is input through an input terminal CTLB_2.

A value "0(="L")" obtained by inverting the input value from the input terminal CTLA_1 is input to the gate of the third PMOS transistor of the inverter circuit 58a_1. In addition, a value "1(="H")" as the input value from the input terminal CTLA_1 is input to the gate of the third NMOS transistor of the inverter circuit 58a_1. In other words, the third PMOS transistor and the third NMOS transistor of the inverter circuit 58a_1 are turned on. Accordingly, a clock signal is output that rises at a timing when the fourth PMOS transistor is turned on and that falls at a timing when the fourth NMOS transistor is turned on. Specifically, a signal obtained by inverting rising and falling of the signal input from the corresponding delay element 54β through the input terminal IN_A (signal obtained by delaying the signal CLK_DET through the delay element 54β) is output from the inverter circuit 58a_1. Similarly, in the inverter circuit 58a_2, the third PMOS transistor and the third NMOS transistor are turned on, and thus a signal obtained by inverting rising and falling of the signal input from the corresponding delay element 54β through the input terminal IN_A (signal obtained by delaying the signal CLK_DET through the delay element 54β) is output.

A value "1(="H")" obtained by inverting the input value from the input terminal CTLB_1 is input to the gate of the third PMOS transistor of the inverter circuit 58b_1. In addition, a value "0(="L")" as the input value from the input terminal CTLB_1 is input to the gate of the third NMOS transistor of the inverter circuit 58b_1. In other words, the third PMOS transistor and the third NMOS transistor of the inverter circuit 58b_1 are turned off. Accordingly, no signal is output from the inverter circuit 58b_1. Similarly, in the inverter circuit 58b_2, the third PMOS transistor and the third NMOS transistor are turned off, and thus no signal is output.

As described above, when the value of the control signal CTL is "11", the signal input from the delay element 54β through the input terminal IN_A (signal obtained by delaying the signal CLK_DET through the delay element 54β) is output from the output terminal OUT of the PI circuit 57β.

FIG. 30B illustrates a case in which the control signal CTL of two bits is "10". When the value of the control signal CTL is "10", "10" is input as a code signal of two bits through the input terminals CTLA. Specifically, "1" is input through the input terminal CTLA_1, and "0" is input through the input terminal CTLA_2. In addition, "01" is input as a code signal of two bits through the input terminals CTLB. Specifically, "0" is input through the input terminal CTLB_1, and "1" is input through the input terminal CTLB_2.

A value "0(="L")" as an inverted value of the input value from the input terminal CTLA_1 is input to the gate of the third PMOS transistor of the inverter circuit 58a_1. In addition, a value "1(="H")" as the input value from the input terminal CTLA_1 is input to the gate of the third NMOS transistor of the inverter circuit 58a_1. In other words, the third PMOS transistor and the third NMOS transistor of the inverter circuit 58a_1 are turned on. Accordingly, a clock signal is output that rises at a timing when the fourth PMOS transistor is turned on and that falls at a timing when the fourth NMOS transistor is turned on. Specifically, a signal obtained by inverting rising and falling of the signal input from the delay element 54β through the input terminal IN_A (signal obtained by delaying the signal CLK_DET through the delay element 54β) is output from the inverter circuit 58a_1.

A value "1(="H")" obtained by inverting the input value from the input terminal CTLA_2 is input to the gate of the third PMOS transistor of the inverter circuit 58a_2. In addition, a value "0(="L")" as the input value from the input terminal CTLA_2 is input to the gate of the third NMOS transistor of the inverter circuit 58a_2. In other words, the third PMOS transistor and the third NMOS transistor of the inverter circuit 58a_2 are turned off. Accordingly, no signal is output from the inverter circuit 58a_2.

A value "1(="H")" obtained by inverting the input value from the input terminal CTLB_1 is input to the gate of the third PMOS transistor of the inverter circuit 58b_1. In addition, a value "0(="L")" as the input value from the input terminal CTLB_1 is input to the gate of the third NMOS transistor of the inverter circuit 58b_1. In other words, the third PMOS transistor and the third NMOS transistor of the inverter circuit 58b_1 are turned off. Accordingly, no signal is output from the inverter circuit 58b_1.

A value "0(="L")" obtained by inverting the input value from the input terminal CTLB_2 is input to the gate of the third PMOS transistor of the inverter circuit 58b_2. In addition, a value "1(="H")" as the input value from the input terminal CTLB_2 is input to the gate of the third NMOS transistor of the inverter circuit 58b_2. In other words, the third PMOS transistor and the third NMOS transistor of the inverter circuit 58b_2 are turned on. Specifically, a signal obtained by inverting rising and falling of the signal input from the delay element 54(β+1) through the input terminal IN_B (signal obtained by delaying the signal CLK_DET through the delay element 54(β+1)) is output from the inverter circuit 58b_2.

As described above, when the value of the control signal CTL is "10", a signal that is obtained by inverting the signal input from the delay element 54β through the input terminal IN_A (signal obtained by delaying the signal CLK_DET through the delay element 54β) and is output from the inverter circuit 58a_1, and a signal that is obtained by inverting the signal input from the delay element 54(β+1) through the input terminal IN_B (signal obtained by delay-ing the signal CLK_DET through the delay element 54(β+1)) and is output from the inverter circuit 58b_2 are merged. Specifically, a signal obtained by delaying the signal CLK_DET through the delay element 54β and a signal obtained by delaying the signal CLK_DET through the delay element 54(β+1) are merged at a ratio of 1:1. A signal obtained through the merging is inverted through an inverter and output from the output terminal OUT of the PI circuit 57β.

As described above, the PI circuit 57β adjusts the delay time of the signal CLK_DET between the delay time of the delay element 54β and the delay time of the delay element 54(β+1) in accordance with the value of the control signal CTL and outputs the adjusted delay time. As illustrated in FIG. 31, when a difference between the delay time of the delay element 54β and the delay time of the delay element 54(β+1) is 0.25 Tw, the signals CLK_DETβ having delay times that are different from each other by 0.125 Tw can be generated by setting a value "10" to the control signal CTL.

As described above, the edge detection circuit of the embodiment generates the delay amount of a signal input to each delay line 53m at the delay element 54β and the delay unit 57 as two circuits. Accordingly, it is possible to multiply the number of signals having different delay differences in a time divisional manner by adding the delay unit 57 (m PI circuits 57β) without changing the number of delay lines 53m. As a result, it is possible to decrease delay difference between input signals to the delay elements 54β. Therefore, it is possible to increase the measurement resolution while restricting area increase and current consumption increase due to increase of the number of flip-flops.

Note that the measurement resolution can be further improved by increasing the number of bits of the control signal CTL to three or more and increasing the number of inverter circuits 58a_δ and the number of inverter circuits 58b_γ of each PI circuit 57β in accordance with increase of the number of bits.

Each PI circuit may be configured by using a configuration of each FINE delay circuit 611 in the DCA circuit.

Third Embodiment

Subsequently, a third embodiment will be described below. The description of the present embodiment will be made on a case in which the edge detection circuit described in each of the first and second embodiments is used for a delay lock loop (DLL) circuit.

Figure 32:
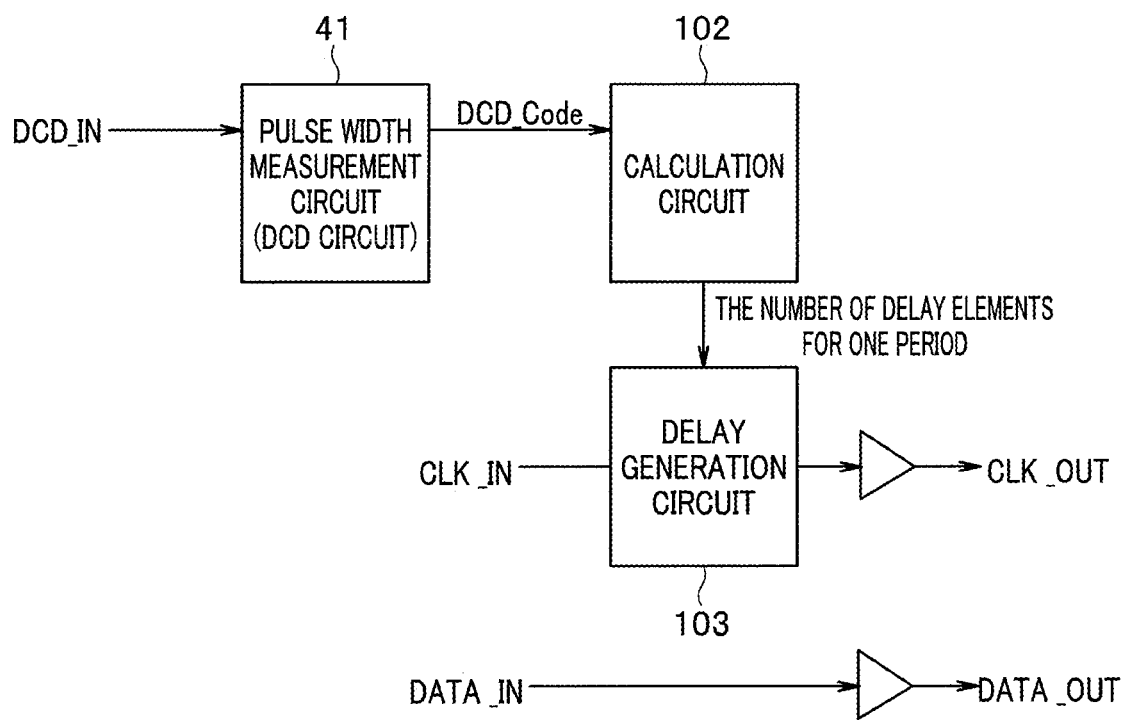
FIG. 32 is a block diagram illustrating an exemplary configuration of a DLL circuit in a third embodiment.

FIG. 32 is a block diagram illustrating an exemplary configuration of a DLL circuit in the third embodiment. The DLL circuit of the embodiment includes a DCD circuit 41, a calculation circuit 102, and a delay generation circuit 103. The DCD circuit 41 is a circuit configured to measure a one-period width and a two-period width of a clock signal and convert a difference between the widths into the number of delay elements for one period. The DCD circuit 41 outputs, as the signal DCD_CODE, the signal DCD_CODE having a width corresponding to one period of the input clock DCD_IN.

The calculation circuit 102 receives the signal DCD_CODE output from the DCD circuit 41 and compares the one-period width and two-period width of the input clock DCD_IN. Then, the calculation circuit 102 converts one period of the clock signal into the number of delay elements based on a result of the comparison.

The delay generation circuit 103 calculates, based on the number of delay elements output from the calculation circuit 102, the number of delay elements that delay the clock signal CLK_IN. The clock signal CLK_IN is delayed based on a result of the calculation to generate an output clock signal CLK_OUT.

Figure 33:
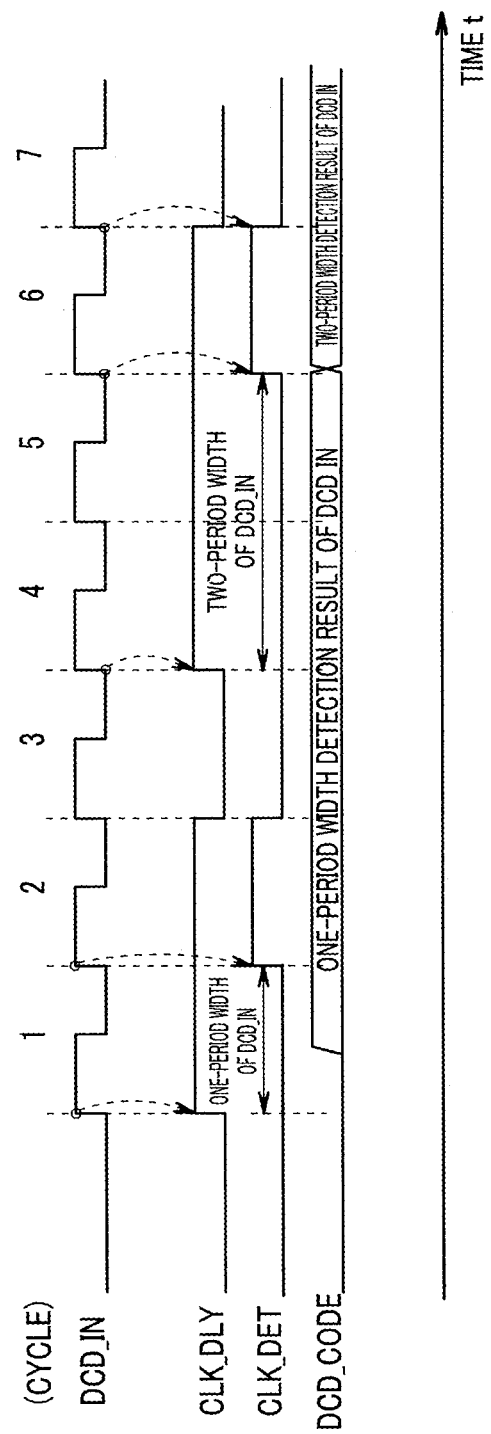
FIG. 33 is a timing chart for description of an example of operation of a DCD circuit in the third embodiment.

FIG. 33 is a timing chart for description of an example of operation of the DCD circuit in the third embodiment. The input clock DCD_IN is input to the DCD circuit 41. In each set, the signal generation circuit 51 detects rising of the input clock DCD_IN in the first cycle and maintains the signal CLK_DLY at high level for a duration equal to a duration from the rising to rising of the input clock DCD_IN in the second cycle. In other words, the signal CLK_DLY is maintained at high level for a duration equal to two periods of the input clock DCD_IN since rising of the input clock DCD_IN in the first cycle. In addition, in each set, the signal generation circuit 51 detects rising of the input clock DCD_IN in the fourth cycle and maintains the signal CLK_DLY at high level for a duration equal to a duration from the rising to rising of the input clock DCD_IN in the third cycle. In other words, the signal CLK_DLY is maintained at high level for a duration equal to three periods of the input clock DCD_IN since rising of the input clock DCD_IN in the fourth cycle.

In each set, the signal generation circuit 51 detects rising of the input clock DCD_IN in the second cycle and maintains the signal CLK_DET at high level for a duration equal to a duration until rising of the input clock DCD_IN in the next cycle. In addition, in each set, the signal generation circuit 51 detects rising of the input clock DCD_IN in the sixth cycle and maintains the signal CLK_DET at high level for a duration equal to a duration until rising of the input clock DCD_IN in the next cycle.

As for the signal CLK_DLY and the signal CLK_DET generated as described above, a duration from rising of the signal CLK_DLY in each odd-numbered cycle to rising of the signal CLK_DET is a duration equal to one period of the input clock DCD_IN. In addition, a duration from rising of the signal CLK_DLY in each even-numbered cycle to rising of the signal CLK_DET is a duration equal to two periods of the input clock DCD_IN.

The signals CLK_DLY and CLK_DET generated in this manner are used by the edge detection circuit 53 to generate and output the signal DCD_CODE at each set.

The calculation circuit 102 calculates the number of delay elements for one period of the input clock DCD_IN by using the signals DCD_CODE for a plurality of sets, which are output from the DCD circuit 41. Specifically, an average (first average value) is calculated by summing the numbers of high-level bits of the signals DCD_CODE for the sets in odd-numbered cycles of the signal CLK_DET. In addition, an average (second average value) is calculated by summing the numbers of high-level bits of the signals DCD_CODE for the sets in even-numbered cycles of the signal CLK_DET. A difference between the second average value and the first average value is calculated, and a width for one period of the input clock is converted into the number of delay elements.

Figure 34:
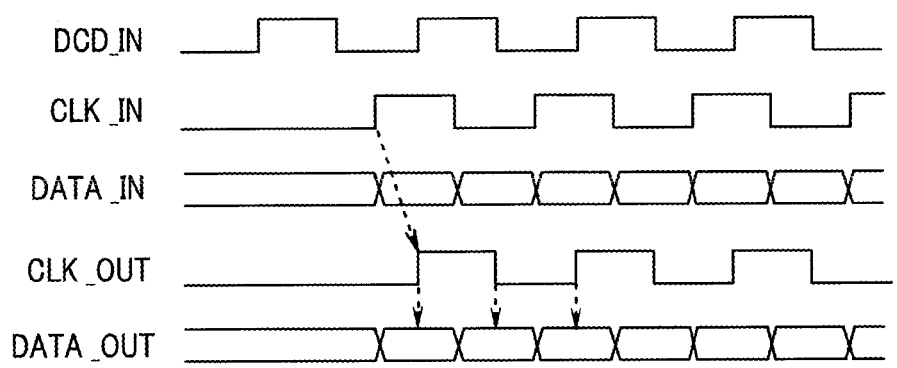
FIG. 34 is a timing chart for description of phase adjustment of a clock signal in DDR communication.

The delay generation circuit 103 calculates, based on the number of delay elements output from the calculation circuit 102, the number of delay elements that delay the clock signal CLK_IN. FIG. 34 is a timing chart for description of phase adjustment of the clock signal in DDR communication. For example, when a semiconductor device performs double data rate (DDR) communication, clock phase needs to be adjusted so that rising and falling of the clock signal coincide with a data central timing. When a clock CLK_IN and a data signal DATA_IN having identical rising timings are input, the delay generation circuit 103 generates an output clock CLK_OUT by delaying the clock CLK_IN by ¼ of the number of delay elements output from the calculation circuit 102.

As described above, the edge detection circuit of the embodiment can be used not only for a DCC circuit but also for a DLL circuit, thereby increasing measurement resolution for a measurement target period while restricting area increase and current consumption increase due to increase of the number of flip-flops.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a delay element group in which a plurality of first delay elements having a first delay amount are connected in series;
   at least one flip-flop group including a plurality of flip-flops each of which an input is connected to an output of a corresponding first delay element among the plurality of first delay elements in the delay element group;
   a second delay circuit configured to generate, from a first clock signal, a plurality of second clock signals each having a delay difference of a second delay amount smaller than the first delay amount; and
   a variable delay circuit configured to set a third delay amount smaller than the second delay amount,
   wherein the second delay circuit and the variable delay circuit are connected in series between a third clock output terminal and an input terminal of the flip-flop group.

2. The semiconductor integrated circuit according to claim 1, wherein the variable delay circuit includes a plurality of second delay elements each having a delay amount difference set to the third delay amount and a selector, and the plurality of second delay elements are connected in parallel between an input terminal of the variable delay circuit and an input terminal of the selector.

3. The semiconductor integrated circuit according to claim 2, wherein
   the second delay circuit includes a plurality of third delay elements each having a delay amount difference set to the second delay amount,
   the number of third delay elements is equal to the number of flip-flop groups, and output terminals of the third delay elements are connected in one-on-one to input terminals of the flip-flop groups, and
   the number of second delay elements is equal to or smaller than the number of third delay elements.

4. The semiconductor integrated circuit according to claim 2, wherein the third delay amount is a value obtained by dividing the second delay amount by the number of second delay elements.

5. The semiconductor integrated circuit according to claim 1, wherein the variable delay circuit includes at least one phase interpolation circuit to which two of the second clock signals each having the delay difference of the second delay amount from the second delay circuit are input.

6. The semiconductor integrated circuit according to claim 5, wherein
the variable delay circuit includes a plurality of the phase interpolation circuits, and
the number of phase interpolation circuits is equal to the number of flip-flop groups, and output terminals of the phase interpolation circuits are connected in one-on-one to input terminals of the flip-flop groups.

7. The semiconductor integrated circuit according to claim 6, wherein the second delay circuit includes a plurality of third delay elements each having a delay amount difference set to the second delay amount, and the number of third delay elements is larger than the number of phase interpolation circuits.

8. A semiconductor storage device configured to be connected to a controller and configured to transmit a command, an address, and data, the semiconductor storage device comprising:
an interface chip provided with a semiconductor integrated circuit configured to measure a pulse width of an input signal and adjust a duty cycle ratio of the input signal; and
a non-volatile memory chip having a memory cell array including a plurality of memory cells, wherein
the semiconductor integrated circuit includes: a delay element group in which a plurality of first delay elements having a first delay amount are connected in series; at least one flip-flop group including a plurality of flip-flops each of which an input is connected to an output of a corresponding first delay element among the first delay elements in the delay element group; a second delay circuit configured to generate, from a first clock signal, a plurality of second clock signals each having a delay difference of a second delay amount smaller than the first delay amount; and a variable delay circuit configured to set a third delay amount smaller than the second delay amount, the second delay circuit and the variable delay circuit being connected in series between a third clock output terminal and an input terminal of the flip-flop group, and wherein
the semiconductor integrated circuit is configured to adjust a duty cycle ratio of a read enable signal or data strobe signal transmitted and received between the controller and the non-volatile memory chip.

9. The semiconductor storage device according to claim 8, wherein the variable delay circuit includes a plurality of second delay elements each having a delay amount difference set to the third delay amount and a selector, and the plurality of second delay elements are connected in parallel between an input terminal of the variable delay circuit and an input terminal of the selector.

10. The semiconductor storage device according to claim 9, wherein
the second delay circuit includes a plurality of third delay elements each having a delay amount difference set to the second delay amount,
the number of third delay elements is equal to the number of flip-flop groups, and output terminals of the third delay elements are connected in one-on-one to input terminals of the flip-flop groups, and
the number of second delay elements is equal to or smaller than the number of third delay elements.

11. The semiconductor storage device according to claim 9, wherein the third delay amount is a value obtained by dividing the second delay amount by the number of second delay elements.

12. The semiconductor storage device according to claim 8, wherein the variable delay circuit includes at least one phase interpolation circuit to which two of the second clock signals each having the delay difference of the second delay amount from the second delay circuit are input.

13. The semiconductor storage device according to claim 12, wherein
the variable delay circuit includes a plurality of the phase interpolation circuits, and
the number of phase interpolation circuits is equal to the number of flip-flop groups, and output terminals of the phase interpolation circuits are connected in one-on-one to input terminals of the flip-flop groups.

14. The semiconductor storage device according to claim 13, wherein the second delay circuit includes a plurality of third delay elements each having a delay amount difference set to the second delay amount, and the number of third delay elements is larger than the number of phase interpolation circuits.

15. A semiconductor storage device configured to be connected to a controller and configured to transmit a command, an address, and data, the semiconductor storage device comprising:
an interface chip provided with a semiconductor integrated circuit configured to measure a period of an input signal and adjust phase of the input signal; and
a non-volatile memory chip having a memory cell array including a plurality of memory cells, wherein
the semiconductor integrated circuit includes: a delay element group in which a plurality of first delay elements having a first delay amount are connected in series; at least one flip-flop group including a plurality of flip-flops each of which an input is connected to an output of a corresponding first delay element among the plurality of first delay elements in the delay element group; a second delay circuit configured to generate, from a first clock signal, a plurality of second clock signals each having a delay difference of a second delay amount smaller than the first delay amount; and a variable delay circuit configured to set a third delay amount smaller than the second delay amount, the second delay circuit and the variable delay circuit being connected in series between a third clock output terminal and an input terminal of the flip-flop group, and wherein
the semiconductor integrated circuit is configured to adjust phase of a read enable signal or data strobe signal transmitted and received between the controller and the non-volatile memory chip.

16. The semiconductor storage device according to claim 15, wherein the variable delay circuit includes a plurality of second delay elements each having a delay amount difference set to the third delay amount and a selector, and the plurality of second delay elements are connected in parallel between an input terminal of the variable delay circuit and an input terminal of the selector.

17. The semiconductor storage device according to claim 16, wherein
the second delay circuit includes a plurality of third delay elements each having a delay amount difference set to the second delay amount,
the number of third delay elements is equal to the number of flip-flop groups, and output terminals of the third delay elements are connected in one-on-one to input terminals of the flip-flop groups, and
the number of second delay elements is equal to or smaller than the number of third delay elements.

18. The semiconductor storage device according to claim 16, wherein the third delay amount is a value obtained by dividing the second delay amount by the number of second delay elements.

19. The semiconductor storage device according to claim 15, wherein the variable delay circuit includes at least one phase interpolation circuit to which two of the second clock signals each having the delay difference of the second delay amount from the second delay circuit are input.

20. The semiconductor storage device according to claim 19, wherein
the variable delay circuit includes a plurality of the phase interpolation circuits, and
the number of phase interpolation circuits is equal to the number of flip-flop groups, and output terminals of the phase interpolation circuits are connected in one-on-one to input terminals of the flip-flop groups.

* * * * *